United States Patent [19]
Saito et al.

[11] Patent Number: 5,284,525
[45] Date of Patent: Feb. 8, 1994

[54] SOLAR CELL

[75] Inventors: Keishi Saito; Tatsuyuki Aoike; Yasushi Fujioka; Mitsuyuki Niwa; Toshimitsu Kariya; Yuzo Kohda, all of Nagahama, Japan

[73] Assignee: Canon Kabushiki Kaisha, Tokyo, Japan

[21] Appl. No.: 806,347

[22] Filed: Dec. 13, 1991

[30] Foreign Application Priority Data

| Dec. 13, 1990 | [JP] | Japan | 2-401929 |
| Dec. 13, 1990 | [JP] | Japan | 2-401930 |
| Dec. 13, 1990 | [JP] | Japan | 2-401931 |
| Dec. 13, 1990 | [JP] | Japan | 2-401934 |
| Dec. 13, 1990 | [JP] | Japan | 2-401935 |
| Dec. 13, 1990 | [JP] | Japan | 2-401936 |

[51] Int. Cl.$^5$ ................ H01L 31/075; H01L 31/0236
[52] U.S. Cl. ..................... 136/256; 136/258; 136/259; 257/436; 257/458
[58] Field of Search ............ 136/256, 258 AM, 259; 257/436, 458

[56] References Cited

U.S. PATENT DOCUMENTS

| 4,126,150 | 11/1978 | Bell et al. | |
| 4,851,302 | 7/1989 | Nakagawa et al. | 428/658 |
| 4,959,106 | 9/1990 | Nakagawa et al. | 136/258 PC |
| 5,002,617 | 3/1991 | Kanai et al. | 136/258 PC |
| 5,006,180 | 4/1991 | Kanai et al. | 136/258 PC |
| 5,007,971 | 4/1991 | Kanai et al. | 136/258 PC |
| 5,024,706 | 6/1991 | Kanai et al. | 136/258 PC |
| 5,028,488 | 7/1991 | Nakagawa et al. | 428/457 |

FOREIGN PATENT DOCUMENTS

| 54-153588 | 12/1979 | Japan | |
| 56-152276 | 11/1981 | Japan | 136/256 |
| 58-159383 | 9/1983 | Japan | 136/259 |
| 59-14682 | 1/1984 | Japan | 136/259 |
| 59-32178 | 2/1984 | Japan | 136/258 AM |
| 59-104185 | 6/1984 | Japan | 136/259 |
| 60-142575 | 7/1985 | Japan | 136/258 AM |
| 62-45079 | 2/1987 | Japan | 136/256 |
| 63-169769 | 7/1988 | Japan | 136/258 AM |
| 77973 | 3/1989 | Japan | 136/259 |

*Primary Examiner*—Aaron Weisstuch
*Attorney, Agent, or Firm*—Fitzpatrick, Cella, Harper & Scinto

[57] ABSTRACT

A solar cell comprising a conductive substrate and semiconductor layers laminated on the conductive substrate, said laminate comprising a p-type layer composed of a non-single crystal Si material, an i-type layer serving as an active layer and an n-type layer, wherein a diamond layer having an uneven surface and containing a valence electron controlling agent is interposed between the conductive substrate and the semiconductor layers.

6 Claims, 27 Drawing Sheets (MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 4-2" AS "1")

(MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 4-2" AS 1)

(MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 1" AS "1")

(MEASUREMENT VALUES ARE PRESENTED AS A RELATIVE ONE NORMALIZED BY BATTERY OF "EXPERIMENT 4-2" AS 1)

(MEASUREMENT VALUES ARE PRESENTED AS A RELATIVE ONE NORMALIZED BY BATTERY OF "EXPERIMENT 1" AS "1")

SOLAR CELL

BACKGROUND OF THE INVENTION

1. Field of the Invention

The present invention relates to a high-efficiency solar cell which scatters incident light so as to increase the light absorption in an active layer.

2. Related Background Art

An example of methods of improving the efficiency of solar cells which use a light reflecting substrate is the method of forming a roughened light reflecting surface having unevenness so as to increase the length of the optical path of light having low absorption wavelengths. This method is disclosed in, for example, U.S. Pat. No. 4,126,150 (assignee, RCA) and Japanese Patent Laid-Open No. 56-152276 (assignee, Teijin). The optical effects of a roughened substrate are described in Japanese Patent Laid-Open No. 59-104185 (assignee, Exxon Research and Engineering Company).

Methods of forming an uneven reflecting surface include the wet etching method disclosed in Japanese Patent Laid-Open No. 54-153588 (assignee, National Patent Development Corporation), the sandblasting and co-evaporation methods disclosed in Japanese Patent Laid-Open No. 58-159383 (assignee, Energy Conversion Devices), and the DC electrolytic etching or chemical etching methods for roughening an aluminum surface disclosed in Japanese Patent Laid-Open No. 59-14682 (assignee, Denkai-haku Kogyo).

Japanese Patent Laid-Open No. 63-169769 also discloses an example in which p-type, i-type, and n-type layers are laminated on a transparent electrode formed on a diamond thin film to form a solar cell.

The above-described conventional methods of forming a substrate having an uneven surface produce various problems when a solar cell is formed.

For example, in the DC electrolytic etching method or the chemical etching method using an etching solution, since etching residue is produced on the surface of a substrate, if a semiconductor layer is deposited on the substrate, the etching residue diffuses into the semiconductor layer and thus causes deterioration in the characteristics of the solar cell formed thereon. The etching method also has the problem that since the etching residue has poor adhesion to the substrate, the semiconductor layer deposited on the substrate is easily separated therefrom, and thus a solar cell having uniform characteristics cannot be easily formed.

In the sandblasting method, since the unevenness is formed by spraying fine particles on a substrate, the fine particles remain on the substrate and sometimes serve as nuclei of abnormal growth of a semiconductor layer. This method also has the problem that since the fine particles have poor adhesion to the substrate, the semiconductor layer deposited on the substrate is easily separated. The sandblasting method also produces a distortion of the substrate because unevenness is formed by spraying fine particles on the surface of the substrate. Since the distortion of the substrate is relieved with the passage of time, the semiconductor layer deposited thereon is sometimes distorted and is thus separated, resulting in deterioration of the electrical characteristics.

In addition, when unevenness is formed on the surface of a substrate by the co-evaporation method, there are the problems that nonuniformity is easily produced in the deposited film because at least two materials are simultaneously deposited, and that nonuniformity is easily produced in the characteristics of the solar cell formed by depositing a semiconductor layer on a deposited film.

In the example described in Japanese Patent Laid-Open No. 63-169769 in which a diamond thin film is used as a substrate of a solar cell, a semiconductor layer is deposited on a transparent electrode formed on the diamond thin film to form a solar cell. In such a layer structure, since the diamond thin film is used as a high-resistance substrate in place of a glass substrate, the transparent electrode is provided on the diamond thin film. This conventional example does not make use of the good adhesion between the diamond thin film and the semiconductor layer and has the problem that the constituent elements of the transparent electrode diffuse into the semiconductor layer.

SUMMARY OF THE INVENTION

The present invention has been achieved for solving the above-problems.

It is an object of the invention to provide a solar cell which produces no deterioration in the characteristics caused by etching residue.

It is another object of the invention to provide a solar cell which has no effect of the fine particles remaining on a substrate by a sandblasting method or the like, and which produces no deterioration in the characteristics caused by the relief with time of the distortion reduced by collision of the fine particles.

It is still another object of the invention to provide a solar cell which has no effect of diffusion of an electrode material into a semiconductor layer.

It is a further object of the invention to provide a solar cell which has a high conversion efficiency.

It is a still further object of the invention to provide a solar cell which has no problems with respect to deterioration with passage of time caused by a distortion of a substrate.

In order to achieve the objects, a solar cell according to an embodiment of the present invention comprises a conductive substrate and semiconductor layers which are laminated on the substrate and which comprises a p-type layer composed of non-single crystal Si, an i-type layer serving as an active layer, and an n-type layer, wherein a diamond layer having an uneven surface and containing a valence electron controlling agent is interposed between the conductive substrate and the semiconductor layers.

In another embodiment of the invention, the solar cell comprises a conductive substrate and semiconductor layers laminated on the substrate and comprising a p-type layer composed of non-single crystal containing Si, an i-layer composed of non-single crystal containing Si and Ge and serving as an active layer, and an n-layer composed of non-single crystal containing Si, wherein a diamond layer having an uneven surface and containing a valence electron controlling agent is interposed between the conductive substrate and the semiconductor layers.

In still another embodiment of the invention, the solar cell comprises a conductive substrate and semiconductor layers laminated on the substrate and comprising a p-type layer composed of non-single crystal Si, an i-type layer serving as an active layer, and an n-type layer, wherein at least one of the p-type layer and the n-type layer contains carbon atoms, the i-type layer contains germanium atoms, and a diamond layer having an uneven surface and containing a valence electron controlling agent is interposed between the conductive substrate and the semiconductor layers.

In a further embodiment of the invention, the solar cell comprises a conductive substrate and semiconductor layers laminated on the substrate and comprising a p-type layer composed of non-single crystal containing Si, an i-layer composed of non-single crystal containing Si and Ge and serving as an active layer, and an n-layer composed of non-single crystal containing Si, wherein the Ge content in the i-type layer is distributed in the direction of the thickness thereof, and a diamond layer having an uneven surface and containing a valence electron controlling agent is interposed between the conductive substrate and the semiconductor layers.

In a further embodiment of the invention, the solar cell comprises a conductive substrate and semiconductor layers laminated on the substrate and comprising a p-type layer composed of non-single crystal Si, an i-type layer serving as an active layer, and an n-type layer, wherein at least one of the p-type layer and the n-type layer contains carbon atoms, and a diamond layer having an uneven surface and containing a valence electron controlling agent is interposed between the conductive substrate and the semiconductor layers.

In a further embodiment of the invention, the solar cell comprises a conductive substrate and semiconductor layers laminated on the substrate and comprising a p-type layer composed of non-single crystal containing Si, an i-layer composed of non-single crystal containing Si and serving as an active layer, and an n-layer composed of non-single crystal containing Si, wherein at least one of the p-type layer and the n-type layer contains carbon atoms, the i-type layer contains germanium atoms with a distribution in the direction of the thickness thereof, and a diamond layer having an uneven surface and containing a valence electron controlling agent is interposed between the conductive substrate and the semiconductor layers.

DETAILED DESCRIPTION OF THE PREFERRED EMBODIMENTS

Figure 1A:
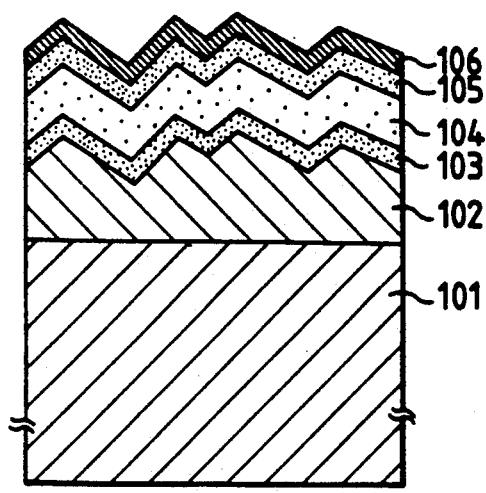
FIGS. 1A to 1C are schematic views showing a layer structure of a solar cell according to the present invention.
Figure 2:
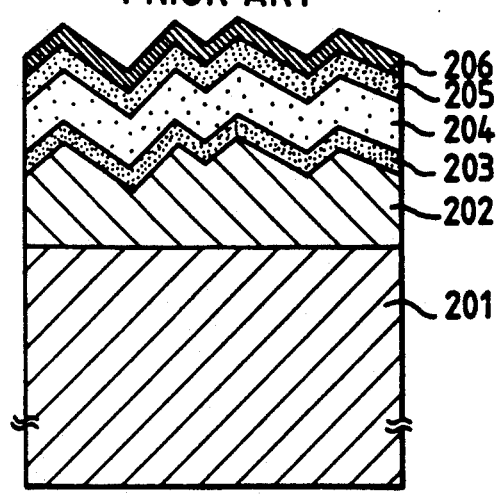
FIG. 2 is a schematic view showing a layer structure of a solar cell according to the prior art.

FIG. 1A is a schematic drawing explaining a solar cell according to an embodiment of the present invention.

Referring to FIG. 1, the solar cell of the present invention comprises a conductivity substrate 101, a diamond layer 102, an n-type layer 013, an i-type layer 104, a p-type layer 105, and a transparent electrode 106.

Each of the layers which constitute the solar cell of the present invention is described in detail below.

Conductive Layer

In the present invention, the conductive substrate is made of a conductive material or an insulating material which is subjected to conductive treatment. Examples of conductive materials include metals such as NiCr, stainless steel, Al, Cr, Mo, Au, Nb, Ta, V, Ti, Pt, Pb, and the like, and alloys thereof.

Examples of electrical insulating materials that can be used include films or sheets of synthetic resins such as polyester, polyethylene, polycarbonate, cellulose acetate, polypropylene, vinyl chloride, polyvinylidene chloride, polystyrene, polyamide, and the like; glass; ceramics; paper, and the like. It is preferable to subject at least one surface of such an electrical insulating material to conductive treatment and provide another layer on the side of the treated surface.

For example, when glass is used, conductivity is imparted to the glass by providing, on a surface of the glass, a thin film consisting of NiCr, Al, Cr, Mo, Au, Ir, Nb, Ta, V, Ti, Pt, Pb, $In_2O_3$, $SnO_2$, ITO ($In_2O_3$+$SnO_2$), or the like. When a synthetic resin film such as a polyester film or the like is used, conductivity is imparted to the film by providing on a surface thereof a thin film of a metal such as NiCr, Al, Ag, Pb, Zn, Ni, Au, Cr, Mo, Ir, Nb, Ta, V, Ti, Pt, or the like by vacuum evaporation, electron beam evaporation, sputtering, or the like, or laminating a surface of the resin film with one of the metals.

Although the thickness of the substrate is appropriately determined so that a desired solar cell can be formed, the thickness is generally at least 10 μm from the viewpoints of the production, handling, and mechanical strength of the substrate.

In the present invention, the diamond layer is an important layer having the function to increase the conversion efficiency of the solar cell and decrease the deterioration with passage of time.

The layer is made of polycrystalline diamond. Although polycrystalline diamond has a smooth polyhedral shape, a skeletal shape, the shape of a needle-like crystal aggregate, or the like, polycrystalline diamond having a smooth polyhedral shape is suitable for the present invention.

The layer made of polycrystalline diamond having a smooth polyhedral shape has unevenness on the surface thereof. The unevenness causes the light applied to the solar cell to be scattered. The scattered light is totally reflected from the surface of the solar cell or travels in the solar cell at an angle with respect to the direction of the thickness thereof. As a result, the quantity of light absorbed by the solar cell is increased, and the conversion efficiency of the solar cell is thus increased. Particularly, the polycrystalline diamond has polyhedral surfaces which are substantially mirror surfaces and exhibit better surface properties than those of the prior art. As a result, the effect of light trapping in the solar cell is improved, and the conversion efficiency of the solar cell is increased, as compared with conventional solar cells.

In addition, the extremely dense structure of the polycrystalline diamond layer having a smooth polyhedral shape prevents the metal from diffusing from the conductive substrate into the semiconductor layers.

Further, since the polycrystalline diamond structurally has soft crystal boundaries, distortion can be relieved during the production of the solar cell. It is consequently possible to prevent the characteristics of the solar cell from deteriorating with passage of time due to the diffusion of impurities from the substrate or the distortion of the solar cell.

Not all smooth polyhedral shapes are suitable for the polyhedral diamond layer having the above functions, and suitable polyhedral shapes are limited.

The diamond layer suitable for the present invention has a thickness of 0.1 to 5 μm and surface unevenness of 0.05S to 1S.

The smooth polyhedral crystal has an average radius of 0.05 to 5 μm.

Further, hydrogen is contained in the diamond layer, particularly, at the polycrystalline boundaries. The hydrogen content is preferably 1 to 5 at %.

In addition, the diamond layer of the present invention must have low resistance because it is interposed between the conductive substrate and the semiconductor layers. The diamond layer preferably has dark conductivity of 0.1 S/cm or more. The amount of dopant impurities for obtaining such dark conductivity is 1 to 10 at %. If the amount of dopant impurities exceeds 10 at %, the diamond layer cannot be made of a smooth polyhedral crystal.

In the present invention, an element of Group V of the Periodic Table, such as N, P, As, Sb, or Bi, is suitable as an n-type valence electron controlling doping agent contained in the diamond layer, and an element in Group III of the Periodic Table, such as S, Al, Ga, In, or Tl, is suitable as a p-type valence electron controlling agent.

The diamond layer in the present invention is deposited by a thermal filament CVD process, a high-frequency plasma CVD process, a microwave plasma CVD process, a DC plasma CVD process, an ion beam process, or the like.

The microwave plasma CVD process is particularly preferable.

When the diamond layer of the present invention is deposited by the plasma CVD process, suitable raw material gases include the following:

Examples of carbon-containing compounds which are used as raw materials for introducing carbon atoms include saturated hydrocarbons each having 1 to 4 carbon atoms, hydrocarbons of the ethylene series each having 2 to 4 carbon atoms, hydrocarbons of the acetylene series each having 2 to 3 carbon atoms, and the like.

Examples of saturated hydrocarbons include methane ($CH_4$), ethane ($C_2H_6$), propane ($C_3H_8$), n-butane (n-$C_4H_{10}$), pentene ($C_5H_{12}$), and the like. Examples of ethylene series hydrocarbons include ethylene ($C_2H_4$), propylene ($C_3H_6$), butene-1 ($C_4H_6$), butene-2 ($C_4H_6$), isobutylene ($C_4H_8$), pentene ($C_5H_{10}$), and the like. Examples of acetylene series hydrocarbons include acetylene ($C_2H_2$), methylacetylene ($C_3H_4$), butyne ($C_4H_6$), and the like.

Halogen-containing hydrocarbons are also exemplified.

Examples of such halogen-containing hydrocarbons include $CH_3F$, $CH_2F_2$, $CH_3Cl$, $CH_2Cl_2$, $CF_4$, $C_2H_5F$, $C_2H_4F_2$, $C_2H_4FCl$, $C_2H_2F_2$, $C_2H_2FCl$, and the like.

In addition to the above raw material gas for introducing carbon atoms, hydrogen gas is required for forming the diamond layer of the present invention.

It is suitable, when for forming the diamond layer of the present invention, that the mixing ratio of the raw material gas for introducing carbon atoms to hydrogen gas is 1 to 10%.

In the present invention, examples of starting materials which are effectively used for introducing atoms of an element in Group III, e.g., boron atoms, include boron hydrides such as $B_2H_6$, $B_4H_{10}$, $B_5H_9$, $B_5H_{11}$, $B_6H_{10}$, $B_6H_{12}$, $B_6H_{14}$, and the like, and boron halides such as $BF_3$, $BCl_3$, $BBr_3$, and the like. $AlCl_3$, $GaCl_3$, $InCl_3$, $TiCl_3$, and the like, can also be exemplified as starting materials for introducing atoms of an element in Group III.

In the present invention, examples of starting materials which are effectively used for introducing atoms of an element in Group V, e.g., phosphorus atoms, include phosphorus hydrides such as $PH_3$, $P_2H_4$, and the like, the phosphorus halides such as $PH_4I$, $PF_3$, $PF_5$, $PCl_3$, $PCl_5$, $PBr_3$, $PBr_5$, $PI_3$, and the like. $AsH_3$, $AsF_3$, $AsCl_3$, $AsBr_3$, $AsF_5$, $SbH_3$, $SbF_5$, $SbCl_3$, $SbCl_5$, $BiH_3$, $BiCl_5$, $BiBr_3$, and the like, can also be exemplified as the starting materials for introducing atoms of an element in Group V.

When the diamond layer of the present invention is deposited by the plasma CVD process, the diamond layer is preferably deposited under the following conditions:

When the diamond layer of the present invention is deposited, it is necessary to prevent to the gas phase reaction of the gas for introducing carbon atoms which is decomposed in a plasma. It is, therefore, necessary to control the internal pressure in the reaction space to a value within the range of 1 to 50 mTorr during generation of a plasma.

It is also necessary to sufficiently decompose or activate the gas for introducing carbon atoms and hydrogen gas in the plasma. It is, therefore, necessary to control the power supplied to the reaction space to a value within the range of 0.01 to 1 W/sccm.cm$^3$ relative to the flow rate of the gas for introducing carbon atoms and the volume of the reaction space.

In addition, the temperature of the substrate is an important factor for reacting the gas for introducing carbon atoms and the hydrogen gas, both of which are decomposed in the plasma in the reaction space, to form the diamond layer of the present invention. In the invention, the temperature of the substrate must be controlled to be in the range from 200° to 800° C.

N-type Layer

In the present invention, the n-type layer is an important layer for controlling the photoelectromotive force and photoelectric current of the solar cell.

A silicon-containing non-single crystal semiconductor is suitable as a material of the n-type layer, and hydrohalogenated amorphous silicon (including microcrystalline silicon) is particularly suitable. If the material is to be further limited, microcrystalline silicon or amorphous silicon is optimum as the material.

When light is applied to the side of the n-type layer, amorphous silicon carbide (including microcrystalline silicon carbide) is optimum for decreasing, as much as possible, the absorption of light by the n-type layer.

The grain size of microcrystalline silicon or silicon carbide is preferably 30 to 200 Å, and most preferably 30 to 100 Å.

In the case of microcrystalline silicon or silicon carbide, the content of hydrogen and halogen atoms is preferably 1 to 10 at %, and most preferably 1 to 7 at %.

In the case of amorphous silicon or silicon carbide, the content of hydrogen and halogen atoms is preferably 1 to 40 atT, and most preferably 5 to 20 at %.

An element in Group VA of the Periodic Table is suitable as the valence electron controlling agent contained in the n-type layer. Phosphorus (P), nitrogen (N), arsenic (As), or antimony (Sb) is particularly suitable as the valence electron controlling agent.

The content of the valence electron controlling agent contained in the n-type layer is preferably 1 to 20 at %, and most preferably 5 to 10 at %.

In regard to the electrical characteristics of the n-type layer, the activation energy is preferably 0.2 eV or less, and most preferably 0.1 eV or less, and the resistivity is preferably 10 $\Omega$m or less, and most preferably 1 $\Omega$.cm or less, under the conditions described above.

I-type Layer

In the present invention, the i-type layer containing Si and Ge is an important layer for generating and transporting carriers for the light applied to the solar cell. Amorphous silicon germanium is exemplified as a non-single crystal material containing Se and Ge and is suitable for the i-type layer.

Hydrogenated or hydrohalogenated amorphous silicon germanium is particularly suitable as the amorphous silicon germanium.

The content of hydrogen or halogen contained in the amorphous silicon germanium is very important for decreasing the localized levels and maintaining high-quality electrical characteristics. In a preferable bonding state between a hydrogen or halogen atom and a silicon atoms, a single hydrogen or halogen atoms is bonded to a silicon atom.

Similarly, in a preferable bonding state between a hydrogen or halogen atom and a germanium atom, a single hydrogen or halogen atom is bonded to a germanium atom.

The content of hydrogen and halogen atoms in the amorphous silicon germanium is preferably 1 to 41 at %, most preferably 5 to 20 at %.

The content of germanium atoms in the amorphous silicon germanium is preferably 5 to 60 at %, and most preferably 10 to 40 at %.

The thickness of the t-type layer is also an important parameter which affects the characteristics of a photovoltaic element of the present invention. The thickness of the i-type layer is preferably 0.1 to 1 μm, and most preferably 0.2 to 0.6 μm.

The thickness of the i-type layer is preferably set to a value within the above range in consideration of the absorptivity of the i-type layer and the solar spectrum.

In the present invention, it is important for improving the conversion efficiency of the solar cell to distribute Ge atoms in the i-type layer.

Figure 1B:
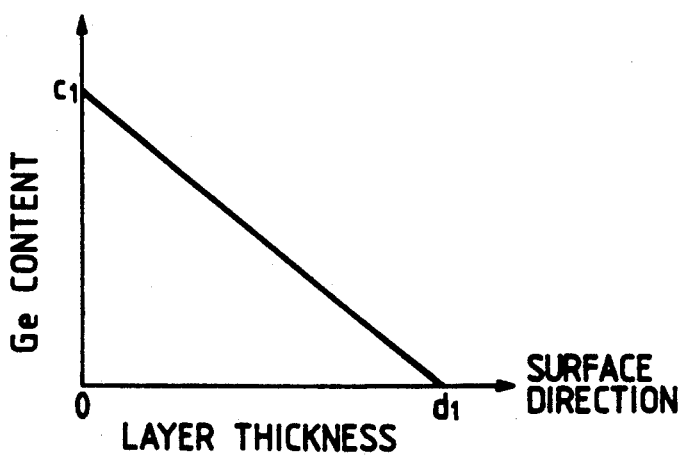
Figure 1C:
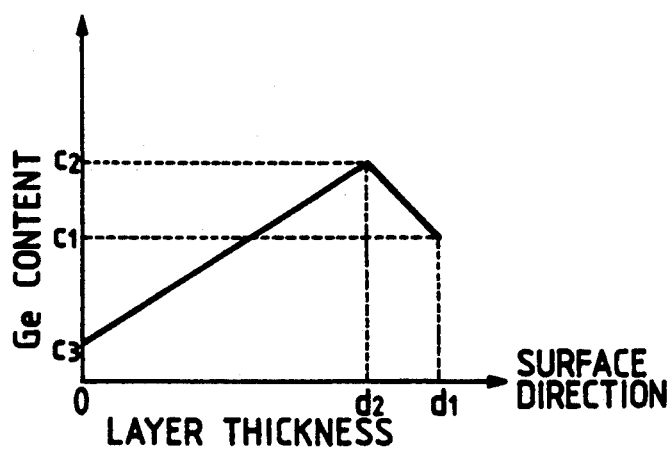

FIGS. 1B and 1C are, respectively, drawings explaining suitable distribution profiles of Ge atoms in the invention.

FIG. 1B shows a distribution profile of Ge atoms in the i-type layer when light is applied from the surface of the solar cell formed by lamination. In this state, the content of Ge atoms increases from position $d_1$ at the start of the i-type layer to position 0 at the end of the i-type layer.

Such a distribution of Ge atoms permits light having short wavelengths to be absorbed by a region containing a small amount of Ge atoms and having a wide forbidden band, and light having long wavelengths to be absorbed by a region containing a large amount of Ge atoms and having a narrow forbidden band. Namely, not only the absorption of sunlight can be increased by containing Ge atoms in the i-type layer, as compared with an i-type layer not containing Ge atoms, but also the distribution of Ge atoms enables the bulk absorption of the sunlight over a wide wavelength region. Thus, it is possible to prevent the conversion efficiency from being decreased by an increase in recombination, which is caused by surface absorption.

FIG. 1C shows a case where the content of Ge atoms in the i-type layer has a maximum. In the distribution shown in FIG. 1C, the content of Ge atoms increases from content $C_1$ at position $d_1$ on the surface of the i-type layer to a maximum $C_2$ at position $d_2$, and decreases to content $C_3$ at position 0 from the maximum. The maximum position $d_2$ is preferably between the middle of the i-type layer and the surface thereof on the incident side in the direction of the thickness thereof.

The distribution of Ge atoms shown in FIG. 1C permits improvement in the transmit properties of the holes optically excited in the i-type layer. Namely, drift of the holes is improved by the internal electrical field generated by the distribution of Ge atoms between positions $d_2$ and $d_1$.

In order to increase the conversion efficiency of the solar cell having the distribution of Ge atoms shown in FIG. 1C, the content of Ge atoms is preferably set as follows:

The content of Ge atoms at position $d_1$ must be 0 to 10 at %, the content of Ge atoms at position $d_2$ must be 30 to 50 at %, and the content of Ge atoms at position 0 must be 0 to 20 at %.

P-type Layer

In the present invention, the p-type layer is an important layer for controlling the photoelectromotive force and photoelectric current of the solar cell.

Silicon-containing non-single crystal semiconductors are suitable as materials for the p-type layer, and hydrohalogenated amorphous silicon (including microcrystalline silicon) and hydrohalogenated amorphous silicon carbide are particularly suitable.

If the material is further limited, microcrystalline silicon carbide is preferable because it has a wide forbidden band for increasing the photoelectromotive force and photoelectric current and has high transmittance for sunlight.

In the present invention, the grain size of microcrystalline silicon or silicon carbide is preferably 30 to 50 Å, and most preferably 50 to 300 Å.

In the case of microcrystalline silicon, the content of hydrogen and halogen atoms is preferably 1 to 10 at %, and most preferably 1 to 7 at %.

In the case of amorphous silicon, the content of hydrogen and halogen atoms is preferably 1 to 40 at %, and most preferably 5 to 20 at %.

The thickness of the p-type layer is preferably 10 to 50 Å, and most preferably 30 to 200 Å.

The carbon content in amorphous silicon carbide (including microcrystalline silicon carbide) is preferably 5 to 50 at %, and most preferably 10 to 30 at %.

In addition, an element in Group III of the Periodic Table is suitable as dopant contained in the p-type layer. Of the elements in Group III, boron (B), aluminum (Al), or gallium (Ga) is most preferable.

The content of the dopant contained in the p-type layer is preferably 1 to 20 at %, and most preferably 5 to 10 at %.

In regard to the electrical characteristics of the p-type layer, under the conditions described above, the activation energy is preferably 0.2 eV or less, and most preferably 0.1 eV or less, and the resistivity is preferably 10 $\Omega$.cm or less, and most preferably 1 $\Omega$.cm or less.

Transparent Electrode

The transparent electrode used in the present invention preferably has a transmittance of at least 85% in order to efficiently transmit sunlight and light emitted from a white fluorescent lamp into the semiconductor layers. The transparent electrode also, preferably, has a sheet resistance value of 100 $\Omega$ or less, in order to prevent the electrode from serving as a resistive component for the output of the solar cell. Examples of materials having the above characteristics include metal oxides such as $SnO_2$, $In_2O_3$, ZnO, CdO, $Cd_2SnO_4$, ITO ($In_2O_3+SnO_2$), and semitransparent metal thin films formed by using a metal such as Au, Al Cu, or the like.

The method of forming a transparent electrode is appropriately selected from a resistance heating evaporation process, an electron beam heating evaporation process, a sputtering process, a spray process, and the like, according to the need.

In the present invention, the p-type, n-type, and i-type layers are preferably formed by the DC plasma CVD process, the high-frequency plasma CVD process, the microwave plasma CVD process, or the like.

Raw material gases suitable for the plasma CVD process are the following:

Examples of raw material gases effectively used for supplying Si in the present invention include silicon hydrides (silanes), such as $SiH_4$, $Si_2H_6$, $Si_3H_8$, $Si_4H_{10}$, and the like, which are gaseous or can be gasified. Of these gases, $SiH_4$ and $Si_2H_6$ are particularly preferable from the viewpoints of ease of handling during layer-forming and high efficiency of Si supply.

Examples of raw material gases used for introducing halogen atoms in the present invention include many halogen compounds such as gases, halides, interhalogen compounds, halogenated silane derivatives, and the like, which are gaseous or can be gasified.

Halogen-containing silicon compounds which are gaseous or can be gasified can also be used in the present invention.

Typical examples of halogens or halogen compounds that can be preferably used in the present invention include halogen gases such as fluorine, chlorine, bromine, and iodine, and interhalogen compounds such as BrF, ClF, ClF$_3$, ClF$_3$, BrF$_5$, BeF$_5$, BeF$_3$, IF$_3$, ICl, Ibr, and the like.

Examples of halogen-containing silicon compounds, i.e., halogenated silane derivatives, that can be preferably used include silicon halides such as SiF$_4$, Si$_2$F$_6$, SiCl$_4$, SiBr$_4$, and the like.

When such halogen-containing silicon compounds are used, the compounds may be introduced into a deposition chamber characteristic of the present invention, and a plasma atmosphere of the gas may be formed in the chamber by a glow discharge method.

In the present invention, any one of the above halogen compounds and halogen-containing silicon compounds is effectively used as the raw material gas for introducing halogen atoms. However, effective starting materials also include hydrogen halides such as HF, HCl, HBr, HI, and the like, and halogenated silicon hydrides such as SiH$_2$F$_2$, SiH$_2$I$_2$, SiH$_2$Cl$_2$, SiHCl$_3$, SiH$_2$Br$_2$, SiHBr$_3$, and the like, which are gaseous or can be gasified and each of which contains hydrogen atoms as a component element.

Any one of such hydrogen-containing halides can be used as a preferable raw material for introducing halogen atoms in the present invention because hydrogen atoms effective for controlling the electrical or photoelectrical properties are also introduced in the layer formed at the same time as the introduction of halogen atoms during the formation of the layer.

Examples of carbon-containing compounds used as a raw material for introducing carbon atoms include saturated hydrocarbons having 1 to 4 carbon atoms, ethylene series hydrocarbons each having 2 to 4 carbon atoms, acetylene series hydrocarbons each having 2 to 3 carbon atoms, and the like.

Examples of saturated hydrocarbons include methane (CH$_4$), ethane (C$_2$H$_6$), propane (C$_3$H$_8$), n-butane (n-C$_6$H$_{10}$), and pentane (C$_5$H$_{12}$). Examples of ethylene series hydrocarbons include ethylene (C$_2$H$_4$), propylene (C$_3$H$_6$), butene-1 C$_4$H$_8$), butene-2 (C$_4$H$_8$), isobutylene (C$_4$H$_8$), and pentene (C$_5$H$_{10}$). Examples of acetylene series hydrocarbons include acetylene (C$_2$H$_2$), methylacetylene (C$_3$H$_4$), butyne (C$_4$H$_6$), and the like.

Alkyl silicides such as Si(CH$_3$)$_4$, Si(C$_2$H$_4$), and the like can be exemplified as raw material gases each having Si, C, and H as constituent atoms.

When the layer containing atoms in Group III or V of the Periodic Table is formed by the glow discharge method, a material which is appropriately selected from the Si starting materials described above and to which a starting material for introducing atoms in Group III or IV is used as a starting material gas for forming the layer. Any material which contains atoms in Group III or V and which is gaseous or can be gasified can be used as a starting material for introducing atoms in Group III or V of the Periodic Table.

In the present invention, examples of materials that can be effectively used as starting materials for introducing atoms in Group III, e.g., for introducing boron atoms, include boron hydrides such as B$_2$H$_6$, B$_4$H$_{10}$, B$_5$H$_9$, B$_5$H$_{11}$, B$_6$H$_{10}$, B$_6$H$_{12}$, B$_6$H$_{14}$, and the like; and boron halides such as BF$_3$, BCl$_3$, BBr$_3$, and the like. AlCl$_3$, GaCl$_3$, InCl$_3$, TlCl$_3$, and the like can also be exemplified.

In the present invention, examples of materials that can be effectively used as starting materials for introducing atoms in Group V, e.g., for introducing phosphorus atoms, include phosphorus hydrides such as PH$_3$, P$_2$H$_4$, and the like; and phosphorus halides such as PH$_4$I, PF$_3$, PF$_5$, PCl$_3$, PCl$_5$, PBr$_3$, PBr$_5$, PI$_3$, and the like. AsH$_3$, AsF$_3$, AsCl$_3$, AsBr$_3$, AsF$_5$, SbH$_3$, SbF$_3$, SbF$_5$, SbCl$_3$, SbCl$_5$, BiH$_3$, BiCl$_3$, BiBr$_3$, and the like can also be exemplified.

Examples of materials that can be effectively used as Ge supplying gas include germanium hydrides such as GeH$_4$, Ge$_2$H$_6$, Ge$_3$H$_8$, Ge$_4$H$_{10}$, and the like, which are gaseous or can be gasified. Of these materials GeH$_4$, Ge$_2$H$_6$, and Ge$_3$H$_8$ are particularly preferable from the viewpoints of ease of handling and high efficiency of Ge supply during layer forming.

Other examples of effective raw materials for forming the layers include hydrohalogenated germanium compounds, such as GeHF$_3$, GeH$_2$F$_2$, Ge$_3$F, GeHCl$_3$, GeH$_2$Cl$_2$, GeH$_3$Cl, GeHBr$_3$, GeH$_2$Br$_2$, GeH$_3$Br, GeHI$_3$, GeH$_2$I$_2$, GeH$_3$I, and the like; and germanium halides such as GeF$_4$, GeBr$_4$, GeI$_4$, GeF$_2$, GeCl$_2$, GeBr$_2$, GeI$_2$, and the like, all of which are gaseous or can be gasified.

EXPERIMENTAL EXAMPLE

Although the present invention is described in detail below with reference to experimental examples, the invention is not limited to these examples.

EXAMPLE 1

The solar cell according the present invention was manufactured by a microwave (hereinafter abbreviated to "μW") glow discharge decomposition method.

Figure 3:
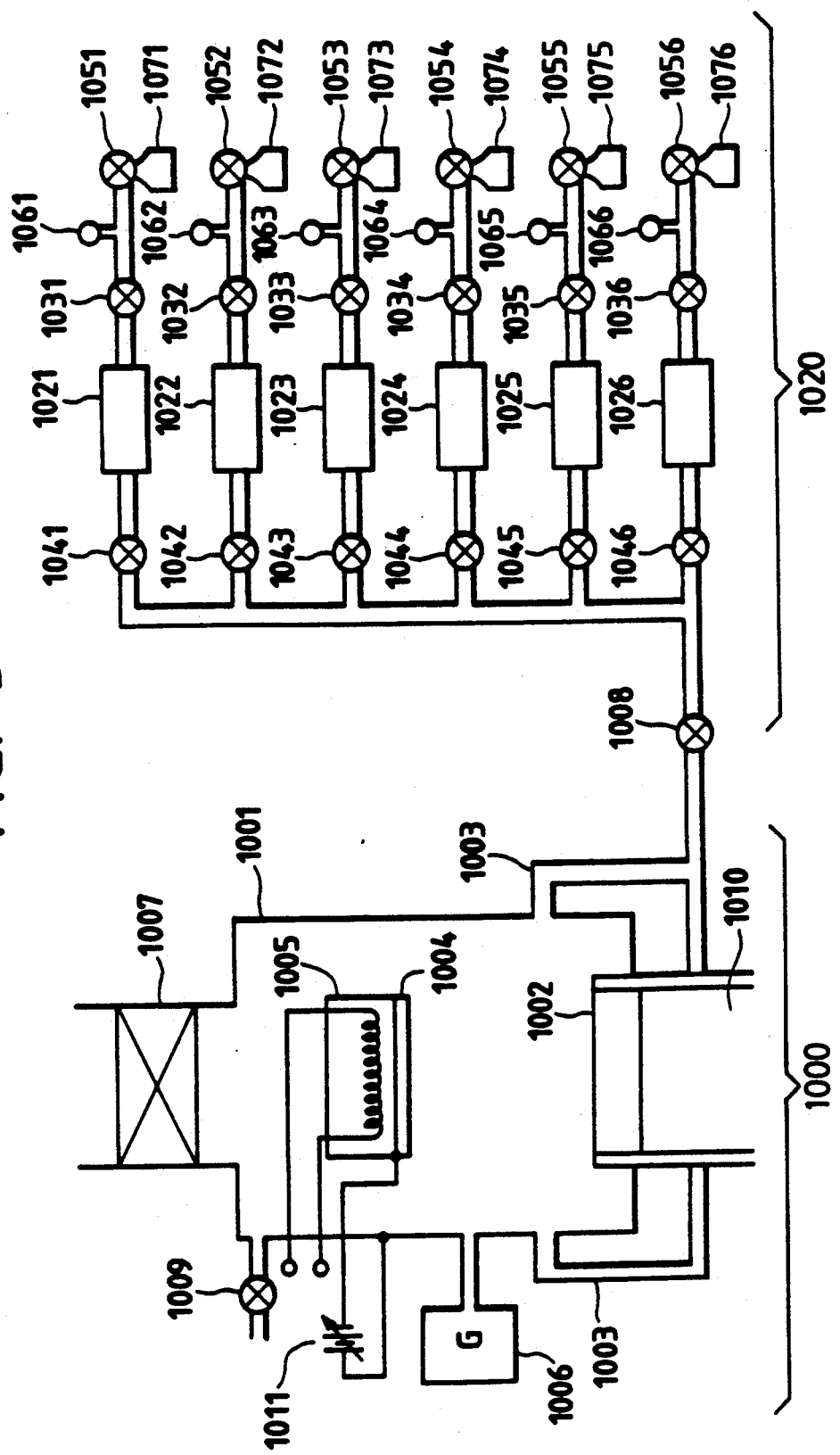
FIG. 3 is a schematic view of an example of an apparatus for producing the solar cell according to the present invention by means of a glow discharge process using microwaves.

FIG. 3 illustrates a solar cell manufacturing apparatus composed of a raw material gas supplying device 1020 and a deposition device 1000, the solar cell manufacturing apparatus being arranged to manufacture the same by the μW glow discharge decomposition method.

Gas tanks 1071 to 1075 respectively are filled with a variety of raw material gases for forming the layers of the solar cell according to the present invention. The tank 1071 is filled with SiH$_4$ gas (purity: 99.99%), the tank 1072 is filled with H$_2$ gas (purity: 99.9999%), the tank 1073 is filled with CH$_4$ gas (purity: 99.999%), the tank 1074 is filled with B$_2$H$_6$ (purity: 99.999% and hereinafter abbreviated to "B$_2$H$_6$/H$_2$") diluted to 10% by H$_2$ gas and the tank 1075 is filled with PH$_3$ gas (purity: 99.999% and hereinafter abbreviated to "PH$_3$/H$_2$") diluted to 10% by H$_2$ gas. At the time of attaching the gas tanks 1071 to 1075, the above-described gases have been previously introduced into the gas pipes of the introduction valves 1031 to 1035 through valves 1051 to 1055.

Reference numeral 1004 represents a 100 mm × 100 mm substrate, the thickness of which is 0.25 mm and which is made of stainless steel (SUS430BA), and the surface of the substrate 1004 is formed into a mirror surface.

First, the valves 1051 to 1055 were opened to introduce the SiH$_4$ gas from the gas tank 1071, the H$_2$ gas from the gas tank 1072, the CH$_4$ gas from the gas tank 1073, the B$_2$H$_6$/H$_2$ gas from the gas tank 1074 and the PH$_3$/H$_2$ gas from the gas tank 1075 before each of the gas pressures was adjusted to 2 kg/cm$^2$ by using pressure regulators 1061 to 1065.

Then, closure of introduction valves 1031 to 1035 and leak valve 1009 of deposition chamber 1001 was confirmed. Furthermore, opening of outlet valves 1041 to 1045 and a sub-valve 1008 was confirmed before a conductance (a butterfly type) valve 1007 was fully opened so as to, by means of a vacuum pump (omitted from illustration), exhaust the deposition chamber 1001 and the gas pipes. Then, when a value of about $1 \times 10^{-4}$ Torr was measured at vacuum gauge 1006, the sub-valve 1008 and the outlet valves 1041 to 1045 were closed.

Then, the introduction valves 1031 to 1035 were gradually opened to introduce the above-described gases into mass-flow controllers 1021 to 1025.

After the preparation for forming the films had been thus completed, a diamond layer, an n-type layer, an i-type layer, and a p-type layer were formed on the substrate 1004.

The diamond layer was formed in such a manner that the substrate 1004 was heated to 400° C. by a heater 1005 and the outlet valves 1042, 1043, 1045, and the sub-valve 1008 were gradually opened to introduce $H_2$ gas, $CH_4$ gas, and $PH_3/H_2$ gas into the deposition chamber 1001 via the gas introduction pipe 1003. At this time, the corresponding mass-flow controllers 1022, 1023, and 1025 were used to adjust the flow rate of the $H_2$ gas to 500 sccm, that of the $CH_4$ gas to 5 sccm, and that of the $PH_3/H_2$ gas to 2.5 sccm. The pressure in the deposition chamber 1001 was set to 20 mTorr by adjusting the opening of the conductance valve 1007 while observing the vacuum gauge 1006. Then, a DC bias of $-100$ v with respect to the deposition chamber 1001 was applied from a DC power source 1011 to the substrate 1004. The electric power of the $\mu W$ power source (omitted from illustration) was sent to 0.5 W/cm$^3$ so as to introduce microwaves into the deposition chamber 1001 via a waveguide pipe (omitted from illustration), a waveguide portion 1010, and a dielectric window 1002 so that $\mu W$ glow discharge took place. As a result, forming of the diamond layer on the substrate 1004 was commenced. When the thickness of the formed diamond layer became 1 $\mu m$, the $\mu W$ glow discharge was stopped and the output of the DC power source 1011 was also terminated. Furthermore, the outlet valves 1042, 1043, 1045, and the sub-valve 1008 were closed so as to stope the gas introduction into the deposition chamber 1001. Thus, forming of the diamond layer was completed.

The n-type layer was formed in such a manner that the substrate 1004 was heated to 280° C. by the heater 1005 and the outlet valves 1041, 1042, 1045 and the sub-valve 1008 were gradually opened to introduce $SiH_4$ gas, $H_2$ gas, and $PH_3/H_2$ gas into the deposition chamber 1001 via the gas introduction pipe 1003. At this time, the corresponding mass-flow controllers 1021, 1022, and 1025 were used to adjust the flow rate of the $SiH_4$ gas to 5 sccm, that of the $H_2$ gas to 5 sccm, and that of the $PH_3/H_2$ gas to 5 sccm. The pressure in the deposition chamber 1001 was set at 10 mTorr by adjusting the opening of the conductance valve 1007 while observing the vacuum gauge 1006. Then, a DC bias of $-50$ v with respect to the deposition chamber 1001 was applied from the DC power source 1011 to the substrate 1004. The electric power of the $\mu W$ power source (omitted from illustration) was set to 0.02 W/cm$^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the n-type layer on the diamond layer was commenced. When the thickness of the formed n-type layer became 0.01 $\mu m$, the $\mu W$ glow discharge was stopped and the output of the DC power source 1011 was also terminated. Furthermore, the outlet valves 1041, 1042, 1045, and the sub-valve 1008 were closed so as to stop the gas introduction into the deposition chamber 1001. Thus, forming of the n-type layer was completed.

The i-type layer was formed in such a manner that the substrate 1004 was heated to 280° C. by the heater 1005 and the outlet valves 1041, 1042 and the sub-valve 1008 were gradually opened to introduce the $SiH_4$ gas and the $H_2$ gas into the deposition chamber 1001 via the gas introduction pipe 1003. At this time, the corresponding mass-flow controllers 1021 and 1022 were used to adjust the flow rate of the $SiH_4$ gas to 50 sccm and that of the $H_2$ gas to 100 sccm. The pressure in the deposition chamber 1001 was set at 10 mTorr by adjusting the opening of the conductance valve 1007 while observing the vacuum gauge 1006. Then, a DC bias of $-50$ v with respect to the deposition chamber 1001 was applied from the DC power source 1011 to the substrate 1004. The electric power of the $\mu W$ power source (omitted from illustration) was set at 0.15 W/cm$^3$ so as to introduce microwaves into the deposition chamber 1001 via the waveguide pipe (omitted from illustration), the waveguide portion 1010, and the dielectric window 1002 so that $\mu W$ glow discharge took place. As a result, forming of the i-type layer on the n-type layer was commenced. When the thickness of the formed i-type layer became 0.4 $\mu m$, the $\mu W$ glow discharge was stopped and the output of the DC power source 1011 was also terminated. Thus, forming of the i-type layer was completed.

The p-type layer was formed in such a manner that the substrate 1004 was heated to 280° C. by the heater 1005 and the outlet valves 1041, 1042, 1044, and the sub-valve 1008 were gradually opened to introduce $SiH_4$ gas, $H_2$ gas, and $B_2H_6/H_2$ gas into the deposition chamber 1001 via the gas introduction pipe 1003. At this time, the corresponding mass-flow controllers 1021, 1022, and 1024 were used to adjust the flow rate of the $SiH_4$ gas to 5 sccm, that of the $H_2$ gas to 500 sccm, and that of the $B_2H_6/H_2$ gas to 5 sccm. The pressure in the deposition chamber 1001 was set at 20 mTorr by adjusting the opening of the conductance valve 1007 while observing the vacuum gauge 1006. Then, a DC bias of $-70$ v with respect to the deposition chamber 1001 was applied from the DC power source 1011 to the substrate 1004. The electric power of the $\mu W$ power source (omitted from illustration) was set to 0.5 W/cm$^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the p-type layer on the i-type layer was commenced. When the thickness of the formed p-type layer became 0.005 $\mu m$, the $\mu W$ glow discharge was stopped and the output of the DC power source 1011 was also terminated. Furthermore, the outlet valves 1041, 1042, 1044 and the sub-valve 1008 were closed so as to stop the gas introduction into the deposition chamber 1001. Thus, forming of the p-type layer was completed.

The conditions for manufacturing the solar cell are shown in Tables 1-3.

The outlet valves 1041 to 045, except for those for the required gas must, of course, be completely closed at the time of forming the respective layers. Furthermore, if necessary, the outlet valves 1041 to 1045 are closed, the sub-valve 1008 is opened and the conductance valve 1007 is completely opened in order to prevent leaving any gas in the deposition chamber 1001 and the pipes arranged from the outlet valves 1041 to 1045 to the deposition chamber 1001 so as to temporarily reduce the pressure level in the system.

An ITO ($In_2O_3+SnO_2$) transparent electrode layer was, by a convention method, evaporated to a thickness of 0.085 $\mu$m on the p-type layer of the thus manufactured solar cell. Furthermore, as a collecting electrode, Al was evaporated to a thickness of 2 $\mu$m by a conventional method so that the solar cell manufactured was completed. By performing a similar operation, two other solar cells were manufactured (solar cell Example 1).

COMPARISON EXAMPLE 1

The substrate 1004 was heated to 350° C. and a silver thin film was formed on the surface of the substrate 1004 to a thickness of 0.45 $\mu$m by sputtering and a ZnO thin film was evaporated to a thickness of 2 $\mu$m so that a lower electrode was formed. Then, the n-type layer, the i-type layer, the p-type layer, the transparent electrode, and the collecting electrode were formed under the same conditions as those for Example 1 except that the diamond layer was not formed so that two solar cells were manufactured (solar cell Example 1 and Comparison Example 1).

The initial characteristics, the thermal deterioration characteristics, and the stress deterioration characteristics of the solar cells manufactured in Example 1 (solar cell Example 1) and Comparison Example 1 (solar cell Comparison Example 1) were evaluated.

The initial characteristics of the two solar cells manufactured according to Example 1 (solar cell Example 1) and those of the two solar cells manufactured according to Comparison Example 1 (solar cell Comparison Example 1) were evaluated in such a manner that they were exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which was 1.2 times the efficiency of Comparison Example 1 (solar cell Comparison Example 1).

The thermal deterioration characteristics were evaluated in such a manner that each of the solar cells manufactured according to Example 1 (solar cell Example 1) and Comparison Example 1 (solar cell Comparison Example 1) respectively were subjected 10 times to the following process in which each solar cell was allowed to stand in a constant temperature drier (DV-41 manufactured by Yamato) set at 100° C. for 1 hour before it was placed in a refrigerator (R-107W manufactured by Hitachi) set at 5° C. for 1 hour and, similarly to the evaluation of the initial characteristics, it was exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which was 1.4 times the efficiency of Comparison Example 1 (solar cell Comparison Example 1).

The stress deterioration characteristics were evaluated in such a manner that each of the solar cells respectively accordingly to Example 1 (solar cell Example 1) and Comparison Example 1 (solar cell Comparison Example 1) which had not been subjected to the thermal deterioration evaluation was subjected 50 times to the following process in which it was bent at a curvature radius of 54 mm while making the stainless substrate to face inside before it was restored to a planar shape. Then, similarly to the evaluation of the initial characteristics, it was exposed to light of AM-1.5 (100 mW/cm$^2$) to measure the photoelectrical conversion efficiency. As a result of the evaluation of the characteristics, the solar cell according to Example 1 (solar cell Example 1) displayed a photoelectrical conversion efficiency which was 1.3 times the efficiency of Comparison Example 1 (solar cell Comparison Example 1).

Furthermore, the diamond layer having a thickness of 1 $\mu$m was formed on the stainless substrate under the same forming conditions as in Example 1 so that a sample, the crystallinity of which could be analyzed, was manufactured. The crystallinity of the diamond layer was evaluated by using an X-ray diffraction apparatus (RAD-3b manufactured by Rigaku Electronic). As a result, sharp diffraction lines were observed at positions of 43.9° and 75.4°, corresponding to the diffraction lines of (111) and (220) planes of the cubic system of diamond, from which it was determined that diamond crystals were formed. Furthermore, the surface roughness of the sample, the crystallinity of which was to be analyzed, was measured by using a surface roughness gauge (SE-30D manufactured by Kosaka Laboratory). As a result, Rz (average roughness of 10 points) was 0.2 $\mu$m.

Furthermore, the i-type layer having a thickness of 0.1 $\mu$m and the p-type layer having a thickness of 0.005 $\mu$m were formed on the stainless substrate under the same forming conditions as those for Example 1 so that a sample, the crystallinity of which was to be analyzed, was manufactured. The crystallinity of the p-type layer was evaluated by using RHEED (JEM-100SX manufactured by Nihon Electronic). As a result, an annular amorphous (mirocrystals included) structure was observed.

EXAMPLE 2 AND COMPARISON EXAMPLE 2

Two solar cells (solar cell Examples 2-1 to 3 and solar cell Comparison Examples 2-1 to 2) were manufactured for each of Example 2 and Comparison Example 2 under the same forming conditions as those for Example 1 except for the flow rate of the CH$_4$ gas at the time of forming the diamond layer as shown in Table 4. Further, similarly to Example 1, the diamond layer having a thickness of 1 $\mu$m was formed on the stainless substrate under the forming conditions shown in Table 2 so that a sample, the crystallinity of which was to be analyzed, was manufactured.

The solar cells and the samples, the crystallinity of which were to be analyzed according to Example 2 (solar cell Examples 2-1 to 3) and Comparison Example 2 (solar cell Comparison Examples 2-1 to 2), were subjected to the characteristics evaluation operations by the same method as that of Example 1.

Figure 4:
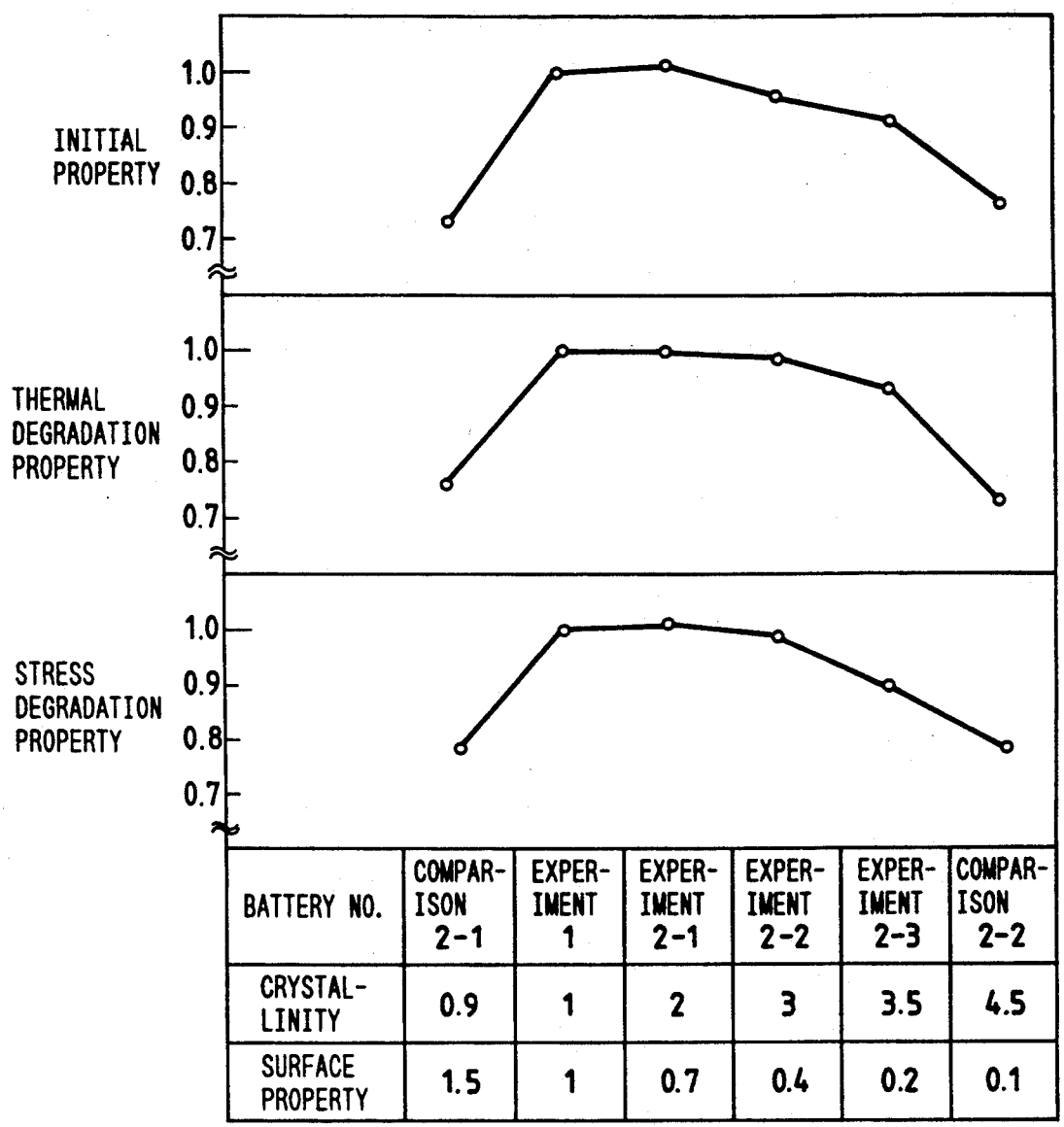
FIG. 4 shows the relation between crystallinity and surface property, and an initial property, thermal, and stress degenerations of a diamond layer according to embodiment I of the present invention.

The initial characteristics, the thermal deterioration characteristics, the stress deterioration characteristics of the solar cells, and the crystallinity and surface characteristics of the diamond layer are shown in FIG. 4. The crystallinity was evaluated by X-ray diffraction in such a manner that the half value width of the diffraction line at a position of 43.9°, corresponds to the diffraction line of the (111) plane of the cubic crystal of diamond. As can be understood from FIG. 4, the solar cells according to the present invention (solar cell Examples 1 and Examples 2-1 to 3) displayed characteristics superior to those of the solar cells according to the comparison examples (solar cell Comparison Examples 2-1 to 2). As a result, a beneficial effect of the present invention was confirmed.

EXAMPLE 3 AND COMPARISON EXAMPLE 3

Two solar cells (solar cell Examples 3-1 to 3 and solar cell Comparison Examples 3-1 to 2) were manufactured for each of Example 3 and Comparison Example 3 under the same forming conditions as those of Example 1, except for the flow rate of the $PH_3/H_2$ gas at the time of forming the diamond layer, as shown in Table 5. Further, similarly to Example 1, the diamond layer having a thickness of 1 $\mu$m was formed on the stainless substrate under the forming conditions shown in Table 4 so that a sample, the conductance of which was to be analyzed, was manufactured.

The solar cells according to Example 3 (solar cell Examples 3-1 to 3) and Comparison Example 3 (solar cell Comparison Examples 3-1 to 2) were subjected to the characteristics evaluation operations by the same method as that of Example 1.

Each of the samples, the conductance of which was to be analyzed according to Example 3 (solar cell Examples 3-1 to 3) and Comparison Example 3 (solar cell Comparison Examples 3-1 to 2), were subjected to the following process arranged wherein a chrome electrode, the diameter of which was 2 mm and the thickness of which was 0.1 $\mu$m, was formed by evaporating chrome (Cr) on the surface of the diamond layer. Then, the samples were disposed in the dark before voltage V was applied to a position between the chrome electrode and the stainless substrate by using a pA meter (4140B manufactured by Yokokawa Hewlett Packard) to measure electric current I passing between the two electrodes described above. Then, dark conductance $\delta d$ was obtained in accordance with the following equation by using the film thickness D of the diamond layer:

$$\delta d \text{ (S/cm)} = \frac{I(A) \times D \text{ (cm)}}{0.0314 \times V(V)}$$

Also, the sample (solar cell Example 1), the crystallinity of which was to be analyzed and manufactured in accordance with Example 1, were subjected to the process of obtaining the dark conductance $\delta d$ in a similar method.

Figure 5:
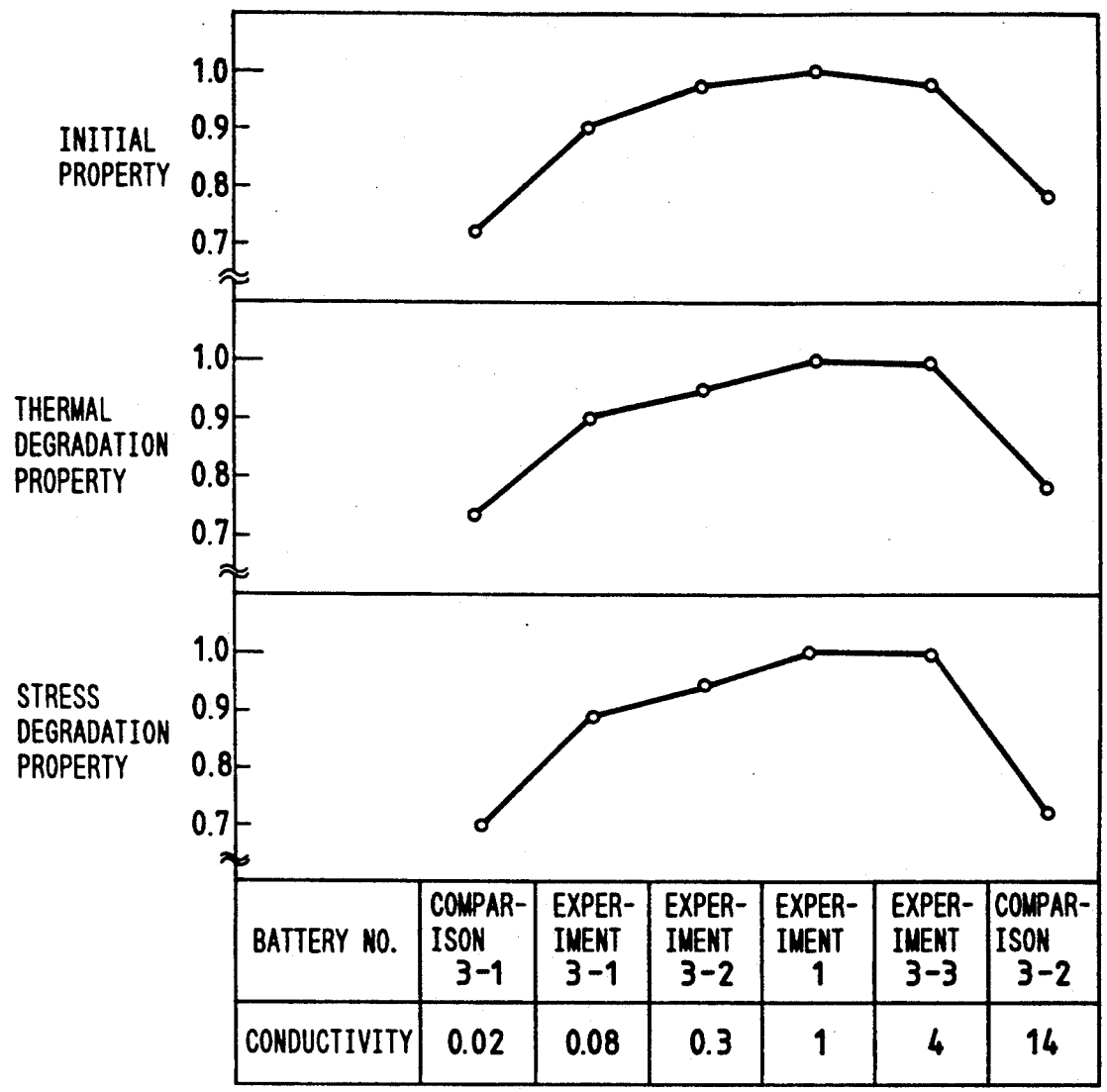
FIG. 5 shows the relation between dark conductivity, and the initial property, and the thermal and stress degenerations of the diamond layer of the present invention.

The initial characteristics, the thermal deterioration characteristics, and the stress deterioration characteristics of the solar cells and the dark conductance of the diamond layer are shown in FIG. 5. As can be understood from FIG. 5, the solar cells according the present invention (solar cell Examples 1 and Examples 3-1 to 3) displayed characteristics superior to the solar cells according to the comparison examples (solar cell Comparison Examples 3-1 to 2). As a result, a beneficial effect of the present invention was confirmed.

EXAMPLE 4 AND COMPARISON EXAMPLE 4

Two solar cells (solar cell Examples 4-1 to 3 and solar cell Comparison Examples 4-1 to 2) were manufactured for each of Example 4 and Comparison Example 4 under the same forming conditions as for Example 1 except for using $B_2H_6/H_2$ gas in place of $PH_3/H_2$ gas and setting the flow rate of the $B_2H_6/H_2$ gas at the time of forming the diamond layer as shown in Table 12. Further, similarly to Example 3, the diamond layer having a thickness of 1 $\mu$m was formed on the stainless substrate under the forming conditions shown in Table 12 so that a sample, the conductance of which was to be analyzed, was manufactured.

The solar cells according to Example 4 (solar cell Examples 4-1 to 3) and Comparison Example 4 (solar cell Comparison Examples 4-1 to 2) were subjected to evaluation of the characteristics by the same method as that of Example 1. Each of the samples were subjected to the process in which dark conductance $\delta d$ was obtained by a method similar to that of Example 3.

Figure 6:
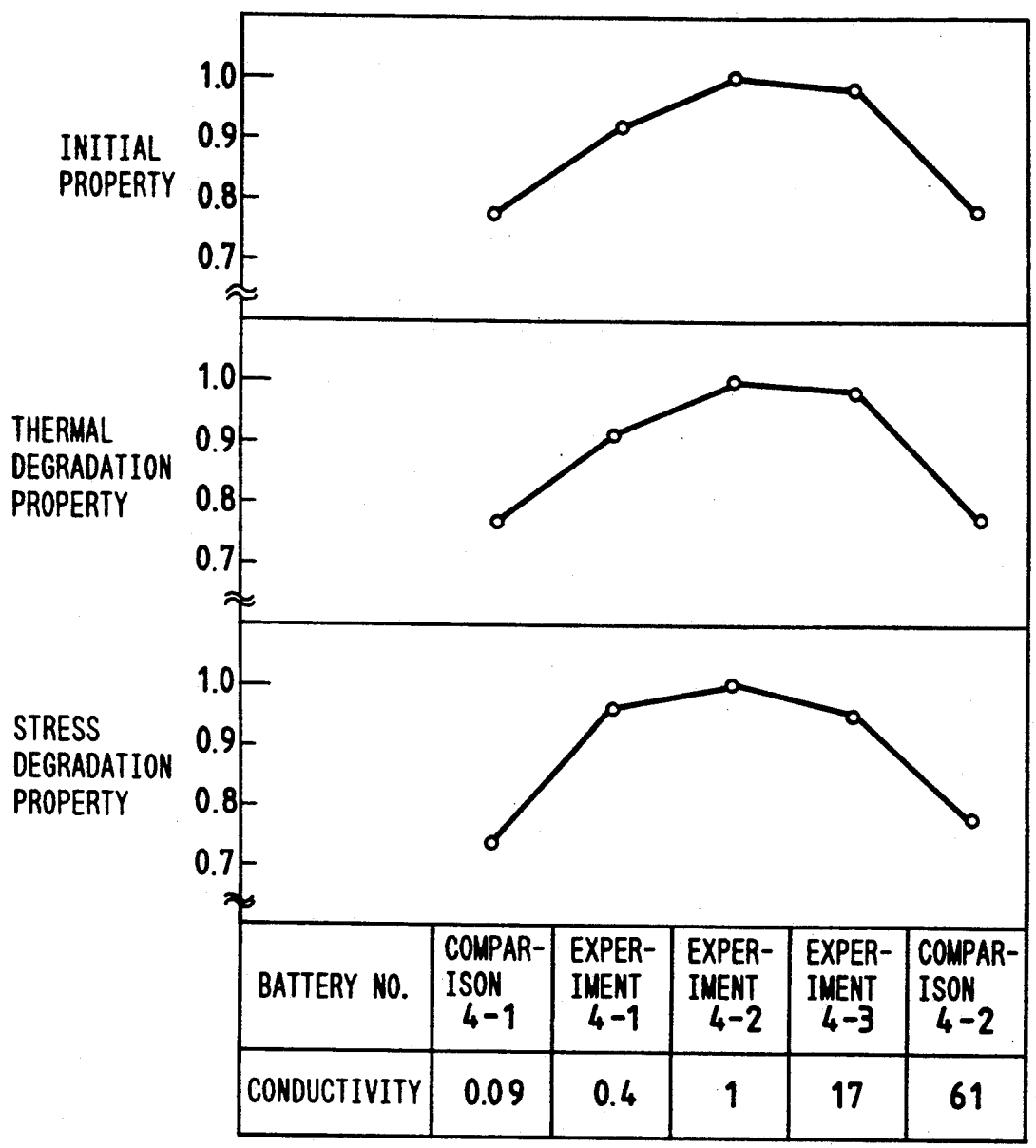
FIG. 6 shows the relation between dark conductivity, and the initial property and, the thermal and stress degenerations of the diamond layer of the present invention.

The initial characteristics, the thermal deterioration characteristics, and the stress deterioration characteristics of the solar cells and the dark conductance of the diamond layer are shown in Table 4. As can be understood from FIG. 6, the solar cells according to the present invention (solar cell Examples 4-1 to 3) displayed characteristics superior to those of the solar cells according to the comparison examples (solar cell Comparison Examples 4-1 to 2). As a result, a beneficial effect of the present invention was confirmed.

EXAMPLE 5 AND COMPARISON EXAMPLE 5

Two solar cells (solar cell Examples 5-1 to 3 and solar cell Comparison Examples 5-1 to 2) were manufactured for each of Example 5 and Comparison Example 5 under the same forming conditions as Example 1 except for the thickness of the diamond layer at the time of forming the diamond layer as shown in Table 7. Further, the solar cells were subjected to the characteristics evaluation operations by the same method as Example 1.

Figure 7:
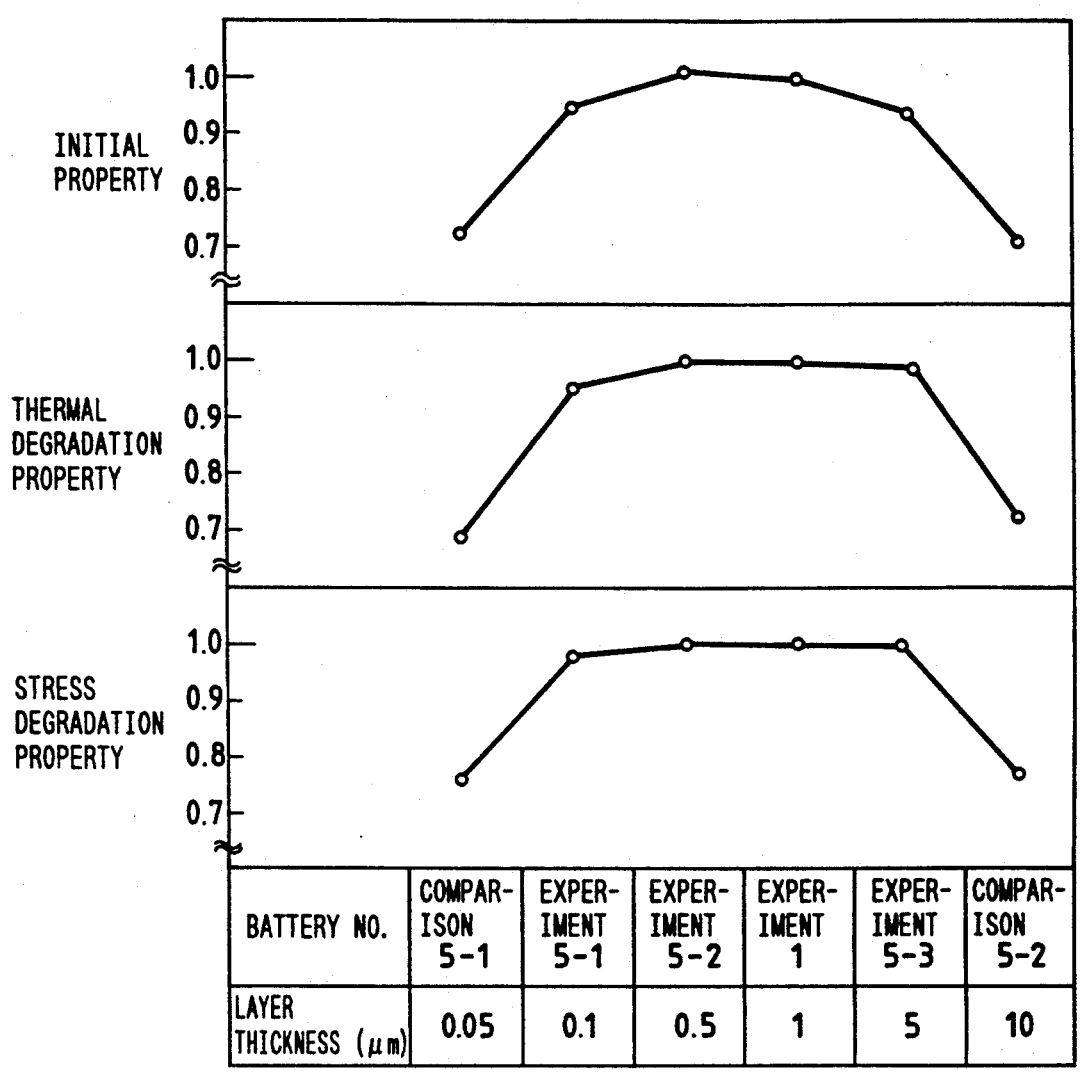
FIG. 7 shows the relation between thickness of the diamond layer, and the initial property and the thermal and stress degenerations of the diamond layer of the present invention.

The initial characteristics, the thermal deterioration characteristics, and the stress deterioration characteristics of the solar cells, and the dark conductance of the diamond layer are shown in FIG. 7. As can be understood from FIG. 7, the solar cells according to the present invention (solar cell Example 1 and Example 5-1 to 3) displayed characteristics superior to those of the solar cells according to the comparison examples (solar cell Comparison Examples 5-1 to 2). As a result, a beneficial effect of the present invention was confirmed.

The preferred embodiments of the present invention will now be described in detail. However, the present invention is not limited to the description made hereinafter.

EMBODIMENT 1

Figure 8:
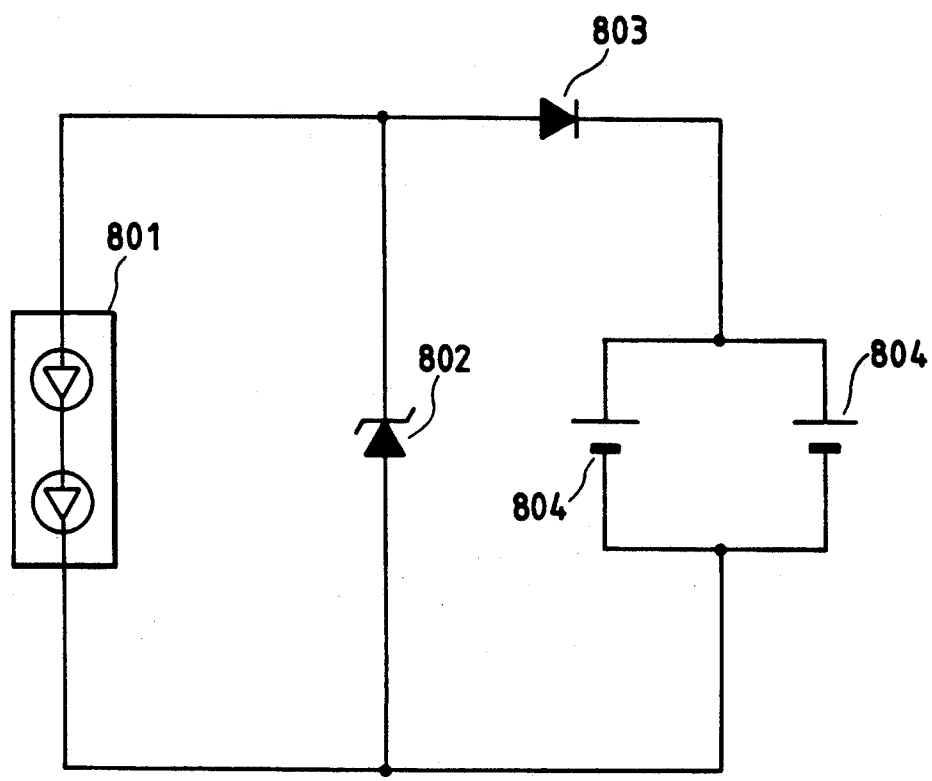
FIG. 8 shows the electric circuit diagram of a battery charger using the solar cell according to the present invention.

Two solar cells were manufactured under the same forming conditions as those for Example 1 such that a solar cell module and a charger, the circuit of which was structured as shown in FIG. 8, was manufactured. Referring to FIG. 8, electric power generated in a solar cell module 801 was supplied to charge a secondary battery (TN-IU manufactured by Toshiba) 804 after it has passed through a reverse current blocking diode 803. Reference numeral 802 represents an overcharge preventing diode.

COMPARISON EMBODIMENT 1

Two solar cells were manufactured under the same manufacturing conditions as Comparison Example 1 to manufacture a charger similar to that of Embodiment 1 by using the above-described solar cells.

The respective chargers according to Embodiment 1 and Comparison Embodiment 1 were disposed outside in the daytime when the sky was clear. Then, electric power generated in the solar cell module 801 charged up the secondary battery 804. Each of the secondary batteries 804 charged by the corresponding chargers according to Embodiment 1 and Comparison Embodiment 1 was loaded in a flash lamp (K-67 manufactured by Toshiba) to power the flash lamp. Then, the secondary batteries 804 were again charged by using the corresponding chargers according to Embodiment 1 and Comparison Embodiment 1. The above-described process was repeated. As a result, the charger according to Embodiment 1 was able to power the flash lamp for a longer time i.e., 1.3 times longer than which the charger according to Comparison Example 1 was able to power the same flash lamp. Therefore, a beneficial effect of the present invention was confirmed.

EMBODIMENT 2

Two solar cells were manufactured under the same conditions as Example 1, except for the conditions as shown in Tables 8 and 9 for forming the diamond layer, the n-type layer, the i-type layer, and the p-type layer. Then, a charger similar to that of Embodiment 1 was used similarly to Embodiment 1. As a result, it was able to power the flash lamp for substantially the same time as that realized by Embodiment 1. Therefore, a beneficial effect of the solar cell according to the present invention was confirmed.

Furthermore, the diamond layer, the thickness of which was 1 μm, was formed before the n-type layer was formed at a thickness of 0.01 μm on the stainless substrate under the forming conditions as shown in Table 6 so that a sample, the crystallinity of which was to be analyzed, was manufactured. Then, the crystallinity of the n-type layer was evaluated similarly to Example 1. As a result, annular amorphous (mirocrystals included) characteristics were observed.

Then, the i-type layer having a thickness of 0.1 μm and the p-type layer having a thickness of 0.005 μm were formed on the stainless substrate under the forming conditions as shown in Tables 8 and 9 so that a sample, the crystallinity of which was to be analyzed, was manufactured. Then, the crystallinity of the p-type layer was evaluated similarly to Example 1. As a result, annular amorphous (microcrystals included) characteristics were observed.

EMBODIMENT 3

Two solar cells were manufactured under the same conditions as Example 1, except for the conditions as shown in Tables 10 and 11 for forming the diamond layer, the n-type layer, the i-type layer, and the p-type layer. Then, a charger similar to that of Embodiment 1 was used similarly to Embodiment 1. As a result, it was able to power the flash lamp for substantially the same time as that realized by Embodiment 1. Therefore, a beneficial effect of the solar cell according to the present invention was confirmed.

Then, the i-type layer having a thickness of 0.1 μm and the n-type layer having a thickness of 0.005 μm were formed on the stainless substrate under the forming conditions as shown in Tables 7 and 8 so that a sample, the crystallinity of which was to be analyzed, was manufactured. Then, the crystallinity of the n-type layer was evaluated similarly to Example 1. As a result, annular amorphous (microcrystals included) characteristics were observed.

EXAMPLE 2-1

In the apparatus shown in FIG. 3, the gas tanks 1071 to 1075, respectively, were filled with a variety of the raw material gases for forming the layers of the solar cell according to the present invention. The tank 1071 is filled with $SiH_4$ gas (purity: 99.99%), the tank 1072 was filled with $H_2$ gas (purity: 99.9999%), the tank 1073 is filled with $CH_4$ gas (purity: 99.999%), the tank 1074 is filled with $B_2H_6$ gas (purity: 99.999% and hereinafter abbreviated to "$B_2H_6/H_2$") diluted to 10% by $H_2$ gas and the tank 1075 was filled with $PH_3$ gas (purity: 99.999% and hereinafter abbreviated to "$PH_3/H_2$") diluted to 10% by $H_2$ gas. At the time of attaching the gas tanks 1071 to 1075, the above-described gases had been previously introduced into the gas pipes of the introduction valves 1031 to 1035 trough valves 1051 to 1055.

Reference numeral 1004 represent a 100 mm × 100 mm substrate, the thickness of which was 0.25 mm and which was made of stainless steel (SUS430BA), and the surface of the substrate 1004 was made into a mirror surface.

First, the valves 1051 to 1055 were opened to introduce $SiH_4$ gas from the gas tank 1071, $H_2$ gas from the gas tank 1072, $CH_4$ gas from the gas tank 1073, $B_2H_6/H_2$ gas from the gas tank 1074, and $PH_3/H_2$ gas from the gas tank 1075 before each of the gas pressures was adjusted to 2 kg/cm² by using the pressure regulators 1061 to 1065.

Then, closure of the introduction valves 1031 to 1035, and the leak valve 1009 of the deposition chamber 1001 was confirmed. Furthermore, opening of the outlet valves 1041 to 1045 and the sub-valve 1008 was confirmed before the conductance (a butterfly type) valve 1007 was fully opened so as to, by means of a vacuum pump (omitted from illustration), exhaust the deposition chamber 1001 and the gas pipes. Then, when a pressure of about $1 \times 10^{-4}$ Torr was read at the vacuum gauge 1006, the sub-valve 1008 and the outlet valves 1041 to 1045 were closed.

Then, the introduction valves 1031 to 1035 were gradually opened to introduce the above-described gases into the mass-flow controllers 1021 to 1025.

After the preparation for forming the films had been thus completed, a diamond layer, an n-type layer, an i-type layer, and a p-type layer were formed on the substrate 1004.

The diamond layer was formed in such a manner that the substrate 1004 was heated to 400° C. by the heater 1005 and the outlet valves 1042, 1043, 1045, and the sub-valve 1008 were gradually opened to introduce $H_2$ gas, $CH_4$ gas and $PH_3/H_2$ into the deposition chamber 1001 via the gas introduction pipe 1003. At this time, the corresponding mass-flow controllers 1022, 1023, and 1025 were used to adjust the flow rate of the $H_2$ gas to 500 sccm, that of the $CH_4$ gas to 5 sccm, and that of the $PH_3/H_2$ gas to 2.5 sccm. The pressure in the deposition chamber 1001 was set at 20 mTorr by adjusting the opening of the conductance valve 1007 while observing the vacuum gauge 1006. Then, a DC bias of −100 v with respect to the deposition chamber 1001 was applied from the DC power source 1011 to the substrate 1004. The electric power of the μW power source (omitted from illustration) was set at 0.5 W/cm³ so as to introduce microwaves into the deposition chamber 1001 via a waveguide pipe (omitted from illustration), the waveguide portion 1010, and the dielectric window 1002 so that μW glow discharge took place. As a result, forming of the diamond layer on the substrate 1004 was commenced. When the thickness of the formed diamond layer became 1 μm, the μW glow discharge was stopped and the output of the DC power source 1011 was also terminated. Furthermore, the outlet valves 1042, 1043 and 1045, and the sub-valve 1008 were closed so as to stop the gas introduction into the deposition chamber 1001. Thus, forming of the diamond layer was completed.

The n-type layer was formed in such a manner that the substrate 1004 was heated to 280° C. by the heater 1005 and the outlet valves 1041, 1042, 1043, 1045, and the sub-valve 1008 were gradually opened to introduce $SiH_4$ gas, $H_2$ gas, $CH_4$ gas, and $PH_3/H_2$ gas into the deposition chamber 1001 via the gas introduction pipe 1003. At this time, the corresponding mass-flow controllers 1021, 1022, 1023, and 1025 were used to adjust the flow rate of the $SiH_4$ gas to 5 sccm, that of the $H_2$ gas to 5 sccm, that of $CH_4$ gas to 0.5 sccm, and that of the $PH_3/H_2$ gas to 5 sccm. The pressure in the deposition chamber 1001 was set at 10 mTorr by adjusting the opening of the conductance valve 1007 while observing the vacuum gauge 1006. Then, a DC bias of −60 v with respect to the deposition chamber 1001 was applied from the DC power source 1011 to the substrate 1004. The electric power of the μW power source (omitted from illustration) was at to 0.05 W/cm$^3$ so as to introduce microwaves into the deposition chamber 1001 via a waveguide pipe (omitted from illustration), the waveguide portion 1010, and the dielectric window 1002 so that μW glow discharge took place. As a result, forming of the n-type layer on the diamond layer was commenced. When the thickness of the formed n-type layer became 0.01 μm, the μW glow discharge was stopped and the output of the DC power source 1011 was also terminated. Furthermore, the outlet valves 1041, 1042, 1043, 1045, and the sub-valve 1008 were closed so as to stop the gas introduction into the deposition chamber 101. Thus, forming of the n-type layer was completed.

The i-type layer was formed in such a manner that the substrate 1004 was heated to 280° C. be the heater 1005 and the outlet valves 1041, 1042, and the sub-valve 1008 were gradually opened to introduce $SiH_4$ gas and $H_2$ gas into the deposition chamber 1001 via the gas introduction pipe 1003. At this time, the corresponding mass-flow controllers 1021 and 1022 were used to adjust the flow rate of the $SiH_4$ gas to 50 sccm and that of the $H_2$ gas to 100 sccm. The pressure in the deposition chamber 1001 was set at 10 mTorr by adjusting the opening of the conductance valve 1007 while observing the vacuum gauge 1006. Then, the DC bias of −50 v with respect to the deposition chamber 1001 was applied from the DC power source 1011 to the substrate 1004. The electric power of the μW power source (omitted from illustration) was set at 0.15 W/cm$^3$ so as to introduce microwaves into the deposition chamber 1001 via the waveguide pipe (omitted from illustration), the waveguide portion 1010 and the dielectric window 1002 so that μW glow discharge took place. As a result, forming of the i-type layer on the n-type layer was commenced. When the thickness of the formed i-type layer became 0.4 μm, the μW glow discharge was stopped and the output of the DC power source 1011 was also terminated. Thus, forming of the i-type layer was completed.

The p-type layer was formed in such a manner that the substrate 1004 was heated to 280° C. by the heater 1005 and the outlet valves 1041, 1042, 1043, 1044, and the sub-valve 1008 were gradually opened to introduce $SiH_4$ gas, $H_2$ gas, $CH_4$ gas, and $B_2H_6/H_2$ gas into the deposition chamber 1001 via the gas introduction pipe 1003. At this time, the corresponding mass-flow controllers 1021, 1022, 1023, and 1024 were used to adjust the flow rate of the $SiH_2$ gas to 3 sccm, that of the $H_2$ gas to 500 sccm, that of the $CH_4$ gas to 0.5 sccm, and that of the $B_2H_6/H_2$ gas to 5 sccm. The pressure in the deposition chamber 1001 was set at 20 mTorr by adjusting the opening of the conductance valve 1007 while observing the vacuum gauge 1006. Then, a DC bias of −100 v with respect to the deposition chamber 1001 was applied from the DC power source 1011 to the substrate 1004. The electric power of the μW power source (omitted from illustration) was set at 0.5 W/cm$^3$ so as to introduce microwaves into the deposition chamber 1001 via a waveguide pipe (omitted from illustration), the waveguide portion 1010, and the dielectric window 1002 so that μW glow discharge took place. As a result, forming of the p-type layer on the i-type layer was commenced. When the thickness of the formed p-type layer became 0.005 μm, the μW glow discharged and the output of the DC power source 1011 were stopped. Furthermore, outlet valves 1041, 1042, 1043, 1044, and the sub-valve 1008 were closed so as to stop the gas introduction into the deposition chamber 1001. Thus, forming of the p-type layer was completed.

The conditions for manufacturing the solar cell are summarized in Tables 12, 13, and 14.

The outlet valves 1041 to 1045, except for those for the required gas, must, of course, be completely closed during forming of the respective layers. Furthermore, if necessary, outlet valves 1041 to 1045 are closed, sub-valve 1008 is opened and conductance valve 1007 is completely opened in order to prevent leaving of each gas in the deposition chamber 1001 and the pipes arranged from outlet valves 1041 to 1045 to the deposition chamber 1001 so as to temporarily reduce the pressure levels in the system.

An ITO ($In_2O_3+SnO_2$) layer was, by a conventional method, evaporated as a transparent electrode at a thickness of 0.085 μm of the p-type layer of the solar cell. Furthermore, as a collecting electrode, Al was evaporated to a thickness of 2 μm by a conventional method so that the solar cell was completed. By performing a similar operation, two solar cells were manufactured (solar cell Example 1).

COMPARISON EXAMPLE 1

The substrate 1004 was heated to 350° C. and a silver thin film was formed on the surface of the substrate 1004 by sputtering to a thickness of 0.45 μm, and a ZnO thin film was evaporated thereon to a thickness of 2 μm so that a lower electrode was formed. Then, the n-type layer, the i-type layer, the p-type layer, the transparent electrode, and the collecting electrode were formed under the same conditions as Example 1 except that the diamond layer was not formed according to Comparison Example 1. Two such solar cells were manufactured (solar cell Comparison Example 1).

The initial characteristics, the thermal deterioration characteristics, and the stress deterioration characteristics of the solar cells manufactured in Example 1 (solar cell Example 1) and Comparison Example 1 (solar cell Comparison Example 1) were evaluated.

The initial characteristics of the two solar cells manufactured according to Example 1 (solar cell Example 1) and those of the two solar cells manufactured according to Comparison Example 1 (solar cell Comparison Example 1) were evaluated in such a manner that they were exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which as 1.2 times that of the efficiency of Comparison Example 1 (solar cell Comparison Example 1).

The thermal deterioration characteristics were evaluated in such a manner that each of the solar cells manufactured according to Example 1 (solar cell Example 1) and Comparison Example 1 (solar cell Comparison Example 1) were subjected 10 times to the following process in which each solar cell was placed in a constant temperature drier (DV-41 manufactured by Yamato) set at 100° C. for 1 hour before it was placed in a refrigerator (R-107W manufactured by Hitachi) set at 5° C. for 1 hour and, similarly to the evaluation of the initial characteristics, it was exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which was 1.4 times that of the efficiency of Comparison Example 1 (solar cell Comparison Example 1).

The stress deterioration characteristics were evaluated in such a manner that each of the solar cells according to Example 1 (solar cell Example 1) and Comparison Example 1 (solar cell Comparison Example 1) which were not subjected to the thermal deterioration evaluation, was subjected 50 times to the following process in which it was bent at a curvature radius of 54 mm while making the stainless substrate face inside before it was restored to a planar shape. Then, similarly to the evaluation of the initial characteristics, it was exposed to light of AM-1.5 (100 mW/cm$^2$) to measure the photoelectrical conversion efficiency. As a result of the evaluation of the characteristics, the solar cell according to Example 1 (solar cell Example 1) displayed a photoelectrical conversion efficiency which was 1.35 times that of the efficiency of Comparison Example 1 (solar cell Comparison Example 1).

Furthermore, the diamond layer, having a thickness of 1 μm, was formed on the stainless substrate under the same forming conditions as Example 1 so that a sample was manufactured, the crystallinity of which was to be analyzed. Then, the crystallinity of the diamond layer was evaluated by using an X-ray diffraction apparatus (RAD-3b manufactured by Rigaku Electronic). As a result, sharp diffraction lines were observed at positions 43.9° and 75.4° corresponding to the diffraction lines of (111) and (220) planes of the cubic crystal of diamond, from which it was determined that diamond crystals were formed. Furthermore, the surface roughness of the sample, whose crystallinity was analyzed, was measured by using a surface roughness gauge (SE-30D manufactured by Kosaka Laboratory). As a result, Rz (average roughness of 10 points) was 0.2 μm.

Furthermore, an i-type layer having a thickness of 0.1 μm and a p-type layer having at thickness of 0.005 μm were formed on the stainless substrate under the same forming conditions as Example 1 so that a sample, the crystallinity of which was to be analyzed, was manufactured. Then, the crystallinity of the p-type layer was evaluated by using RHEED (JEM-100SX manufactured by Nihon Electronic). As a result, an annular amorphous (microcrystals included) structure was observed.

EXAMPLE 2 AND CONVENTIONAL EXAMPLE 2

Two solar cells (solar cell Examples 2-1 to 3 and solar cell Comparison Examples 2-1 to 2) were manufactured for each of Example 2 and Comparison Example 2 under the same forming conditions as Example 1, except for the flow rate of the CH$_4$ gas at the time of forming the diamond layer as shown in Table 4. Further, similarly to Example 1, a diamond layer having a thickness of 1 μm was formed on the stainless substrate under the forming conditions shown in Table 4 so that a sample, the crystallinity of which was to be analyzed, was manufactured.

The solar cells and the samples, the crystallinity of which were analyzed according to Example 2 (solar cell Examples 2-1 to 3) and Comparison Example 2 (solar cell Comparison Examples 2-1 to 2), were subjected to evaluation of the characteristics by the same method as Example 1.

Figure 9:
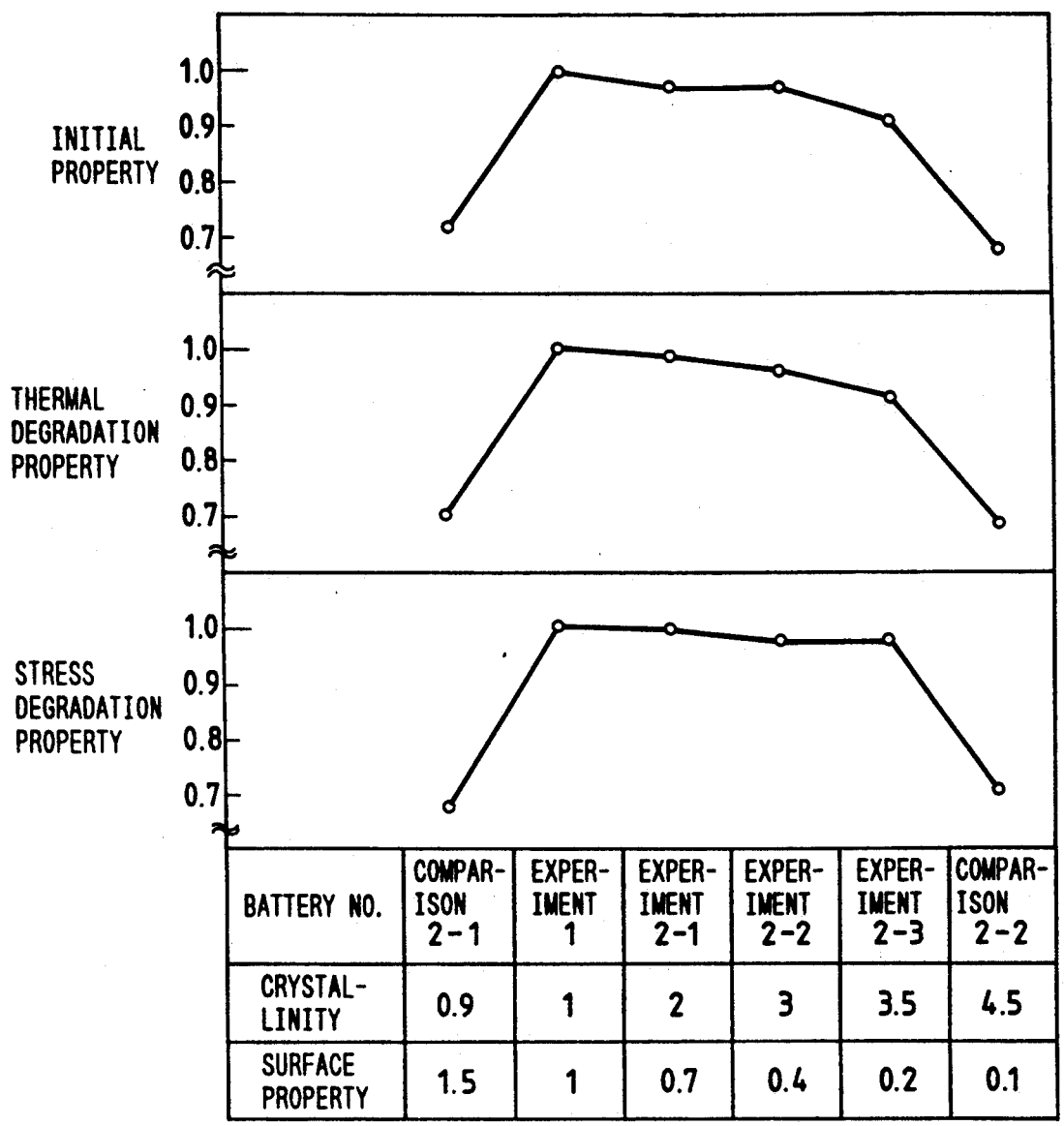
FIG. 9 shows the relation between crystallinity and surface property, and an initial property, thermal, and stress degenerations of a diamond layer according to embodiment II of the present invention.

The initial characteristics, the thermal deterioration characteristics, and the stress deterioration characteristics of the solar cells and the crystallinity and the surface characteristics of the diamond layer are shown in FIG. 9. The crystallinity was evaluated by the X-ray diffraction in such a manner that the half value width of the diffraction line at a position of 43.9° corresponds to the diffraction line of the (111) plane of the cubic crystal of diamond. As can be understood from FIG. 9, the solar cells according to the present invention (solar cell Examples 1 and Example 2-1 to 3) displayed characteristics superior to those of the solar cells according to the comparison examples (solar cell Comparison Examples 2-1 to 2). As a result, a beneficial effect of the present invention was confirmed.

EXAMPLE 3 AND COMPARISON EXAMPLE 3

Two solar cells (solar cell Example 3-1 to 3 and solar cell Comparison Examples 3-1 to 2) were manufactured for each of Example 3 and Comparative Example 3 under the same forming conditions as those for Example 1 except for the flow rate of the PH$_3$/H$_2$ gas at the time of forming the diamond layer as shown in Table 5. Further, similarly to Example 1, the diamond layer having a thickness of 1 μm was formed on the stainless substrate under the forming conditions shown in Table 7 so that a sample, the conductance of which was to be analyzed, was manufactured.

The solar cells according to Example 3 (solar cell Examples 3-1 to 3) and Comparison Example 3 (solar cell Comparison Examples 3-1 to 2) were subjected to evaluation of the characteristics by the same method as that for Example 1.

Each of the samples, the conductance of which were to be analyzed according to Example 3 (solar cell Examples 3-1 to 3) and Comparison Example 3 (solar cell Comparison Examples 3-1 to 2), were subjected to the following process wherein a chrome electrode, the diameter of which was 2 mm and the thickness of which is 0.1 μm, was formed by evaporation on the surface of the diamond layer. Then, the samples were disposed in a dark portion before voltage V was applied to a position between the chrome electrode and the stainless substrate by using a pA meter (4140B manufactured by Yokokawa Hewlett Packard) to measure the electric current I passing between the two electrodes described above. Then, dark conductance δd was obtained in accordance with the following equation by using film thickness D of the diamond layer:

$$\delta d \ (S/cm) = \frac{I(A) \times D(cm)}{0.0314 \times V(V)}$$

Also, the sample (solar cell Example 1), the crystallinity of which was to be analyzed and manufactured in accordance with Example 1, was subjected to the process of obtaining the dark conductance δd in a similar method.

Figure 10:
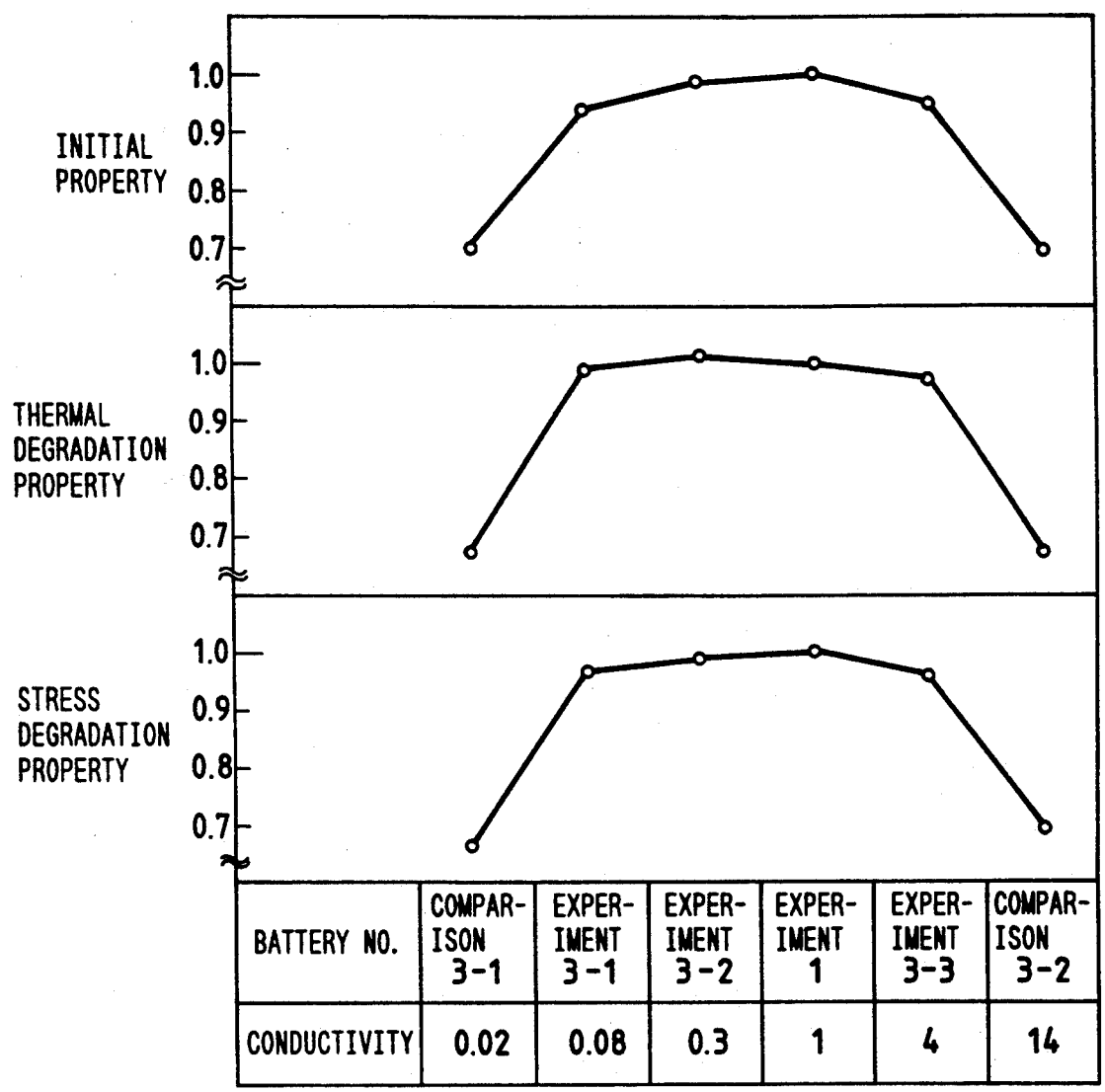
FIG. 10 shows the relation between dark conductivity, and the initial property, and the thermal, and stress degenerations of the diamond layer of the present invention.

The initial characteristics, the thermal deterioration characteristics, the stress deterioration characteristics of the solar cells, and the dark conductance of the diamond layer are shown in FIG. 10. As can be understood from FIG. 10, the solar cells according to the present invention (solar cell Example 1 and Examples 3-1 to 3) displayed characteristics superior to those of the solar cells according to the comparison examples (solar cell Comparison Examples 3-1 to 2). As a result, a beneficial effect of the present invention was confirmed.

EXAMPLE 4 AND COMPARISON EXAMPLE 4

Two solar cells (solar cell Examples 4-1 to 3 and solar cell Comparison Examples 4-1 to 2) were manufactured for each of Example 4 and Comparison Example 4 under the same forming conditions as those for Example 1 except for using $B_2H_6/H_2$ gas in place of $PH_3/H_2$ gas and setting the flow rate of the $B_2H_6/H_2$ gas at the time of forming the diamond layer as shown in Table 6. Further, similarly to Example 3, the diamond layer, having a thickness of 1 μm, was formed on the stainless substrate under the forming conditions shown in Table 9 so that a sample, the conductance of which was to be analyzed, was manufactured.

The solar cells according to Example 4 (solar cell Examples 4-1 to 3) and Comparison Example 4 (solar cell Comparison Examples 4-1 to 2) were subjected to evaluation of the characteristics by the same method as that for Example 1. Each of the samples, the conductance of which was to be analyzed according to Example 4 (solar cell Examples 4-1 to 3) and Comparison Example 4 (solar cell Comparison Examples 4-1 to 2), were subjected to the process in which dark conductance δd was obtained by the method similar to that of Example 3.

Figure 11:
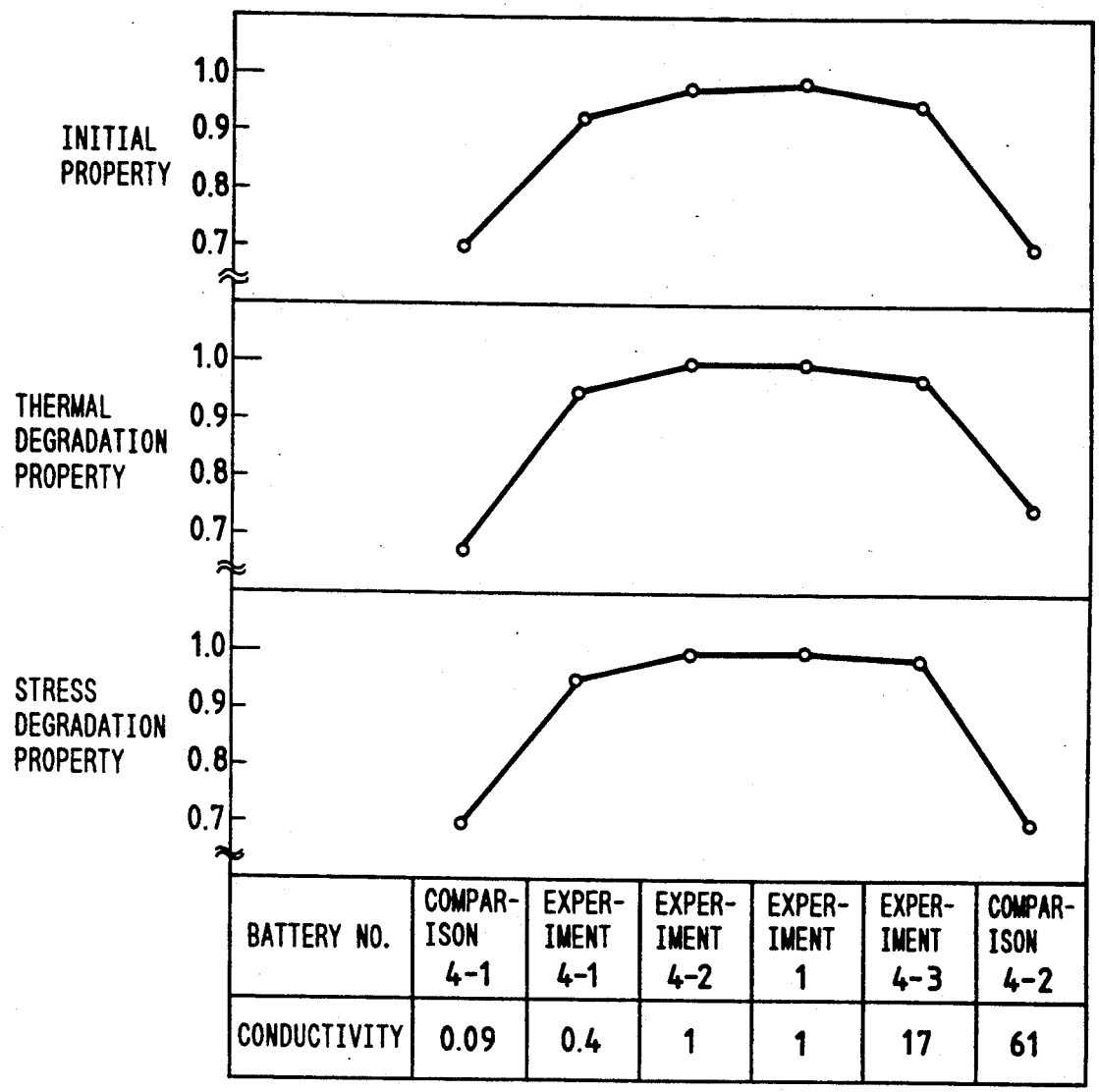
FIG. 11 shows the relation between dark conductivity, and the initial property, and the thermal, and stress degenerations of the diamond layer of the present invention.

The initial characteristics, the thermal deterioration characteristics, the stress deterioration characteristics of the solar cells, and the dark conductance of the diamond layer are shown in FIG. 11. As can be understood from FIG. 11, the solar cells according to the present invention (solar cell Examples 4-1 to 3) displayed characteristics superior to those of the solar cells according to the comparison examples (solar cell Comparison Examples 4-1 to 2). As a result, a beneficial effect of the present invention was confirmed.

EXAMPLE 5 AND COMPARISON EXAMPLE 5

Two solar cells (solar cell Examples 5-1 to 3 and solar cell Comparison Examples 5-1 to 2) were manufactured for each of Example 5 and Comparison Example 5 under the same forming conditions as those for Example 1 except for the thickness of the diamond layer at the time of forming the diamond layer as shown in FIG. 7. Further, similarly to Example 1, the solar cells were subjected to evaluation of the characteristics by the same method as that for Example 1.

Figure 12:
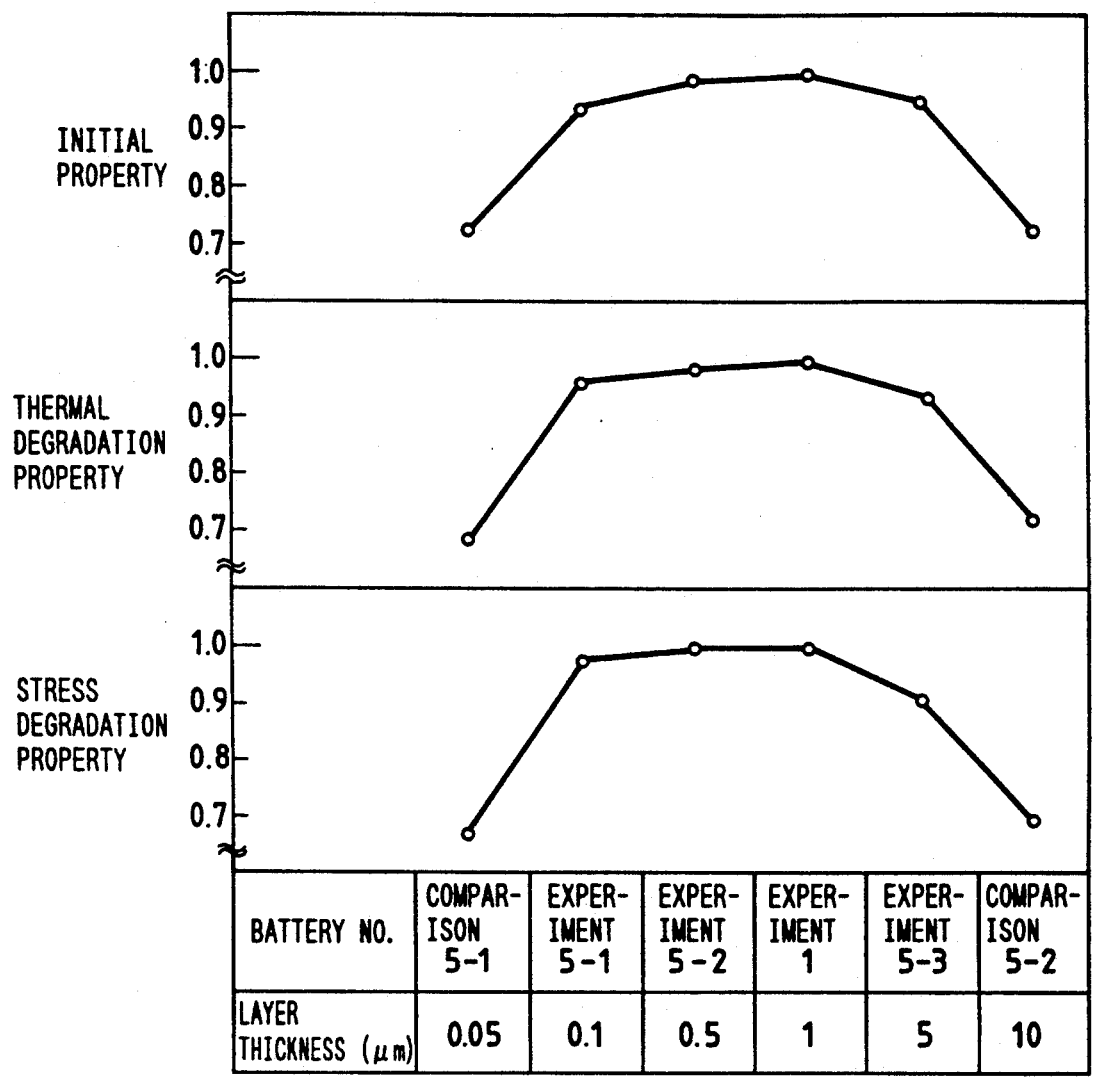
FIG. 12 shows the relation between thickness of the diamond layer, and the initial property, and the thermal, and stress degenerations of the diamond layer of the present invention.
Figure 13:
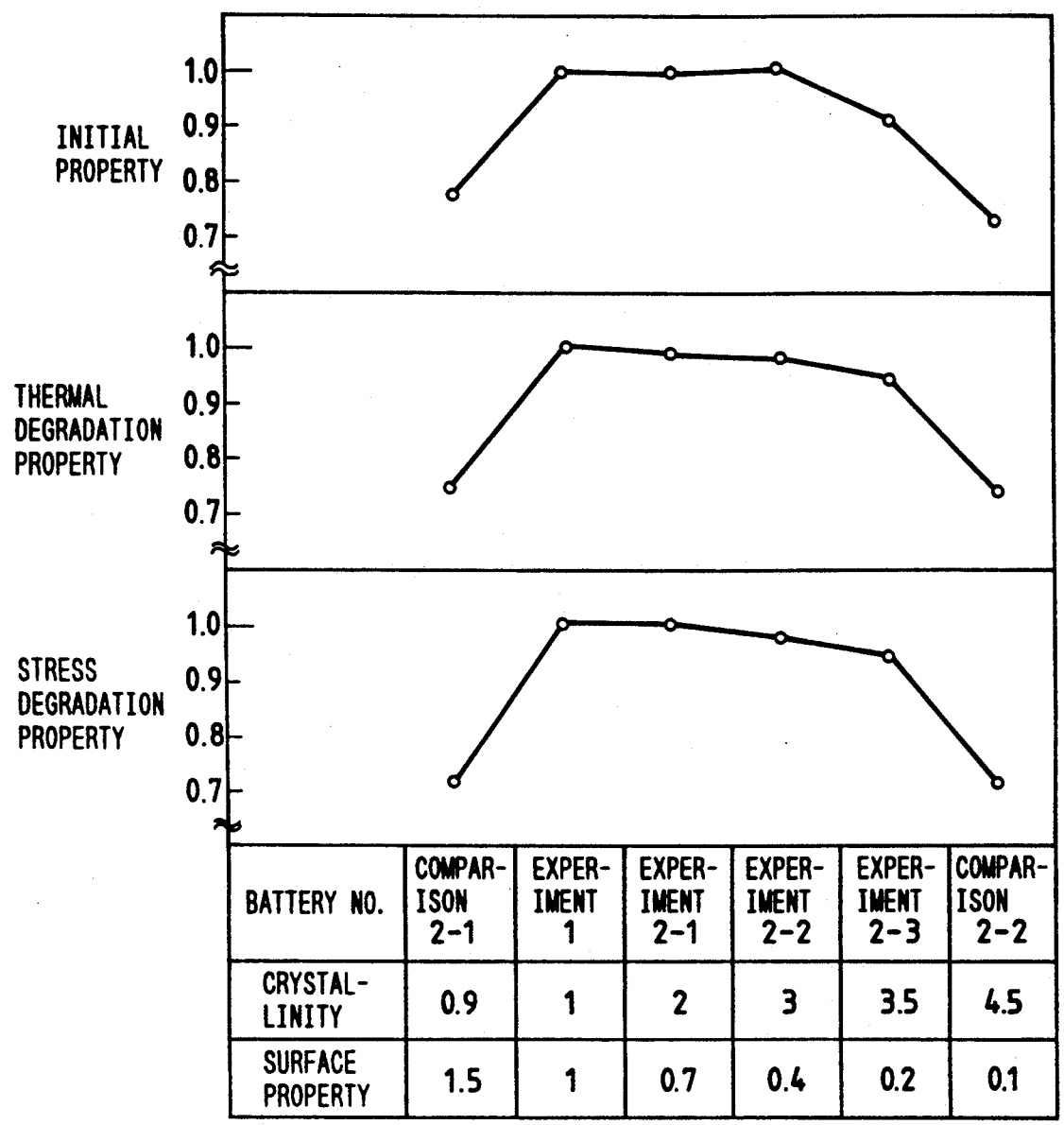
FIG. 13 shows the relation between crystallinity and surface property, and an initial property, thermal, and stress degenerations of a diamond layer according to embodiment III of the present invention.

The initial characteristics, the thermal deterioration characteristics, the stress deterioration characteristics of the solar cells, and the dark conductance of the diamond layer are shown in FIG. 12. As can be understood from FIG. 12, the solar cells according to the present invention (solar cell Example 1 and Examples 5-1 to 3) displayed characteristics superior to those of the solar cells according to the comparison examples (solar cell Comparison Examples 5-1 to 2). As a result, a beneficial effect of the present invention was confirmed.

EMBODIMENT 2-1

Two solar cells were manufactured under the same forming conditions as those for Example 1 whereby a solar cell module and a charger, the circuit of which was structured as shown in FIG. 8, were manufactured.

COMPARISON EMBODIMENT 1

Two solar cells were manufactured under the same manufacturing conditions as those for Comparison Example 1 to manufacture a charger similar to that of Embodiment 1 by using the solar cells described above.

The chargers according to Embodiment 1 and Comparison Embodiment 1, were disposed outside in the daytime the sky was clear. Then, electric power generated in the solar cell module 801 was charged to the secondary boundaries 804. Each of the secondary batteries 804 charged by the corresponding chargers according to the Embodiment 1 and Comparison Embodiment 1, were loaded in a flash lamp (K-67 manufactured by Toshiba) to power the flash lamp. Then, the secondary batteries 804 were again charged by using the corresponding chargers according to Embodiment 1 and Comparison Embodiment 1. The process described above was repeated. As a result, the charger according to Embodiment 1 was able to power the flash lamp for 1.3 times the time in which the charger according to Comparison Example 1 was able to power the same flash lamp. Therefore, a beneficial effect of the present invention was confirmed.

EMBODIMENT 2-2

Two solar cells were manufactured under the same conditions as those for Example 1 except for the conditions as shown in FIGS. 11 and 12 for forming the diamond layer, the n-type layer, the i-type layer, and the p-type layer. Then, a charger similar to Embodiment 1 was used similarly to Embodiment 1. As a result, it was able to power the flash lamp for substantially the same time as that realized by Embodiment 1. Therefore, a beneficial effect of the solar cell according to the present invention was confirmed.

Furthermore, the diamond layer, the thickness of which was 1 μm, was formed before the n-type layer was formed to a thickness of 0.01 μm on the stainless substrate under the forming conditions as shown in Tables 8 and 9, so that a sample, the crystallinity of which was to be analyzed, was manufactured. Then, the crystallinity of the n-type layer was evaluated similarly to Example 1. As a result, annular amorphous (microcrystals included) characteristics were observed.

Then, an i-type layer having a thickness of 0.1 μm and a p-type layer having a thickness of 0.005 μm were formed on the stainless substrate under the forming conditions shown in Tables 14 and 15 so that a sample, the crystallinity of which was to be analyzed, was manufactured. Then the crystallinity of the p-type layer was evaluated similarly to Example 1. As a result, annular amorphous (microcrystals included) characteristics were observed).

EMBODIMENT 3

Two solar cells were manufactured under the same conditions as those for Example 1 except for the conditions as sown in Tables 10 and 11 for forming the diamond layer, the n-type layer, the i-type layer, and the p-type layer. Then, a charger similar to Embodiment 1 was used similarly to Embodiment 1. As a result, it was able to power the flash lamp for a time which is substantially the same time as that realized by Embodiment 1. Therefore, a beneficial effect of the solar cell according to the present invention was confirmed.

Then, an i-type layer having a thickness of 0.1 μm and an n-type layer having a thickness of 0.005 μm were formed on the stainless substrate under the forming conditions as shown in Table 7 so that a sample, the crystallinity of which was to be analyzed, was manufactured. Then, the crystallinity of the n-type layer was evaluated similarly to Example 1. As a result, annular amorphous (microcrystals included) characteristics were observed.

In the apparatus shown in FIG. 3, the gas tanks 1071 to 1076 respectively are filled with a variety of the raw material gases for forming the layers of the solar cell according to the present invention. The tank 1071 is filled with $SiH_4$ gas (purity: 99.99%), the tank 1072 is filled with $H_2$ gas (purity: 99.9999%), the tank 1073 is filled with $CH_4$ gas (purity: 99.999%), the tank 1074 is filled with $B_2H_6$ gas (purity: 99.999% and hereinafter abbreviated to "$B_2H_6/H_2$") diluted to 10% by $H_2$ gas, the tank 1075 is filled with $PH_3$ gas (purity: 99.999% and hereinafter abbreviated to "$PH_3/H_2$") diluted to 10% by $H_2$ gas and a tank 1076 is filled with $GeH_4$ was (purity: 99.999%). At the time of attaching the gas tanks 1071 to 1076, the above-described gases have been previously introduced into the gas pipes of the introduction valves 1031 to 1036 through valves 1051 to 1056.

Reference numeral 1004 represents a 100 mm×100 mm substrate, the thickness of which is 0.25 mm and which is made of stainless steel (SUS430BA), and the surface of which is formed into a mirror surface.

First, the valves 1051 to 1056 were opened to introduce $SiH_4$ gas from the gas tank 1071, $H_2$ gas from the gas tank 1072, $CH_4$ gas from the gas tank 1073, $B_2H_6/H_2$ gas from the gas tank 1074, $PH_3/H_2$ gas from the gas tank 1075, and $GeH_4$ gas from the gas tank 1076 before the gas pressure of each was adjusted to 2 kg/cm² by using the pressure regulators 1061 to 1066.

Then, closure of the introduction valves 1031 to 1036 and the leak valve 1009 of the deposition chamber 1001 was confirmed. Further, opening of the outlet valves 1041 to 1046 and the sub-valve 1008 was confirmed before the conductance (a butterfly type) valve 1007 was fully opened so as to, by means of a vacuum pump (omitted from illustration), exhaust the deposition chamber 1001 and the gas pipes. Then, when a value of about $1 \times 10^{-4}$ Torr was read at the vacuum gauge 1006, the sub-valve 1008 and the outlet valves 1041 to 1046 were closed.

Then, the introduction valves 1031 to 1036 were gradually opened to introduce the above-described gases into the mass-flow controllers 1021 to 1026.

After the preparation for forming the films had been thus completed, the diamond layer, the n-type layer, the i-type layer, and the p-type layer were formed on the substrate 1004.

The diamond layer was formed in such a manner that the substrate 1004 was heated to 400° C. by the heater 1005 and the outlet valves 1042, 1043, 1045, and the sub-valve 1008 were gradually opened to introduce $H_2$ gas, $CH_4$ gas, and $PH_3/H_2$ gas into the deposition chamber 1001 via the gas introduction pipe 1003. At this time, the corresponding mass-flow controllers 1022, 1023 and 1025 were used to adjust the flow rate of the $H_2$ gas to 500 sccm, that of the $CH_4$ gas to 5 sccm and that of the $PH_3/H_2$ gas to 2.5 sccm. The pressure in the deposition chamber 1001 was set at 20 mTorr by adjusting the opening of the conductance valve 1007 while observing the vacuum gauge 1006. Then, a DC bias of $-100$ v with respect to the deposition chamber 1001 was applied from the DC power source 1011 to the substrate 1004. The electric power of the μW power source (omitted from illustration) was set at 0.5 W/cm³ so as to introduce microwaves into the deposition chamber 1001 via a waveguide pipe (omitted from illustration), the waveguide portion 1010, and the dielectric window 1002 so that μW glow discharge took place. As a result, forming of the diamond layer on the substrate 1004 was commenced. When the thickness of the formed diamond layer became 1 μm, the μW glow discharge was stopped and the output of the DC power source 1011 was also terminated. Further, the outlet valves 1042, 1043, 1045, and the sub-valve 1008 were closed so as to stop the gas introduction into the deposition chamber 1001. Thus, forming of the diamond layer was completed.

The n-type layer was formed in such a manner that the substrate 1004 was heated to 280° C. by the heater 1005 and the outlet valves 1041, 1042, 1045 and the sub-valve 1008 were gradually opened to introduce $SiH_4$ gas, $H_2$ gas, and $PH_3/H_2$ gas into the deposition chamber 1001 via the gas introduction pipe 1003. At this time, the corresponding mass-flow controllers 1021, 1022, and 1025 were used to adjust the flow rate of the $SiH_4$ gas to 5 sccm, that of the $H_2$ gas to 5 sccm, and that of the $PH_3/H_2$ gas to 5 sccm. The pressure in the deposition chamber 1001 was set at 10 mTorr by adjusting the opening of the conductance valve 1007 while observing the vacuum gauge 1006. Then, a DC bias of $-50$ v with respect to the deposition chamber 1001 was applied from the DC power source 1011 to the substrate 1004. The electric power of the μW power source (omitted from illustration) was set at 0.02 W/cm³ so as to introduce microwaves into the deposition chamber 1001 via a waveguide pipe (omitted from illustration), the waveguide portion 1010, and the dielectric window 1002 so that μW glow discharge took place. As a result, forming of the n-type layer on the diamond layer was commenced. When the thickness of the formed n-type layer became 0.01 μm, the μW glow discharge was stopped and the output of the DC power source 1011 was also terminated. Further, the outlet valves 1041, 1042, and 1045 and the sub-valve 1008 were closed so as to stop the gas introduction into the deposition chamber 1001. Thus, forming of the n-type layer was completed.

The i-type layer was formed in such a manner that the substrate 1004 was heated to 280° C. by the heater 1005 and the outlet valves 1041, 1042, 1046 and the sub-valve 1008 were gradually opened to introduce SiH₄ gas, H₂ gas, and GeH₄ gas into the deposition chamber 1001 via the gas introduction pipe 1003. At this time, the corresponding mass-flow controllers 1021, 1022, and the 1026 were used to adjust the flow rate of the SiH₄ gas to 40 sccm, that of the H₂ gas to 100 sccm, and that of the GeH₄ gas to 15 sccm. The pressure in the deposition chamber 1001 was set at 10 mTorr by adjusting the opening of the conductance valve 1007 while observing the vacuum gauge 1006. Then, a DC bias of $-40$ v with respect to the deposition chamber 1001 was applied from the DC power source 1011 to the substrate 1004. The electric power of the $\mu$W power (omitted from illustration) was set at 0.15 W/cm³ so as to introduce microwaves into the deposition chamber 1001 via the waveguide pipe (omitted from illustration), the waveguide portion 1010, and the dielectric window 1002 so that $\mu$W glow discharge took place. As a result, forming of the i-type layer on the n-type layer was commenced. When the thickness of the formed i-type layer became 0.3 $\mu$m, the $\mu$W glow discharge was stopped and the output operation of the DC power source 1011 was also terminated. Furthermore, the outlet valves 1041, 1042, 1046, and the sub-valve 1008 were closed to stop the gas introduction into the deposition chamber 1001. Thus, forming of the i-type layer was completed.

The p-type layer was formed in such a manner that the substrate 1004 was heated to 280° C. by the heater 1005 and the outlet valves 1041, 1042, 1044, and the sub-valve 1008 were gradually opened to introduce SiH₄ gas, H₂ gas, and B₂H₆/H₂ gas into the deposition chamber 1001 via the gas introduction pipe 1003. At this time, the corresponding mass-flow controllers 1021, 1022, and 1024 were used to adjust the flow rate of the SiH₄ gas to 5 sccm, that of the H₂ gas to 500 sccm, and that of the B₂H₆/H₂ gas to 5 sccm. The pressure in the deposition chamber 1001 was set at 20 mTorr by adjusting the opening of the conductance valve 1007 while observing the vacuum gauge 1006. Then, a DC bias of $-70$ v with respect to the deposition chamber 1001 was applied from the DC power source 1011 to the substrate 1004. The electric power of the $\mu$W power source (omitted from illustration) was set to 0.5 W/cm³ so as to introduce microwaves into the deposition chamber 1001 via a waveguide pipe (omitted from illustration), the waveguide portion 1010 and the dielectric window 1002 so that $\mu$W glow discharge took place. As a result, forming of the p-type layer on the i-type layer was commenced. When the thickness of the formed p-type layer became 0.005 $\mu$m, the $\mu$W glow discharge was stopped and the output of the DC power source 1011 was also terminated. Furthermore the outlet valves 1041, 1042, 1044, and the sub-valve 1008 were closed so as to stop the gas introduction into the deposition chamber 1001. Thus, forming of the p-type layer was completed.

The conditions for manufacturing the solar cell are shown in Tables 18, 19 and 3.

The outlet valves 1041 to 1046 except for when supplying the required gas must, of course, be completely closed at the time of forming the respective layers. Furthermore, if necessary, the outlet valves 1041 to 1046 are closed, the sub-valve 1008 is opened, and the conductance valve 1007 is completely opened in order to prevent leaving of each gas in the deposition chamber 1001 and the pipes arranged from the outlet valves 1041 to 1046 to the deposition chamber 1001 so as to temporarily reduce the pressure level in the system.

An ITO (In₂O₃+SnO₂) layer was, by a conventional method, evaporated as a transparent electrode to a thickness of 0.085 $\mu$m on the p-type layer of the solar cell. Further, as a collecting electrode, Al was evaporated to a thickness of 2 $\mu$m by a conventional method so that the solar cell was manufactured. By performing a similar operation, two solar cells were manufactured (solar cell Example 1).

COMPARISON EXAMPLE 1

The substrate 1004 was heated to 350° C. and a silver thin film was formed on the surface of the substrate 1004 by sputtering to a thickness of 0.45 $\mu$m and a ZnO thin film was evaporated thereover to a thickness of 2 $\mu$m so that a lower electrode was formed. Then, the n-type layer, the i-type layer, the p-type layer, the transparent electrode, and the collecting electrode were formed under the same conditions as those for Example 1 except that the diamond layer was not formed according to Comparison Example 1, and two solar cells were manufactured (solar cell Comparison Example 1).

The initial characteristics, the thermal deterioration characteristics, and the stress deterioration characteristics of the solar cells manufactured in Example 1 (solar cell Example 1) and Comparison Example 1 (solar cell Comparison Example 1) were evaluated.

The initial characteristics of the two solar cells manufactured according to Example 1 (solar cell Example 1) and those of the two solar cells manufactured according to Comparison Example 1 (solar cell Comparison Example 1) were evaluated in such a manner that they were exposed to light of AM-1.5 (100 mW/cm²) to measure the photoelectrical conversion efficiency. As a result of the evaluation of the characteristics, the solar cells according to Example 1 (solar cell Example 1) displayed an average photoelectrical conversion efficiency which was 1.2 times the efficiency of Comparison Example 1 (solar cell Comparison Example 1).

The thermal deterioration characteristics were evaluated in such a manner that each of the solar cells manufactured according to Example 1 (solar cell Example 1) and Comparison Example 1 (solar cell Comparison Example 1) were subjected 10 times to the following process in which each solar cell was placed in a constant temperature direr (DV-41 manufactured by Yamato) set at 100° C. for 1 hour before it was placed in a refrigerator (R-107W manufactured by Hitachi) set at 5° C. for 1 hours, and similarly to the evaluation of the initial characteristics, it was exposed to light of AM-1.5 (100 mW/cm²) to measure the photoelectrical conversion efficiency. As a result of the evaluation of the characteristics, the solar cells according to Example 1 (solar cell Example 1) displayed a photoelectrical conversion efficiency which was 1.4 times the efficiency of Comparison Example 1 (solar cell Comparison Example 1).

The stress deterioration characteristics were evaluated in such a manner that each of the solar cells according to Example 1 (solar cell Example 1) and Comparison Example 1 (solar cell Comparison Example 1) which has not been subjected to the thermal deterioration evaluation were subjected 50 times to the following process in which it was bent at a curvature radius of 54 mm while making the stainless substrate face inside before it was restored to a planar shape. Then, similarly to the evaluation of the initial characteristics, it was exposed to light of AM-1.5 (100 mW/cm²) to measure the photoelectrical conversion efficiency. As a result of the evaluation of the characteristics, the solar cell according to Example 1 (solar cell Example 1) displayed a photoelectrical conversion efficiency which was 1.35 times the efficiency of Comparison Example 1 (solar cell Comparison Example 1).

Further, a diamond layer having a thickness of 1 μm was formed on a stainless substrate under the same forming conditions as those for Example 1 so that a sample, the crystallinity of which was to be analyzed, was manufactured. Then, the crystallinity of the diamond layer was evaluated by using an X-ray diffraction apparatus (RAD-3b manufactured by Rigaku Electronic). As a result, sharp diffraction lines were observed at positions 43.9° and 75.4° corresponding to the diffraction lines of the (111) and (220) planes of the cubic system of diamond, from which it was determined that diamond crystals were formed. Further, the surface roughness of the sample, the crystallinity of which was to be analyzed, was measured by using a surface roughness gauge (SE-30D manufactured by Kosaka Laboratory). As a result, Rz (average roughness of 10 points) was 0.2 μm.

Further, an i-type layer having a thickness of 0.1 μm and a p-type layer having a thickness of 0.005 μm were formed on the stainless substrate under the same forming conditions as those according to Example 1 so that a sample, the crystallinity of which was to be analyzed, was manufactured. Then, the crystalllinity of the p-type layer was evaluated by using RHEED (JEM-100SX manufactured by Nihon Electronic). As a result, an annular amorphous (microcrystals included) material was observed.

EXAMPLE 2 AND COMPARISON EXAMPLE 2

Two solar cells (solar cell Examples 2-1 to 3 and solar cell Comparison Examples 2-1 to 2) were manufactured for each of Example 2 and Comparison Example 2 under the same forming conditions as those of Example 1 except for the flow rate of the CH$_4$ gas at the time of forming the diamond layer as shown in Table 4. Furthermore, similarly to Example 1, the diamond layer having a thickness of 1 μm was formed on the stainless substrate under the forming conditions shown in Table 4 so that a sample, the crystallinity of which was to be analyzed, was manufactured.

The solar cells and the samples, the crystallinity of which were to be analyzed according to Example 2 (solar cell Examples 2-1 to 3) and Comparison Example 2 (solar cell Comparison Examples 2-1 to 2), were subjected to evaluation of the characteristics by the same method as that of Example 1.

The initial characteristics, the thermal deterioration characteristics, the stress deterioration characteristics of the solar cells, the crystallinity, and the surface characteristics of the diamond layer are shown in Table 13. The crystallinity was evaluated by the X-ray diffraction in such a manner that the half value width of the diffraction line at a position of 43.9° corresponds to the diffraction line of the (111) plane of the cubic crystal of diamond. As can be understood from Table 13, the solar cells according to the present invention (solar cell Example 1 and Examples 2-1 to 3) displayed characteristics superior to those of the solar cells according to the comparison examples (solar cell Comparison Examples 2-1 to 2). As a result, a beneficial effect of the present invention was confirmed.

EXAMPLE 3 AND COMPARISON EXAMPLE 3

Two solar cells (solar cell Examples 3-1 to 3 and solar cell Comparison Examples 3-1 to 2) were manufactured for each of Example 3 and Comparison Example 3 under the same forming conditions as those for Example 1 except for the flow rate of the PH$_3$/H$_2$ gas at the time of forming the diamond layer as shown in Table 5. Further, similarly to Example 1, a diamond layer having a thickness of 1 μm was formed on the stainless substrate under the forming conditions shown in Table 4 so that a sample, the conductance of which was to be analyzed, was manufactured.

The solar cells according to Example 3 (solar cell Examples 3-1 to 3) and Comparison Example 3 (solar cell Comparison Examples 3-1 to 2) were subjected to evaluation of the characteristics by the same method as that according to Example 1.

Each of the samples, the conductance of which was to be analyzed according to Example 3 (solar cell Examples 3-1 to 3) and Comparison Example 3 (solar cell Comparison Examples 3-1 to 2), were subjected to the following process wherein a chrome electrode the diameter of which was 2 mm and the thickness of which was 0.1 μm was formed by evaporating chrome (Cr) on the surface of the diamond layer. Then, the samples were disposed in a dark portion before voltage V was added to a position between the chrome electrode and the stainless substrate by using a pA meter (4140B manufactured by Yokokawa Hewlett Packard) to measure electric current I passing between the above-described two electrodes. Then, dark conductance δd was obtained in accordance with the following equation by using film thickness D of the diamond layer:

$$\delta d \ (S/cm) = \frac{I\,(A) \times D\,(cm)}{0.0314 \times V\,(V)}$$

Also, the sample (solar cell Example 1), the crystallinity of which was to be analyzed and manufactured in accordance with Example 1, was subjected to the process of obtaining dark conductance δd in a similar method.

Figure 14:
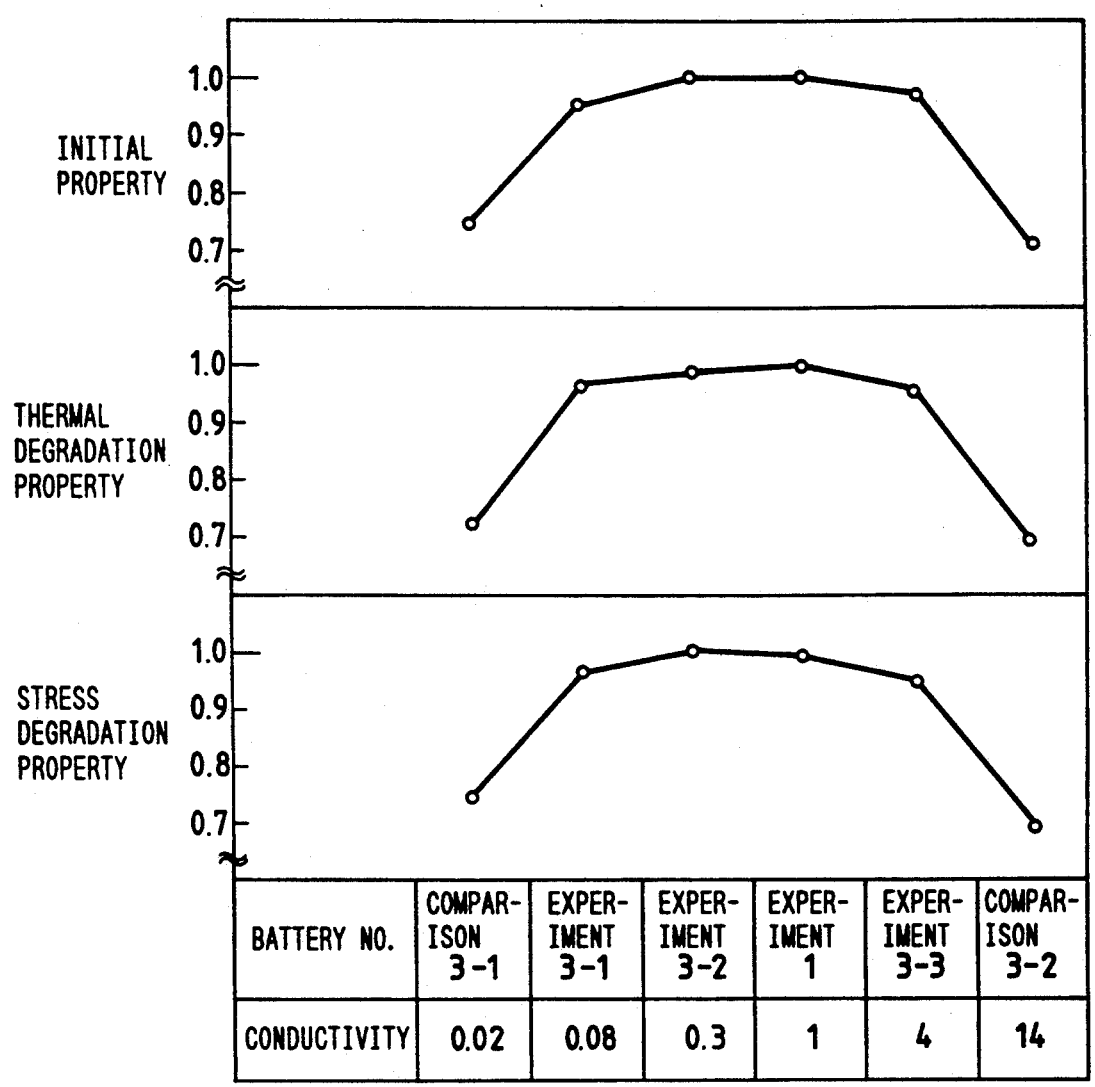
FIG. 14 shows the relation between dark conductivity, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 14. As can be understood from FIG. 14, the solar cells according to the present invention (solar cell Examples 1 and Examples 3-1 to 3) displayed characteristics superior to those of the solar cells according to the comparison examples (solar cell Comparison Examples 3-1 to 2). As a result, a beneficial effect of the present invention was confirmed.

EXAMPLE 4 AND COMPARISON EXAMPLE 4

Two solar cells (solar cell Examples 4-1 to 3 and solar cell Comparison Examples 4-1 to 2) were manufactured for each of Example 4 and Comparison Example 4 under the same forming conditions as those for Example 1 except for using B$_2$H$_6$/H$_2$ gas in place of PH$_3$/H$_2$ gas and the flow rate of the B$_2$H$_6$/H$_2$ gas at the time of forming the diamond layer as shown in Table 6. Further, similarly to Example 3, a diamond layer having a thickness of 1 μm was formed on the stainless substrate under the forming conditions shown in Table 7 so that a sample, the conductance of which was to be analyzed, was manufactured.

The solar cells according to Example 4 (solar cell Examples 4-1 to 3) and Comparison Example 4 (solar cell Comparison Examples 4-1 to 2) were subjected to evaluation of the characteristics by the same method as that of Example 1. Each of the samples were subjected to the process in which dark conductance δd was obtained by a method similar to that of Example 3.

Figure 15:
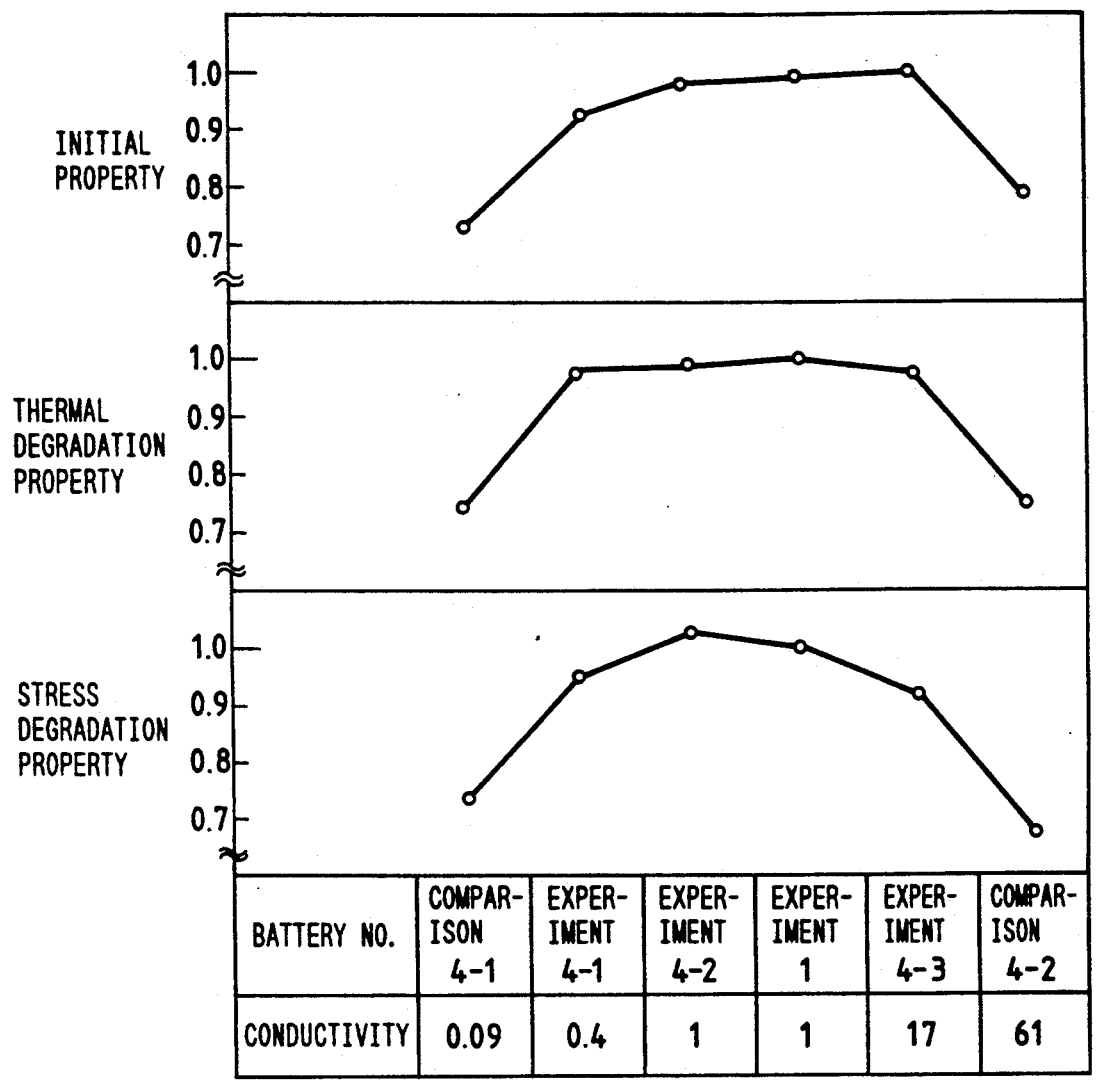
FIG. 15 shows the relation between dark conductivity, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 15. As can be understood from FIG. 15, the solar cells according to the present invention (solar cell Examples 4-1 to 3) displayed characteristics superior to those of the solar cells according to comparison examples (solar cell Comparison Examples 4-1 to 2). As a result, a beneficial effect of the present invention was confirmed.

EXAMPLE 5 AND COMPARISON EXAMPLE 5

Two solar cells (solar cell Examples 5-1 to 3 and solar cell Comparison Examples 5-1 to 2) were manufactured for each of Example 5 and Comparison Example 5 under the same forming conditions as Example 1 except for the thickness of the diamond layer at the time of forming the diamond layer as shown in FIG. 7. Further, similarly to Example 1, the solar cells were subjected to evaluation of the characteristics by the same method as Example 1.

Figure 16:
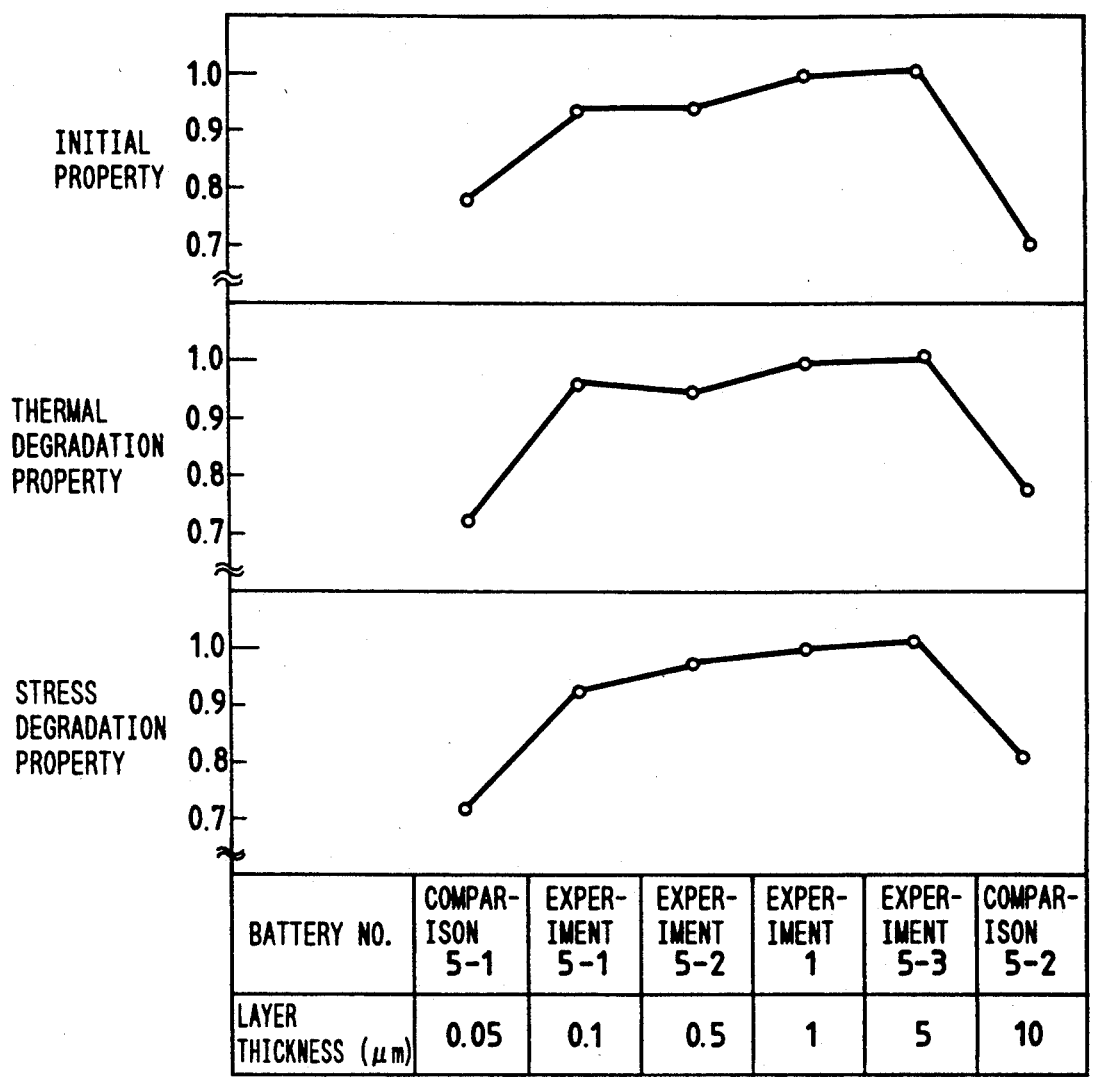
FIG. 16 shows the relation between thickness of the diamond layer, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 16. As can be understood from FIG. 16, the solar cells according to the present invention (solar cell Example 1 and Examples 5-1 to 3) displayed characteristics superior to those of the solar cells according to the comparison examples (solar cell Comparison Examples 5-1 to 2). As a result, a beneficial effect of the present invention was confirmed.

EMBODIMENT 3-1

Two solar cells were manufactured under the same forming conditions as those for Example 1 so that a solar cell module and a charger, the circuit of which was structured as shown in FIG. 8, were manufactured.

COMPARISON EMBODIMENT 3-1

Two solar cells (Comparison Embodiment 3-1) were manufactured under the same manufacturing conditions as those according to Example 3-1 to manufacture a charger similar to that according to Embodiment 3-1.

The chargers respectively according to Embodiment 3-1 and Comparison Embodiment 3-1 were disposed outside in the daytime when the sky was clear. Then, electric power generated in the solar cell module 801 was charged to the secondary battery 804. Each of the secondary batteries 804 charged by the corresponding chargers according to Embodiment 1 and Comparison Embodiment 1 was loaded in a flash lamp (K-67 manufactured by Toshiba) to power the flash lamp. Then, the secondary batteries 804 were again charged by using the corresponding chargers according to Embodiment 3-1 and Comparison Embodiment 3-1. The above-described process was repeated. As a result, the charger according to Embodiment 1 was able to power the flash lamp for a period which was 1.3 times longer than the time in which the charger according to Comparison Example 3-1 was able to power the same flash lamp. Therefore, a beneficial effect of the present invention was confirmed.

EMBODIMENT 3-2

Two solar cells were manufactured under the same conditions as those according to Example 3-1 except for the conditions as shown in Tables 20 and 21 for forming the diamond layer, the n-type layer, the i-type layer, and the p-type layer. Then, a charger similar to Embodiment 3-1 was used similarly to Embodiment 1. As a result, it was able to power the flash lamp for a period which was substantially the same time as that realized by Embodiment 1. Therefore a beneficial effect of the solar cell according to the present invention was confirmed.

Further, a diamond layer of 1 μm thickness was formed prior to forming the n-type layer which was formed to a thickness of 0.1 μm on the stainless substrate under the forming conditions as shown in Table 6 so that a sample, the crystallinity of which was to be analyzed, was manufactured. The crystallinity of the n-type layer was evaluated similarly to Example 1. As a result, annular amorphous (microcrystals included) characteristics were observed.

Then, an i-type layer having a thickness of 0.1 μm and a p-type layer having a thickness of 0.005 μm were formed on the stainless substrate under the forming conditions as shown in Tables 20 and 21 so that a sample, the crystallinity of which was to be analyzed, was manufactured. The crystallinity of the p-type layer was evaluated similarly to Example 1. As a result, annular amorphous (microcrystals included) characteristics were observed.

EMBODIMENT 3

Two solar cells were manufactured under the same conditions as those according to Example 1 except for the conditions as shown in Tables 20 and 21 for forming the diamond layer, the n-type layer, the i-type layer, and the p-type layer. Then, a charger similar to Embodiment 1 was used similarly to Embodiment 1. As a result, it was able to power the flash lamp for a period which was substantially the same as that realized by Embodiment 1. Therefore, a beneficial effect of the solar cell according to the present invention was confirmed.

Then, an i-type layer having a thickness of 0.1 μm and an n-type layer having a thickness of 0.005 μm were formed on the stainless substrate under the forming conditions as shown in Tables 22 and 23 so that a sample, the crystallinity of which was to be analyzed, was manufactured. The crystallinity of the n-type layer was evaluated similarly to Example 1. As a result, annular amorphous (microcrystals included) characteristics were observed.

EXAMPLE 4-1

FIG. 3 illustrates an apparatus for manufacturing a solar cell by a μW glow discharge method and comprising the raw material gas supplying device 1020 and the deposition device 1000.

In the apparatus shown in FIG. 3, the gas tanks 1071 and 1076 respectively are filled with a variety of the raw material gases for forming the layers of the solar cell according to the present invention. The tank 1071 is filled with $SiH_4$ gas (purity: 99.99%), the tank 1072 is filled with $H_2$ gas (purity: 99.9999%), the tank 1073 is filled with $CH_4$ gas (purity: 99.999%), the tank 1074 is filled with $B_2H_6$ gas (purity: 99.999% and hereinafter abbreviated to "$B_2H_6/H_2$") diluted to 10% by $H_2$ gas, the tank 1075 is filled with $PH_3$ gas (purity: 99.999% and hereinafter abbreviated to "$PH_3/H_2$") diluted to 10% by $H_2$ gas, and a tank 1076 is filled with $GeH_4$ gas (purity: 99.999%). At the time of attaching the gas tanks 1071 to 1076, the above-described gases have been previously introduced into the gas pipes of the introduction valves 1031 to 1036 through valves 1051 to 1056.

Reference numeral 1004 represents 100 mm × 100 mm substrate, the thickness of which is 0.25 mm and which is made of stainless steel (SUS430BA), the surface of which is formed into a mirror surface.

First, the valves 1051 to 1056 were opened to introduce $SiH_4$ gas from the gas tank 1071, $H_2$ gas from the gas tank 1072, $CH_4$ gas from the gas tank 1073, $B_2H_6/H_2$ gas from the gas tank 1074, $PH_3/H_2$ gas from the gas tank 1075, and $GeH_4$ gas from the gas tank 1076 before the gas pressure of each was adjusted to 2 $kg/cm^2$ by using the pressure regulators 1061 to 1066.

Then, closure of the introduction valves 1031 to 1036 and the leak valve 1009 of the deposition chamber 1001 was confirmed. Further, opening of the outlet valves 1041 to 1046, and the sub-valve 1008 was confirmed before the conductance (a butterfly type) valve 1007 was fully opened so as to, by a vacuum pump (omitted from illustration), exhaust the deposition chamber 1001 and the gas pipe. Then, when a value of about $1 \times 10^{-4}$ Torr was read at the vacuum gauge 1006, the sub-valve 1008 and the outlet valves 1041 to 1046 were closed.

Then, the introduction valves 1031 to 1036 were gradually opened to introduce the above-described gases into the mass-flow controllers 1021 to 1026.

After the preparation for forming the films had been thus completed, the diamond layer, the n-type layer, the i-type layer, and the p-type layer were formed on the substrate 1004.

The diamond layer was formed in such a manner that the substrate 1004 was heated to 400° C. by the heater 1005 and the outlet valves 1042, 1043, 1045, and the sub-valve 1008 were gradually opened to introduce $H_2$ gas, $CH_4$ gas, and $PH_3/H_2$ gas into the deposition chamber 1001 via the gas introduction pipe 1003. At this time, the corresponding mass-flow controllers 1022, 1023, and 1025 were used to adjust the flow rate of the $H_2$ gas to 500 sccm, that of the $CH_4$ to 5 sccm, and that of the $PH_3/H_2$ gas to 2.5 sccm. The pressure in the deposition chamber 1001 was set at 20 mTorr by adjusting the opening of the conductance valve 1007 while observing the vacuum gauge 1006. Then, a DC bias of $-100$ v with respect to the deposition chamber 1001 was applied from the DC power source 1011 to the substrate 1004. The electric power of the $\mu W$ power source (omitted from illustration) was set to 0.5 $W/cm^3$ so as to introduce microwaves into the deposition chamber 1001 via a waveguide pipe (omitted from illustration), the waveguide portion 1010 and the dielectric window 1002 so that $\mu W$ glow discharge took place. As a result, forming of the diamond layer on the substrate 1004 was commenced. When the thickness of the formed diamond layer became 1 $\mu m$, the $\mu W$ glow discharge was stopped and the output of the DC power source 1011 was also terminated. Further, the outlet valves 1042, 1043, 1045, and the sub-valve 1008 were closed so as to stop the gas introduction into the deposition chamber 1001. Thus, forming of the diamond layer was completed.

The n-type layer was formed in such a manner that the substrate 1004 was heated to 280° C. by the heater 1005 and the outlet valves 1041, 1042, 1045 and the sub-valve 1008 were gradually opened to introduce $SiH_4$ gas, $H_2$ gas, and $PH_3/H_2$ into the deposition chamber 1001 via the gas introduction pipe 1003. At this time, the corresponding mass-flow controllers 1021, 1022, and 1025 were used to adjust the flow rate of the $SiH_4$ gas to 5 sccm, that of the $H_2$ gas to 5 sccm, and that of the $PH_3/H_2$ gas to 5 sccm. The pressure in the deposition chamber 1001 was set at 10 mTorr by adjusting the opening of the conductance valve 1007 while observing the vacuum gauge 1006. Then, a DC bias of $-50$ v with respect to the deposition chamber 1001 was applied from the DC power source 1011 to the substrate 1004. The electric power of the $\mu E$ power source (omitted from illustration) was set to 0.02 $W/cm^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the n-type layer on the diamond layer was commenced. When the thickness of the formed n-type layer became 0.01 $\mu m$, the $\mu W$ glow discharge was stopped and the output of the DC power source 1011 was also terminated. Furthermore, the outlet valves 1041, 1042, 1045, and the sub-valve 1008 were closed so as to stop the gas introduction into the deposition chamber 1001. Thus, forming of the n-type layer was completed.

The i-type layer was formed in such a manner that the substrate 1004 was heated to 280° C. by the heater 1005 and the outlet valves 1041, 1042, 1046, and the sub-valve 1008 were gradually opened to introduce $SiH_4$ gas, $H_2$ gas, and $GeH_4$ gas into the deposition chamber 1001 via the gas introduction pipe 1003. At this time, the corresponding mass-flow controllers 1021, 1022, and 1026 were used to adjust the flow rate of the $SiH_4$ gas to 40 sccm, that of the $H_2$ gas to 100 sccm, and that of the $GeH_4$ gas to 15 sccm. The pressure in the deposition chamber 1001 was set at 10 mTorr by adjusting the opening of the conductance valve 1007 while observing the vacuum gauge 1006. Then, a DC bias of $-40$ v with respect to the deposition chamber 1001 was applied from the DC power source 1011 to the substrate 1004. The electric power of the $\mu W$ power source (omitted from illustration) was set to 0.15 $W/cm^3$ so as to introduce microwaves into the deposition chamber 1001 via the waveguide pipe (omitted from illustration), the waveguide portion 1010, and the dielectric window 1002 so that $\mu W$ glow discharge took place. As a result, forming the i-type layer on the n-type layer was commenced. During forming of the i-type layer, the mass-flow controllers 1021, 1022, and 1026 were adjusted so as to set the $SiH_4$ gas flow at a predetermined rate of 40 sccm, the $H_2$ gas flow at a predetermined rate of 100 sccm. The flow rate of the $GeH_4$ gas increased from 1 sccm to 20 sccm at a predetermined rate near the n-type layer to provide a thickness of 0.03 $\mu m$ and then decreased from 20 sccm to 0 sccm at a predetermined rate toward a p-type layer for a thickness of 0.27 $\mu m$. When the thickness of the formed i-type layer reached 0.3 $\mu m$, the $\mu W$ glow discharge was stopped and the output of the DC power source 1011 was also terminated. Further, the outlet valves 1041, 1042, 1046, and the sub-valve 1008 were closed to stop the gas introduction into the deposition chamber 1001. Thus, forming of the i-type layer was completed.

The p-type layer was formed in such a manner that the substrate 1004 was heated to 280° C. by the heater 1005 and the outlet valves 1041, 1042, 1044, and the sub-valve 1008 were gradually opened to introduce SiH$_4$ gas, H$_2$ gas, and B$_2$H$_6$/H$_2$ gas into the deposition chamber 1001 via the gas introduction pipe 1003. At this time, the corresponding mass-flow controllers 1021, 1022, and 1024 were used to adjust the flow rate of the SiH$_4$ gas to 5 sccm, that of the H$_2$ gas to 500 sccm, and that of the B$_2$H$_6$/H$_2$ gas to 5 sccm. The pressure in the deposition chamber 1001 was set at 20 mTorr by adjusting the opening of the conductance valve 1007 while observing the vacuum gauge 1006. Then, a DC bias of −70 v with respect to the deposition chamber 1001 was applied from the DC power source 1011 to the substrate 1004. The electric power of the $\mu$W power source (omitted from illustration) was set at 0.5 W/cm$^3$ so as to introduce microwaves into the deposition chamber 1001 via a waveguide pipe (omitted from illustration), the waveguide portion 1010, and the dielectric window 1002 so that $\mu$W glow discharge took place. As a result, forming of the p-type layer on the i-type layer was commenced. When the thickness of the formed p-type layer became 0.005 $\mu$m, the $\mu$W glow discharge was stopped and the output operation of the DC power source 1011 was also terminated. Furthermore, the outlet valves 1041, 1042, 1044, and the sub-valve 1008 were closed so as to stop the gas introduction into the deposition chamber 1001. Thus, forming of the p-type layer was completed.

The conditions for manufacturing the solar cell are shown in Tables 24, 19, and 3.

The outlet valves 1041 to 1046, except for when supplying required gas must, of course, be completely closed at the time of forming the respective layers. Furthermore, if necessary, the outlet valves 1041 to 1046 are closed, the sub-valve 1008 is opened, and the conductance valve 1007 is completely opened in order to prevent leaving of each gas in the deposition chamber 1001 and the pipes arranged from the outlet valves 1041 to 1046 to the deposition chamber 1001 so as to temporarily reduce the pressure level in the system.

An ITO (In$_2$O$_3$+SnO$_2$) layer was, by a conventional method, evaporated as a transparent electrode to a thickness of 0.085 $\mu$m on the p-type layer of the solar cell. Further, as a collecting electrode, Al was evaporated thereon to a thickness of 2 $\mu$m by a conventional method so that the solar cell was manufactured. By performing a similar operation, two solar cells were manufactured (solar cell Example 1).

COMPARISON EXAMPLE 1

The substrate 1004 was heated to 350° C. and a silver thin film was formed on the surface of the substrate 1004 by sputtering to a thickness of 0.45 $\mu$m and a ZnO thin film was evaporated thereon to a thickness of 2 $\mu$m so that a lower electrode was formed. Then, the n-type layer, the i-type layer, the p-type layer, the transparent electrode, and the collecting electrode were formed under the same conditions as those for Example 1 except that the diamond layer was not formed according to Comparison Example 1. Two solar cells were manufactured (solar cell Comparison Example 1).

The initial characteristics, the thermal deterioration characteristics, and the stress deterioration characteristics of the solar cells manufactured in Example 1 (solar cell Example 1) and Comparison Example 1 (solar cell Comparison Example 1) were evaluated.

The initial characteristics of the two solar cells manufactured according to Example 1 (solar cell Example 1) and those of the two solar cells manufactured according to Comparison Example 1 (solar cell Comparison Example 1) were evaluated in such a manner that they were exposed to light of AM-1.5 (100 mW/cm$^2$) to measure the photoelectrical conversion efficiency. As a result of the evaluation of the characteristics, the solar cells according to Example 1 (solar cell Example 1) displayed an average photoelectrical conversion efficiency which as 1.3 times the efficiency of Comparison Example 1 (solar cell Comparison Example 1).

The thermal deterioration characteristics were evaluated in such a manner that each of the solar cells manufactured according to Example 1 (solar cell Example 1) and Comparison Example 1 (solar cell Comparison Example 1) were subjected 10 times to the following process in which each solar cell was placed in a constant temperature drier (DV-41 manufactured by Yamato) set at 100° C. for 1 hour before it was placed in a refrigerator (R-107W manufactured by Hitachi) set at 5° C. for 1 hour and, similarly to the evaluation of the initial characteristics, it was exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which was 1.45 times the efficiency of Comparison Example 1 (solar cell Comparison Example 1).

The stress deterioration characteristics were evaluated in such a manner that each of the solar cells according to Example 1 (solar cell Example 1) and Comparison Example 1 (solar cell Comparison Example 1) which had not been subjected to the thermal deterioration evaluation was subjected 50 times to the following process in which it was bent at a curvature radius of 54 mm while making the stainless substrate to face inside before being restored to a planar shape. Then, similarly to the evaluation of the initial characteristics, they were exposed to light of AM-1.5 (100 mW/cm$^2$) to measure the photoelectrical conversion efficiency. As a result of the evaluation of the characteristics, the solar cell according to Example 1 (solar cell Example 1) displayed a photoelectrical conversion efficiency which was 1.35 times the efficiency of Comparison Example 1 (solar cell Comparison Example 1).

Furthermore, a diamond layer having a thickness of 1 $\mu$m was formed on a stainless substrate under the same forming conditions as those of Example 1 so that a sample, the crystallinity of which was to be analyzed, was manufactured. Then, the crystallinity of the diamond layer was evaluated by using an X-ray diffraction apparatus (RAD-3b manufactured by Rigaku Electronic). As a result, sharp diffraction lines were observed at positions 43.9° and 75.4° corresponding to the diffraction lines of (111) and (220) planes of the cubic system of diamond, from which it was determined that diamond crystals were formed. Furthermore, the surface roughness of the sample, the crystallinity of which was to be analyzed, was measured by using a surface roughness gauge (SE-30D manufactured by Kosaka Laboratory). As a result, Rz (average roughness of 10 points) was 0.2 $\mu$m.

Further, an i-type layer having a thickness of 0.1 $\mu$m and a p-type layer having a thickness of 0.005 $\mu$m were formed on the stainless substrate under the same forming conditions as those of Example 1 so that a sample, the crystallinity of which was to be analyzed, was manufactured. Then, the crystallinity of the p-type layer was evaluated by using RHEED (JEM-100SX manufactured by Nihon Electronic). As a result, an annular amorphous (microcrystals included) material was observed.

EXAMPLE 2 AND COMPARISON EXAMPLE 2

Two solar cells (solar cell Examples 2-1 to 3 and solar cell Comparison Examples 2-1 to 2) were manufactured for each of Example 2 and Comparison Example 2 under the same forming conditions as those for Example 1 except for the flow rate of the CH$_4$ gas at the time of forming the diamond layer as shown in Table 4. Further, similarly to Example 1, a diamond layer having a thickness of 1 μm was formed on the stainless substrate under the forming conditions shown in Table 4 so that a sample, the crystallinity of which was to be analyzed, was manufactured.

The solar cells and the samples, the crystallinity of which were to be analyzed according to Example 2 (solar cell Examples 2-1 to 3) and Comparison Example 2 (solar cell Comparison Examples 2-1 to 2), were subjected to evaluation of the characteristics by the same method as in Example 1.

Figure 17:
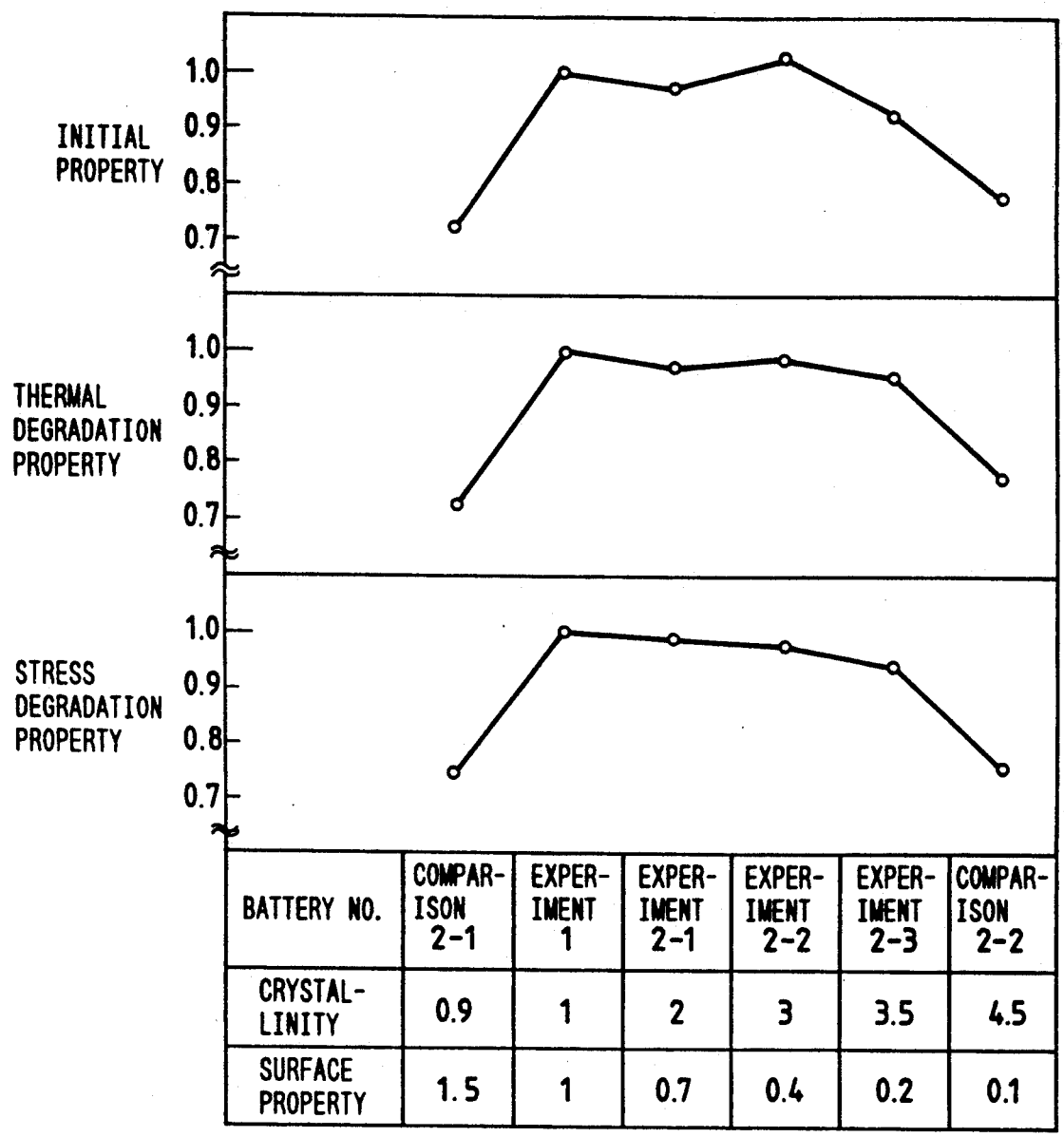
FIG. 17 shows the relation between crystallinity and surface property, and an initial property, thermal, and stress degenerations of a diamond layer according to embodiment IV of the present invention.

The initial characteristics, the thermal deterioration characteristics, the stress deterioration characteristics of the solar cells, and the crystallinity and the surface characteristics of the diamond layer are shown in FIG. 17. The crystallinity was evaluated by X-ray diffraction in such a manner that the half value width of the diffraction line at a position of 43.9° corresponds to the diffraction line of the (111) plane of the cubic crystal of diamond. As can be understood from FIG. 17, the solar cells according to the present invention (solar cell Examples 1 and Examples 2-1 to 3) displayed characteristics superior to those of the solar cells according to the comparison examples (solar cell Comparison Examples 2-1 to 2). As a result, a beneficial effect of the present invention was confirmed.

EXAMPLE 3 AND COMPARISON EXAMPLE 3

Two solar cells (solar cell Examples 3-1 to 3 and solar cell Comparison Examples 3-1 to 2) were manufactured for each of Example 3 and Comparison Example 3 under the same forming conditions as Example 1 except for the flow rate of the PH$_3$/H$_2$ gas at the time of forming the diamond layer, as shown in Table 5. Furthermore, similarly to Example 1, a diamond layer having a thickness of 1 μm was formed on the stainless substrate under the forming conditions shown in Table 4 so that a sample, the conductance of which was to be analyzed, was manufactured.

The solar cells according to Example 3 (solar cell Examples 3-1 to 3) and Comparison Example 3 (solar cell Comparison Examples 3-1 to 2) were subjected to evaluation of the characteristics by the same method as in Example 1.

Each of the samples, the conductance of which was to be analyzed according to Example 3 (solar cell Examples 3-1 to 3) and Comparison Example 3 (solar cell Comparison Examples 3-1 to 2), were subjected to the following process wherein a chrome electrode the diameter of which was 2 mm and the thickness of which was 0.1 μm was formed by evaporating chrome (Cr) on the surface of the diamond layer. Then, the samples, the conductance of each were to be analyzed, were disposed in a dark portion before voltage V was added to a position before the chrome electrode and the stainless substrate by using a pA meter (4140B manufactured by Yokokawa Hewlett Packard) to measure electric current I passing between the above-described two electrodes. Then, the dark conductance δd was obtained in accordance with the following equation by using the film thickness D of the diamond layer:

$$\delta d \, (S/cm) = \frac{I(A) \times D \, (cm)}{0.0314 \times V(V)}$$

Also, the sample (solar cell Example 1), the crystallinity of which was to be analyzed and manufactured in accordance with Example 1, was subjected to the process of obtaining the dark conductance δd by a similar method.

Figure 18:
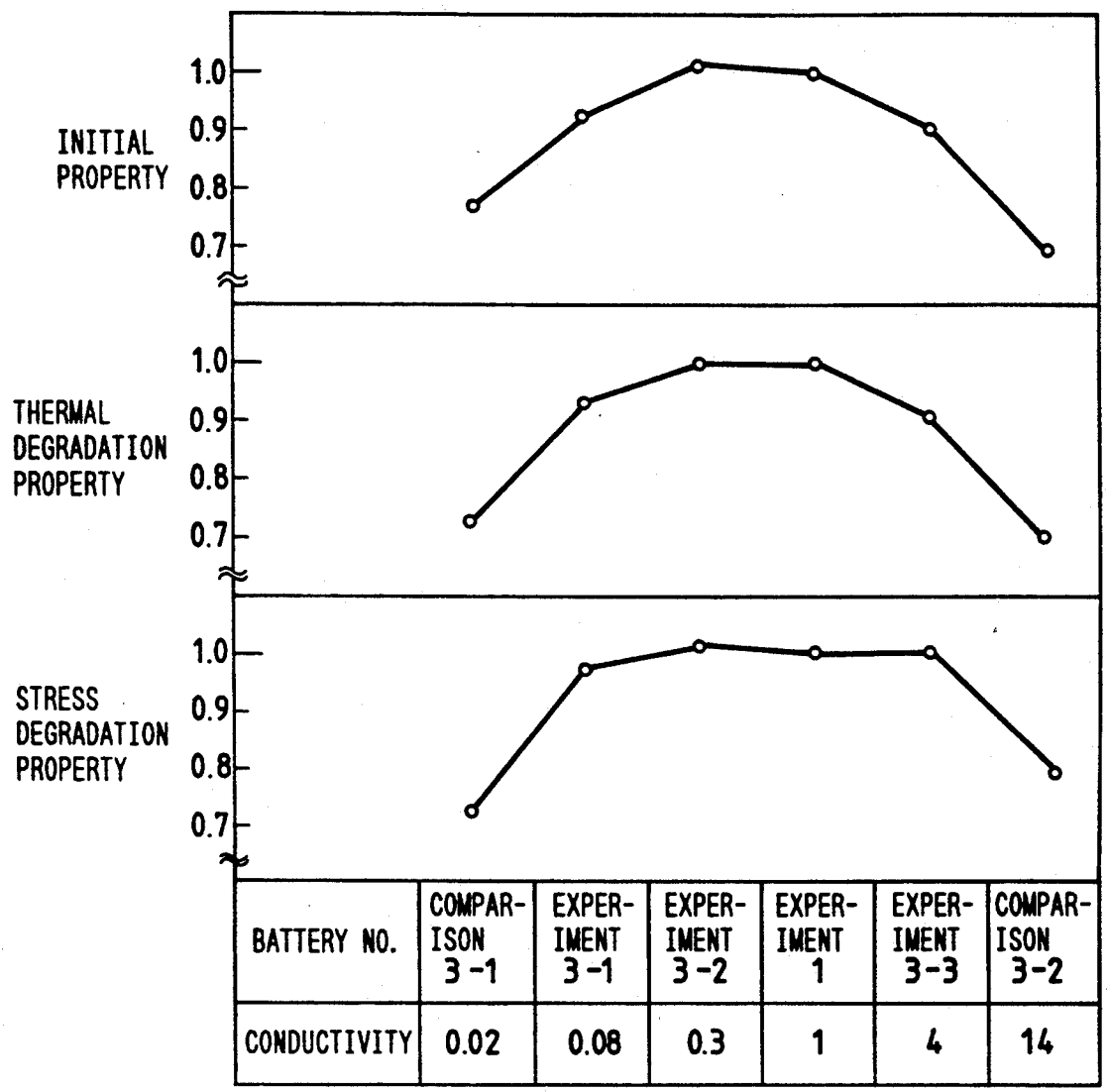
FIG. 18 shows the relation between dark conductivity, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 18. As can be understood from FIG. 18, the solar cells according to the present invention (solar cell Example 1 and Examples 3-1 to 3) displayed characteristics superior to those of solar cells according to the comparison examples (solar cell Comparison Examples 3-1 to 2). As a result, a beneficial effect of the present invention was confirmed.

EXAMPLE 4 AND COMPARISON EXAMPLE 4

Two solar cells (solar cell Examples 4-1 to 3 and solar cell Comparison Examples 4-1 to 2) were manufactured for each of Example 4 and Comparison Example 4 under the same forming conditions as those for Example 1 except for using B$_2$H$_6$/H$_2$ gas in place of PH$_3$/H$_2$ gas during forming of the diamond layer, as shown in Table 6. Further, similarly to Example 3, a diamond layer having a thickness of 1 μm was formed on a stainless substrate under the forming conditions shown in Table 6 so that a sample, the conductance of which was to be analyzed, was manufactured.

The solar cells according to Example 4 (solar cell Examples 4-1 to 3) and Comparison Example 4 (solar cell Comparison Examples 4-1 to 2) were subjected to evaluation of the characteristics by the same method as that according to Example 1. Each of the samples, the conductance of which were to be analyzed according to Example 4 (solar cell Examples 4-1 to 3) and Comparison Example 4 (solar cell Comparison Examples 4-1 to 2), were subjected to the processing which dark conductance δd was obtained by a method similar to that according to Example 3.

Figure 19:
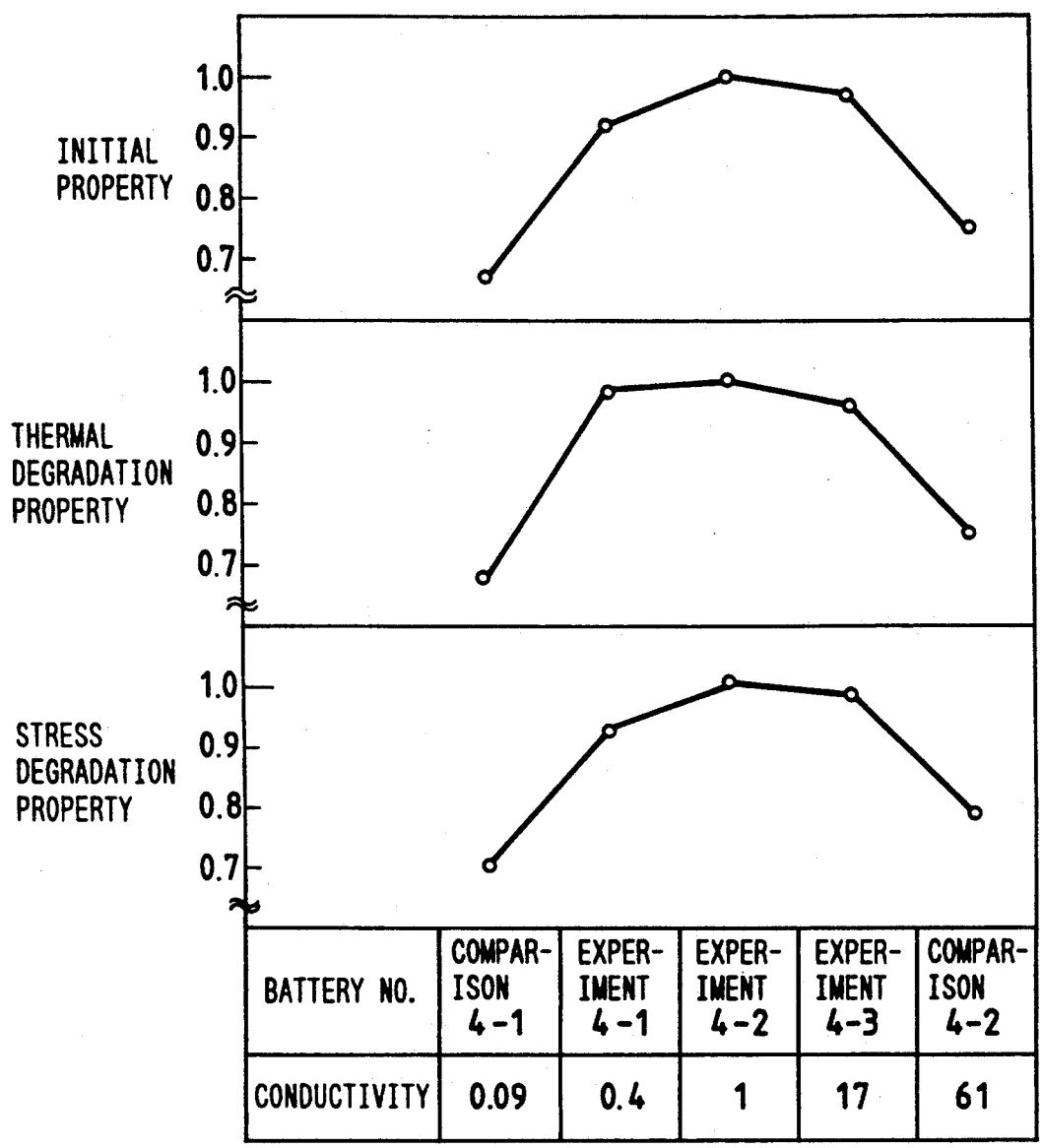
FIG. 19 shows the relation between dark conductivity, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 19. As can be understood from FIG. 19, the solar cells according to the present invention (solar cell Examples 4-1 to 3) displayed characteristics superior to those of the solar cells according to comparison examples (solar cell Comparison Examples 4-1 to 2). As a result, a beneficial effect of the present invention was confirmed.

EXAMPLE 5 AND COMPARISON EXAMPLE 5

Two solar cells (solar cell Examples 5-1 to 3 and solar cell Comparison Examples 5-1 to 2) were manufactured for each of Example 5 and Comparison Example 5 under the same forming conditions as those for Example 1 except for the thickness of the diamond layer as shown in Table 7. Further, similarly to Example 1, the solar cells were subjected to evaluation of the characteristics by the same method as that in Example 1.

Figure 20:
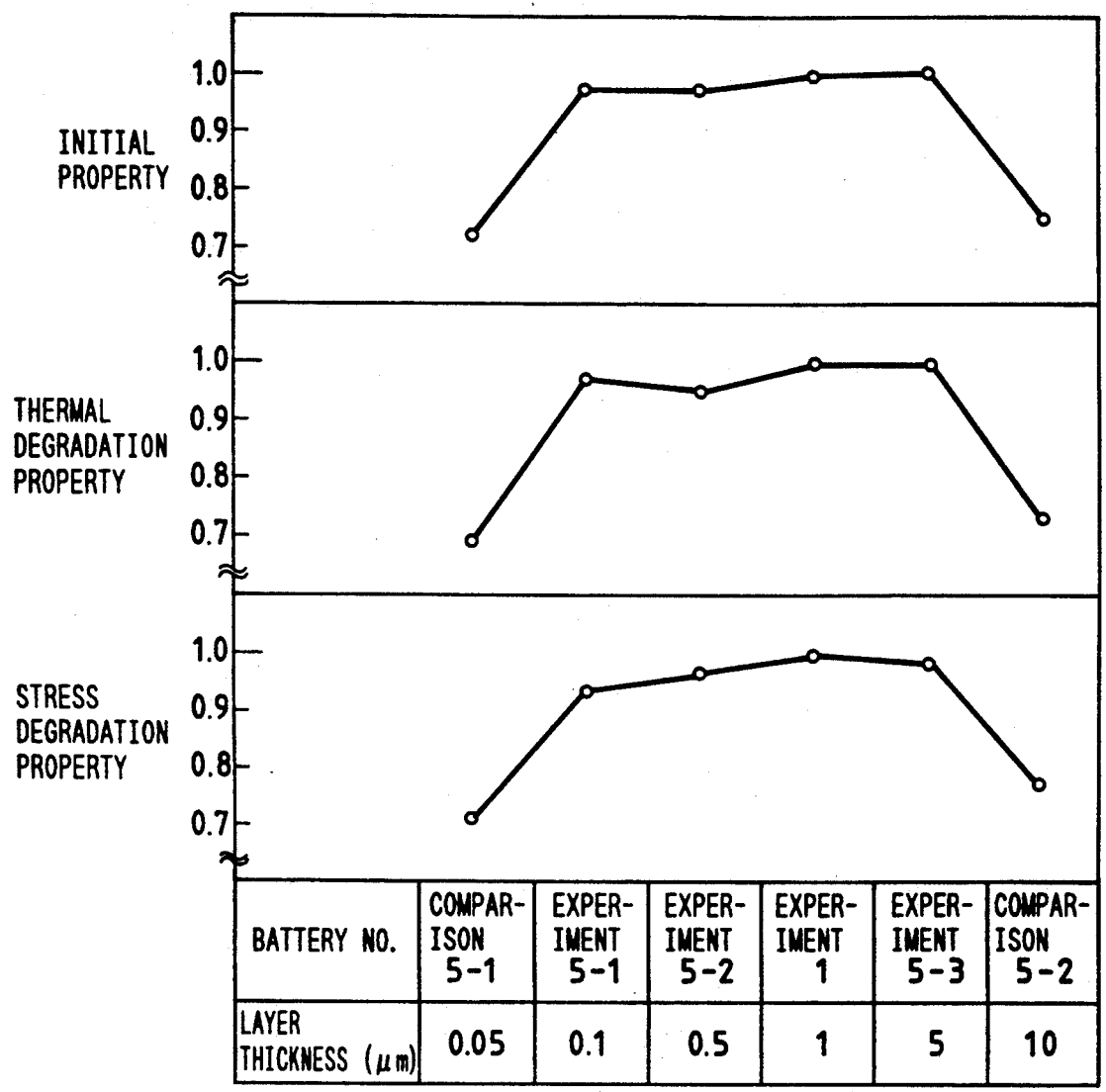
FIG. 20 shows the relations between thickness of the diamond layer, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 20. As can be understood from FIG. 20, the solar cells according to the present invention (solar cell Example 1 and Examples 5-1 to 3) displayed characteristics superior to those of the solar cells according to the comparison examples (solar cell Comparison Examples 5-1 to 2). As a result, a beneficial effect of the present invention was confirmed.

EMBODIMENT 4-1

Two solar cells were manufactured under the same forming conditions as those for Example 1 so that a solar cell module and a charger the circuit of which was structured as shown in FIG. 8 were manufactured.

COMPARISON EMBODIMENT 4-1

Two solar cells were manufactured under the same manufacturing conditions as those for Comparison Example 1 and a charger was manufactured similar to that of Embodiment 1 by using the above-described solar cells.

The chargers according to Embodiment 1 and Comparison Embodiment 1 were disposed outside in the daytime when the sky was clear. Then, electric power generated in the solar cell module 801 was charged to the secondary battery 804. Each of the secondary batteries 804 charged by the corresponding chargers according to Embodiment 1 and Comparison Embodiment 1 was loaded in a flash lamp (K-67 manufactured by Toshiba) to power the flash lamp. Then, the secondary batteries 804 were again charged by using the corresponding chargers according to Embodiment 1 and Comparison Embodiment 1. The above-described process was repeated. As a result, the charger according to Embodiment 1 was able to power the flash lamp for 1.35 times the time in which the charger according to Comparison Example 1 was able to power the same flash lamp. Therefore, a beneficial effect of the present invention was confirmed.

EMBODIMENT 2

Two solar cells were manufactured under the same manufacturing conditions as those for Example 1 except for the conditions as shown in Table 25 and 21 for forming the diamond layer, the n-type layer, the i-type layer, and the p-type layer. Then, a charger similar to Embodiment 1 was used similarly to Embodiment 1. As a result, it was able to power the flash lamp for a period substantially the same as that realized by Embodiment 1. Therefore, a beneficial effect of the solar cell according to the present invention was confirmed.

Further, a diamond layer, the thickness of which was 1 μm, was formed before the n-type layer was formed to a thickness of 0.01 μm on the stainless substrate under the forming conditions shown in Tables 21 and 25 so that a sample, the crystallinity of which was to be analyzed, was manufactured. Then, the crystallinity of the n-type layer was evaluated similarly to Example 1. As a result, annular amorphous (microcrystals included) characteristics were observed.

Then, an i-type layer having a thickness of 0.1 μm and a p-type layer having a thickness of 0.005 μm were formed on the stainless substrate under the forming conditions as shown in Tables 21 to 25 so that a sample, the crystallinity of which was to be analyzed, was manufactured. Then, the crystallinity of the p-type layer was evaluated similarly to Example 1. As a result, annular amorphous (microcrystals included) characteristics were observed.

EMBODIMENT 3

Two solar cells were manufactured under the same manufacturing conditions as those for Example 1 except for the conditions as shown in Tables 23 and 26 for forming the diamond layer, the n-type layer, the i-type layer, and the p-type layer. Then, a charger similar to Embodiment 1 was used similarly to Embodiment 1. As a result, it was able to power the flash lamp for a period substantially the same as that realized by Embodiment 1. Therefore, a beneficial effect of the solar cell according to the present invention was confirmed.

Then, an i-type layer having a thickness of 0.1 μm and an n-type layer having a thickness of 0.005 μm were formed on a stainless substrate under the forming conditions as shown in Table 7 so that a sample, the crystallinity of which was to be analyzed, was manufactured. Then, the crystallinity of the n-type layer was evaluated similarly to Example 1. As a result, annular amorphous (microcrystals included) characteristics were observed.

In the solar cell having the diamond layer according to this embodiment, the conversion efficiency was improved and the deterioration of characteristics with time was reduced. As a result, the characteristics of the solar cell were significantly improved.

Furthermore, the manufacturing yield of the solar cell having a diamond layer according to the present invention was significantly improved in comparison to that of the conventional solar cell.

EXAMPLE 5-1

In the apparatus shown in FIG. 3, the gas tanks 1071 and 1076 respectively are filled with a variety of the raw material gases for forming the layers of the solar cell according to the present invention. The tank 1071 is filled with $SiH_4$ gas (purity: 99.99%), the tank 1072 is filled with $H_2$ gas (purity: 99.9999%), the tank 1073 is filled with $CH_4$ gas (purity: 99.999%), the tank 1074 is filled with $B_2H_6$ gas (purity: 99.999% and hereinafter abbreviated to "$B_2H_6/H_2$") diluted to 10% by $H_2$ gas, the tank 1075 is filled with $PH_3$ gas (purity: 99.999% and hereinafter abbreviated to "$PH_3/H_2$") diluted to 10% by $H_2$ gas and a tank 1076 is filled with $GeH_4$ gas (purity: 99.999%). At the time of attaching the gas tanks 1071 to 1076, the above-described gases have been previously introduced into the gas pipes of the introduction valves 1031 to 1036 through valves 1051 to 1056.

Reference numeral 1004 represents 100 mm × 100 mm substrate, the thickness of which is 0.25 mm and which is made of stainless steel (SUS430BA). The surface of the substrate 1004 is formed as a mirror surface.

First, the valves 1051 to 1056 were opened to introduce $SiH_4$ gas from the gas tank 1071, $H_2$ gas from the gas tank 1072, $CH_4$ from the gas tank 1073, $B_2H_6/H_2$ gas from the gas tank 1074, $PH_3/H_2$ gas from the gas tank 1075, and $GeH_4$ gas from the gas tank 1076 before the gas pressure of each was adjusted to 2 kg/cm² by using the pressure regulators 1061 to 1066.

Then, closure of the introduction valves 1031 to 1036 and the leak valve 1009 of the deposition chamber 1001 was confirmed. Furthermore, opening of the outlet valves 1041 to 1046, and the sub-valve 1008 was confirmed before the conductance (a butterfly type) valve 1007 was fully opened so as to, by a vacuum pump (omitted from illustration), exhaust the deposition chamber 1001 and the gas pipes. Then, when a value of about $1 \times 10^{-4}$ Torr was read at the vacuum gauge 1006, the sub-valve 1008 and the outlet valves 1041 to 1046 were closed.

Then, the introduction valves 1031 to 1036 were gradually opened to introduce the above-described gases into the mass-flow controllers 1021 to 1026.

After the preparation for forming the films had been thus completed, the diamond layer, the n-type layer, the i-type layer, and the p-type layer were formed on the substrate 1004.

The diamond layer was formed in such a manner that the substrate 1004 was heated to 400° C. by the heater 1005 and the outlet valves 1042, 1043, 1045 and the sub-valve 1008 were gradually opened to introduce $H_2$ gas, $CH_4$ gas, the $PH_3/H_2$ gas into the deposition chamber 1001 via the gas introduction pipe 1003. At this time, the corresponding mass-flow controllers 1022, 1023, and 1025 were used to adjust the flow rate of the $H_2$ gas to 500 sccm, that of the $CH_4$ to 5 sccm, and that of the $PH_3/H_2$ gas to 2.5 sccm. The pressure in the deposition chamber 1001 was set at 20 mTorr by adjusting the opening of the conductance valve 1007 while observing the vacuum gauge 1006. Then, a DC bias of $-100$ v with respect to the deposition chamber 1001 was applied from the DC power source 1011 to the substrate 1004. The electric power of the $\mu W$ power source (omitted from illustration) was set at 0.5 W/cm$^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the diamond layer on the substrate 1004 was commenced. When the thickness of the formed diamond layer became 1 $\mu m$, the $\mu W$ glow discharge was stopped and the output of the DC power source 1011 was also terminated. Furthermore, the outlet valves 1042, 1043, 1045, and the sub-valve 1008 were closed so as to stop the gas introduction into the deposition chamber 1001. Thus, forming of the diamond layer was completed.

The n-type layer was formed in such a manner that the substrate 1004 was heated to 280° C. by the heater 1005 and the outlet valves 1041, 1042, 1043, 1045 and the sub-valve 1008 were gradually opened to introduce $SiH_4$ gas, $H_2$ gas, and $PH_3/H_2$ into the deposition chamber 1001 via the gas introduction pipe 1003. At this time, the corresponding mass-flow controllers 1021, 1022, 1023, and 1025 were used to adjust the flow rate of the $SiH_4$ gas to 5 sccm, that of the $H_2$ gas to 5 sccm, that of the $CH_4$ gas to 0.5 sccm, and that of the $PH_3/H_2$ gas to 5 sccm. The pressure in the deposition chamber 1001 was set at 10 mTorr by adjusting the opening of the conductance valve 1007 while observing the vacuum gauge 1006. Then, a DC bias of $-60$ v with respect to the deposition chamber 1001 was applied from the DC power source 1011 to the substrate 1004. The electric power of the $\mu W$ power source (omitted from illustration) was set to 0.05 W/cm$^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the n-type layer on the diamond layer was commenced. When the thickness of the formed n-type layer became 0.01 $\mu m$, the $\mu W$ glow discharge was stopped and the output of the DC power source 1011 was also terminated. Furthermore, the outlet valves 1041, 1042 1043, 1045, and the sub-valve 1008 were closed so as to stop the gas introduction into the deposition chamber 1001. Thus, forming of the n-type layer was completed.

The i-type layer was formed in such a manner that the substrate 1004 was heated to 280° C. by the heater 1005 and the outlet valves 1041, 1042, 1046, and the sub-valve 1008 were gradually opened to introduce $SiH_4$ gas, $H_2$ gas, and $GeH_4$ gas into the deposition chamber 1001 via the gas introduction pipe 1003. At this time, the corresponding mass-flow controllers 1021, 1022, and 1026 were used to adjust the flow rate of the $SiH_4$ gas to 40 sccm, that of the $H_2$ gas to 100 sccm, and that of the $GeH_4$ gas to 15 sccm. The pressure in the deposition chamber 1001 was set at 10 mTorr by adjusting the opening of the conductance valve 1007 while observing the vacuum gauge 1006. Then, a DC bias of $-40$ v with respect to the deposition chamber 1001 was applied from the DC power source 1011 to the substrate 1004. The electric power of the $\mu W$ power source (omitted from illustration) was set to 0.15 W/cm$^3$ so as to introduce microwaves into the deposition chamber 1001 via the waveguide pipe (omitted from illustration), the waveguide portion 1010, and the dielectric window 1002 so that $\mu W$ glow discharge took place. As a result, forming of the i-type layer on the n-type layer was commenced. When the thickness of the formed i-type layer became 0.3 $\mu m$, the $\mu W$ glow discharge was stopped and the output of the DC power source 1011 was also terminated. Furthermore, the outlet valves 1041, 1042, 1046, and the sub-valve 1008 were closed to stop the gas introduction into the deposition chamber 1001. Thus, forming of the i-type layer was completed.

The p-type layer was formed in such a manner that the substrate 1004 was heated to 280° C. by the heater 1005 and the outlet valves 1041, 1042 1043, 1044 and the sub-valve 1008 were gradually opened to introduce $SiH_4$ gas, $H_2$ gas, $CH_4$ gas, and $B_2H_6/H_2$ gas into the deposition chamber 1001 via the gas introduction pipe 1003. At this time, the corresponding mass-flow controllers 1021, 1022, 1023, and 1024 were used to adjust the flow rate of the $SiH_4$ gas to 3 sccm, that of the $H_2$ gas to 500 sccm, that of the $CH_4$ gas to 0.5 sccm, and that of the $B_2H_6/H_2$ gas to 5 sccm. The pressure in the deposition chamber 1001 was set at 20 mTorr by adjusting the opening of the conductance valve 1007 while observing the vacuum gauge 1006. Then, a DC bias of $-100$ v with respect to the deposition chamber 1001 was applied from the DC power source 1011 to the substrate 1004. The electric power of the $\mu W$ power source (omitted from illustration) was set to 0.5 W/cm$^3$ so as to introduce microwaves into the deposition chamber 1001 via a waveguide pipe (omitted from illustration), the waveguide portion 1010, and the dielectric window 1002 so that $\mu W$ glow discharge took place. As a result, forming of the p-type layer on the i-type layer was commenced. When the thickness of the formed p-type layer became 0.005 $\mu m$, the $\mu W$ glow discharge was stopped and the output of the DC power source 1011 was also terminated. Furthermore, the outlet valves 1041, 1042, 1043, 1044, and the sub-valve 1008 were closed so as to stop the gas introduction into the deposition chamber 1001. Thus, forming of the p-type layer was completed.

The conditions for manufacturing the solar cell are shown in Table 27.

The outlet valves 1041 to 1046, except for those for the required gas must, of course, be completely closed during forming the respective layers. Furthermore, if necessary, the outlet valves 1041 to 1046 are closed, the sub-valve 1008 is opened, and the conductance valve 1007 is completely opened in order to prevent leaving of each gas in the deposition chamber 1001 and the pipes arranged from the outlet valves 1041 to 1046 to the deposition chamber 1001 so as to temporarily reduce the pressure level in the system.

An ITO ($In_2O_3 + SnO_2$) layer was, by a conventional method, evaporated as a transparent electrode to a thickness of 0.085 $\mu$m on the p-type layer of the solar cell. Furthermore, as a collecting electrode, Al was evaporated to a thickness of 2 $\mu$m by a conventional method so that the solar cell was manufactured. By performing a similar operation, two solar cells were manufactured (solar cell Example 1).

COMPARISON EXAMPLE 5-1

A substrate 1004 was heated to 350° C. and a silver thin film was formed on the surface of the substrate 1004 by sputtering to a thickness of 0.45 $\mu$m and a ZnO thin film was evaporated thereon to a thickness of 2 $\mu$m so that a lower electrode was formed. Then, an n-type layer, an i-type layer, a p-type layer, a transparent electrode, and a collecting electrode were formed under the same conditions as those for Example 1 except that the diamond layer was not formed according to Comparison Example 1. Two such solar cells were manufactured (solar cell Comparison Example 1).

The initial characteristics, the thermal deterioration characteristics, and the stress deterioration characteristics of the solar cells manufactured in Example 1 (solar cell Example 1) and Comparison Example 1 (solar cell Comparison Example 1) were evaluated.

The initial characteristics of the two solar cells manufactured according to Example 1 (solar cell Example 1) and those of the two solar cells manufactured according to Comparison Example 1 (solar cell Comparison Example 1) were evaluated in such a manner that they were exposed to light of AM-1.5 (100 mW/cm$^2$) to measure the photoelectrical conversion efficiency. As a result of the evaluation of the characteristics, the solar cells according to Example 1 (solar cell Example 1) displayed an average photoelectrical conversion efficiency which was 1.25 times the efficiency of Comparison Example 1 (solar cell Comparison Example 1).

The thermal deterioration characteristics were evaluated in such a manner that each of the solar cells manufactured according to Example 1 (solar cell Example 1) and Comparison Example 1 (solar cell Comparison Example 1) were subjected 10 times to the following process in which each solar cell was made to stand in a constant temperature drier (DV-41 manufactured by Yamato) set at 100° C. for 1 hour before it was placed in a refrigerator (R-107W manufactured by Hitachi) set at 5° C. for 1 hour and, similarly to the evaluation of the initial characteristics, it was exposed to light of AM-1.5 (100 mW/cm$^2$) to measure the photoelectrical conversion efficiency. As a result of the evaluation of the characteristics, the solar cells according to Example 1 (solar cell Example 1) displayed a photoelectrical conversion efficiency which was 1.4 times the efficiency of Comparison Example 1 (solar cell Comparison Example 1).

The stress deterioration characteristics were evaluated in such a manner that each of the solar cells according to Example 1 (solar cell Example 1) and Comparison Example 1 (solar cell Comparison Example 1) which had not been subjected to the thermal deterioration evaluation was subjected 50 times to the following process in which it was bent at a curvature radius of 54 mm while making the stainless substrate to face inside before it was restored to a planar shape. Then, similarly to the evaluation of the initial characteristics, it was exposed to light of AM-1.5 (100 mW/cm$^2$) to measure the photoelectrical conversion efficiency. As a result of the evaluation of the characteristics, the solar cell according to Example 1 (solar cell Example 1) displayed a photoelectrical conversion efficiency which was 1.3 times the efficiency of Comparison Example 1 (solar cell Comparison Example 1).

Furthermore, a diamond layer having a thickness of 1 $\mu$m was formed on a stainless substrate under the same forming conditions as those for Example 1 so that a sample, the crystallinity of which was to be analyzed, was manufactured. Then, the crystallinity of the diamond layer was evaluated by using an X-ray diffraction apparatus (RAD-3b manufactured by Rigaku Electronic). As a result, sharp diffraction lines were observed at positions 43.9° and 75.4° corresponding to the diffraction lines of the (111) and (220) planes of the cubic system of diamond, from which it was determined that diamond crystals were formed. Furthermore, the surface roughness of the sample, the crystallinity of which was to be analyzed, was measured by using a surface roughness gauge (SE-30D manufactured by Kosaka Laboratory). As a result, Rz (average roughness of 10 points) was 0.2 $\mu$m.

Furthermore, an i-type layer having a thickness of 0.1 $\mu$m and a p-type layer having a thickness of 0.005 $\mu$m were formed on the stainless substrate under the same forming conditions as those for Example 1 so that a sample, the crystallinity of which was to be analyzed, was manufactured. Then, the crystallinity of the p-type layer was evaluated by using RHEED (JEM-100SX manufactured by Nihon Electronic). As a result, an annular amorphous (microcrystals included) characteristic was observed.

EXAMPLE 2 AND COMPARISON EXAMPLE 2

Two solar cells (solar cell Examples 2-1 to 3 and solar cell Comparison Examples 2-1 to 2) were manufactured for each of Example 2 and Comparison Example 2 under the same forming conditions as those for Example 1 except for the flow rate of the CH$_4$ gas at the time of forming the diamond layer, as shown in Table 4. Furthermore, similarly to Example 1, a diamond layer having a thickness of 1 $\mu$m was formed on the stainless substrate under the forming conditions shown in Table 4 so that a sample, the crystallinity of which was to be analyzed, was manufactured.

The solar cells and the samples, the crystallinity of which were to be analyzed, according to Example 2 (solar cell Examples 2-1 to 3) and Comparison Example 2 (solar cell Comparison Examples 2-1 to 2) were subjected to evaluation of the characteristics by the same method as that of Example 1.

Figure 21:
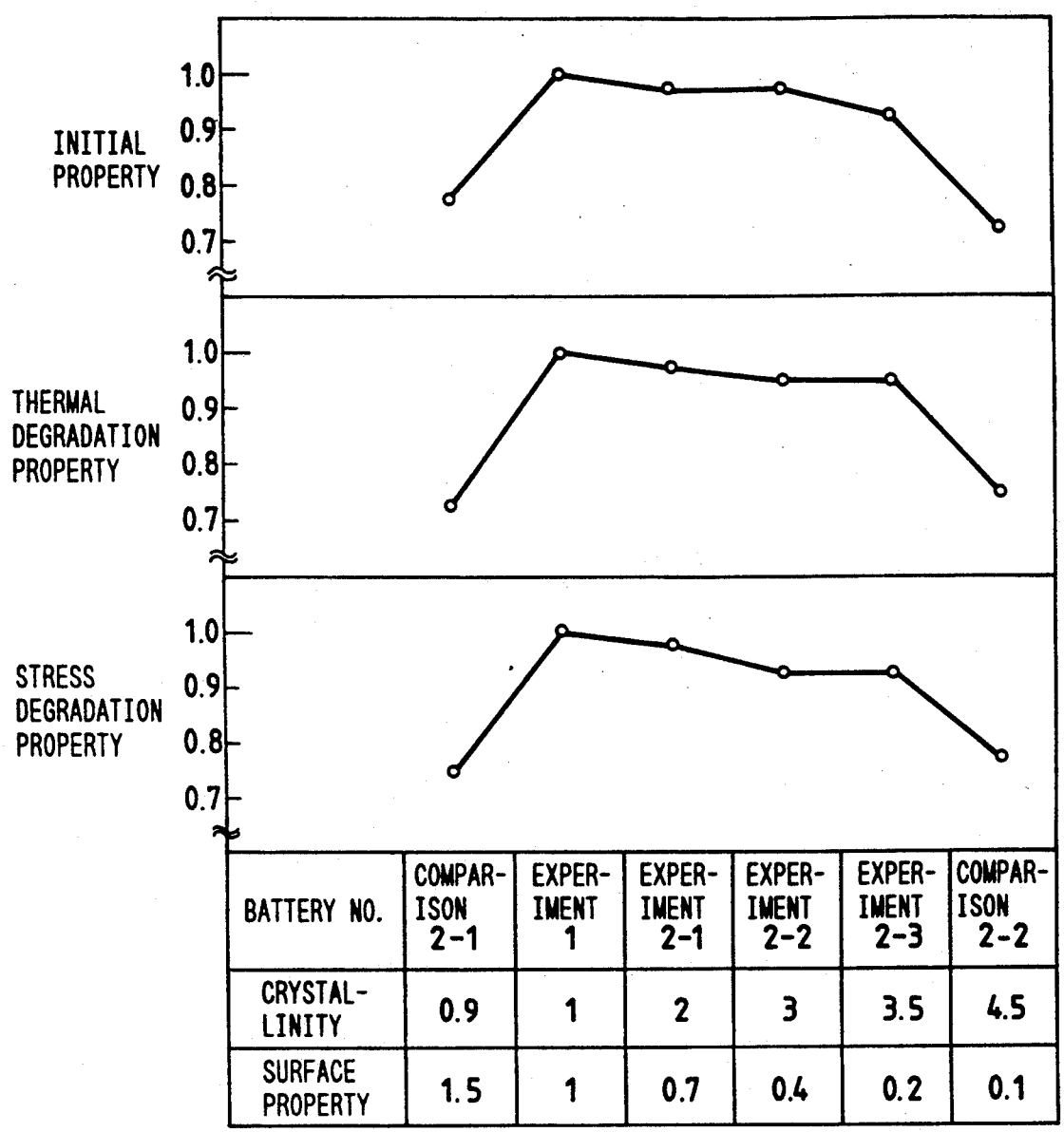
FIG. 21 shows the relation between crystallinity and surface property, and an initial property, thermal, and stress degenerations of a diamond layer according to embodiment V of the present invention.

The initial characteristics, the thermal deterioration characteristics, the stress deterioration characteristics of the solar cells, the crystallinity, and the surface characteristics of the diamond layer are shown in FIG. 21. The crystallinity was evaluated by X-ray diffraction in such a manner that the half value width of the diffraction line at a position of 43.9° corresponds to the diffraction line of the (111) plane of the cubic crystal of diamond. As can be understood from FIG. 21, the solar cells according to the present invention (solar cells No. Examples 1 and Examples 2-1 to 3) displayed characteristics superior to those of the solar cells according to the comparison examples (solar cell Comparison Examples 2-1 to 2). As a result, a beneficial effect of the present invention was confirmed.

EXAMPLE 3 AND COMPARISON EXAMPLE 3

Two solar cells (solar cell Examples 3-1 to 3 and solar cell Comparison Examples 3-1 to 2) were manufactured for each of Example 3 and Comparison Example 3 under the same forming conditions as those for Example 1 except for the flow rate of the $PH_3/H_2$ gas at the time of forming the diamond layer as shown in Table 5. Furthermore, similarly to Example 1, the diamond layer having a thickness of 1 μm was formed on the stainless substrate under the forming conditions shown in Table 13 so that a sample, the conductance of which was to be analyzed, was manufactured.

The solar cells according to Example 3 (solar cell Examples 3-1 to 3) and Comparison Example 3 (solar cell Comparison Examples 3-1 to 2) were subjected to evaluation of the characteristics by the same method as that of Example 1.

Each of the samples, the conductance of which was to be analyzed and according to Example 3 (solar cell Examples 3-1 to 3) and Comparison Example 3 (solar cell Comparison Examples 3-1 to 2), were subjected to the following process wherein a chrome electrode, the diameter of which was 2 mm and the thickness of which was 0.1 μm, was formed by evaporating chrome (Cr) on the surface of the diamond layer. Then, the samples, were disposed in a dark portion before voltage V was added to a position between the chrome electrode and the stainless substrate by using a pA meter (4140B manufactured by Yokokawa Hewlett Packard) to measure electric current I passing between the above-described two electrodes. Then, dark conductance δd was obtained in accordance with the following equation by using film thickness D of the diamond layer:

$$\delta d \, (S/cm) = \frac{I(A) \times D \, (cm)}{0.0314 \times V(V)}$$

Also, the sample (solar cell Example 1), the crystallinity of which was to be analyzed and manufactured in accordance with Example 1, was subjected to the process of obtaining the dark conductance δd by a similar method.

Figure 22:
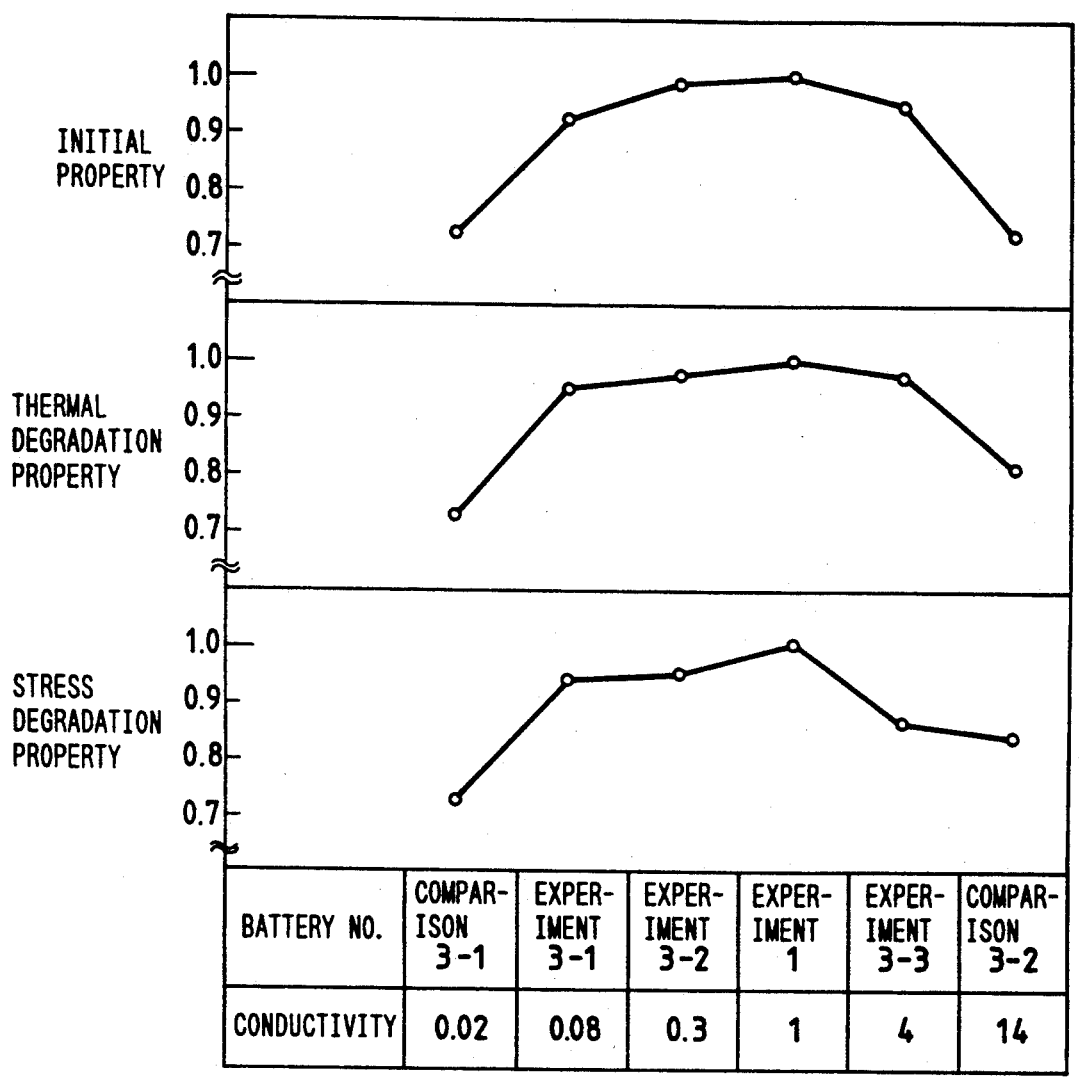
FIG. 22 shows the relation between dark conductivity, and the initial property, of the thermal and stress degenerations of the diamond layer of the present invention.

The initial characteristics, the thermal deterioration characteristics, the stress deterioration characteristics of the solar cells, and the dark conductance of the diamond layer are shown in FIG. 22. As can be understood from FIG. 22, the solar cells according to the present invention (solar cell Examples 1 and Examples 3-1 to 3) displayed characteristics superior to those of solar cells according to the comparison examples (solar cell Comparison Examples 3-1 to 2). As a result, a beneficial effect of the present invention was confirmed.

EXAMPLE 4 AND COMPARISON EXAMPLE 4

Two solar cells (solar cell Examples 4-1 to 3 and solar cell Comparison Examples 4-1 to 2) were manufactured for each of Example 4 and Comparison Example 4 under the same forming conditions as those for Example 1 except for using $B_2H_6/H_2$ gas in place of $PH_3/H_2$ gas and setting the flow rate of the $B_2H_6/H_2$ gas at the time of forming the diamond layer as shown in Table 6. Furthermore, similarly to Example 3, a diamond layer having a thickness of 1 μm was formed on a stainless substrate under the forming conditions shown in Table 6 so that a sample, the conductance of which was to be analyzed, was manufactured.

The solar cells according to Example 4 (solar cell Examples 4-1 to 3) and Comparison Example 4 (solar cell Comparison Examples 4-1 to 2) were subjected to evaluation of the characteristics by the same method as that of Example 1. Each of the samples according to Example 4 (solar cell Examples 4-1 to 3) and Comparison Example 4 (solar cell Comparison Examples 4-1 to 2) were subjected to a process in which dark conductance δd was obtained by a method similar to that of Example 3.

Figure 23:
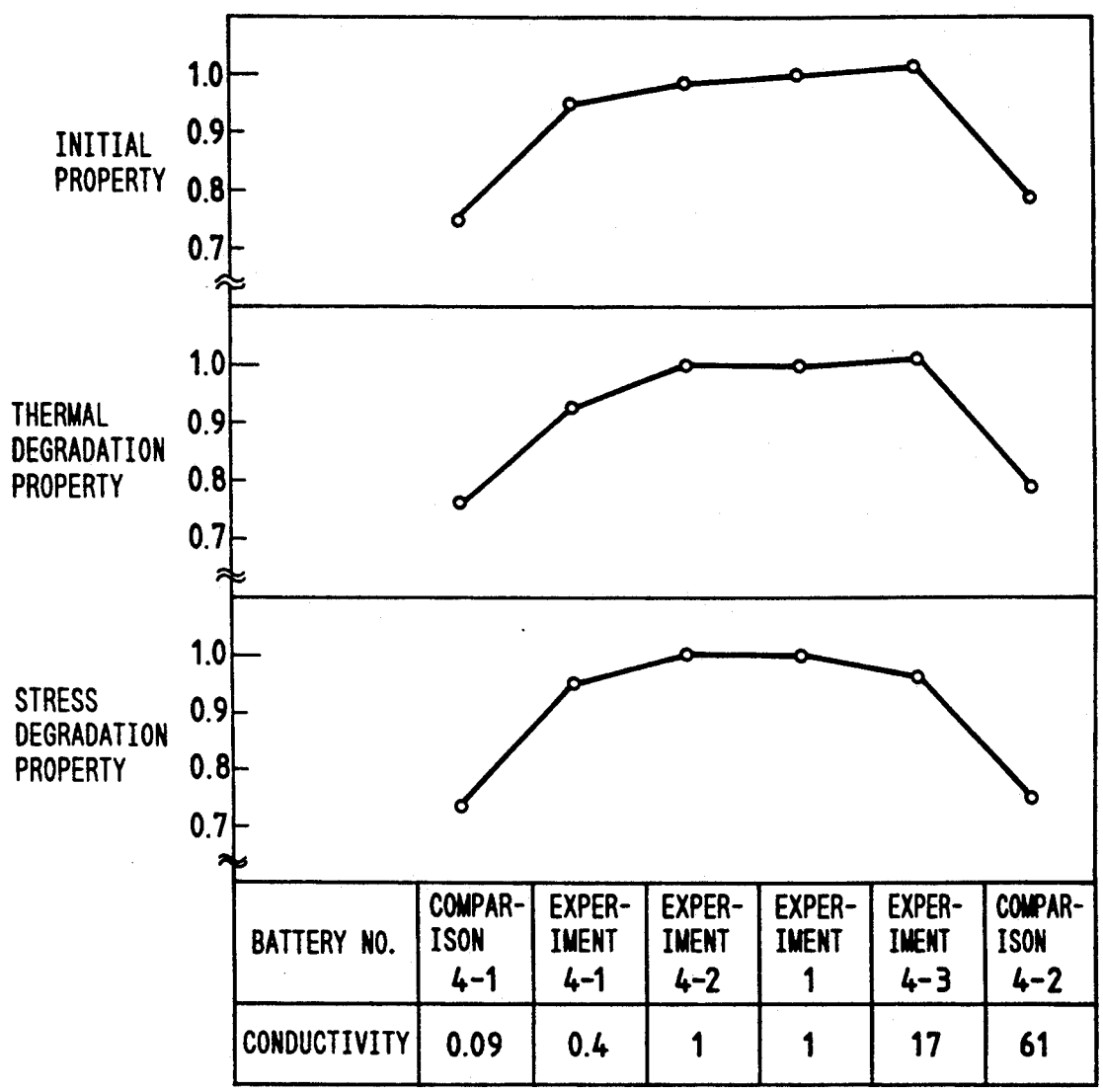
FIG. 23 shows the relation between dark conductivity, and the initial property, and the thermal and stress degenerations of the diamond layer of the present invention.

The initial characteristics, the thermal deterioration characteristics, the stress deterioration characteristics of the solar cells, and the dark conductance of the diamond layer are shown in FIG. 23. As can be understood from FIG. 23, the solar cells according to the present invention (solar cell Examples 4-1 to 3) displayed characteristics superior to those of the solar cells according to comparison examples (solar cell Comparison Examples 4-1 to 2). As a result, a beneficial effect of the present invention was confirmed.

EXAMPLE 5 AND COMPARISON EXAMPLE 5

Two solar cells (solar cell Examples 5-1 to 3 and solar cell Comparison Examples 5-1 to 2) were manufactured for each of Examples 5 and Comparison Example 5 under the same forming conditions as those for Example 1 except for the thickness of the diamond layer at the time of forming the diamond layer as shown in Table 5. Furthermore, similarly to Example 1, the solar cells were subjected to evaluation of the characteristics by the same method as that of Example 1.

Figure 24:
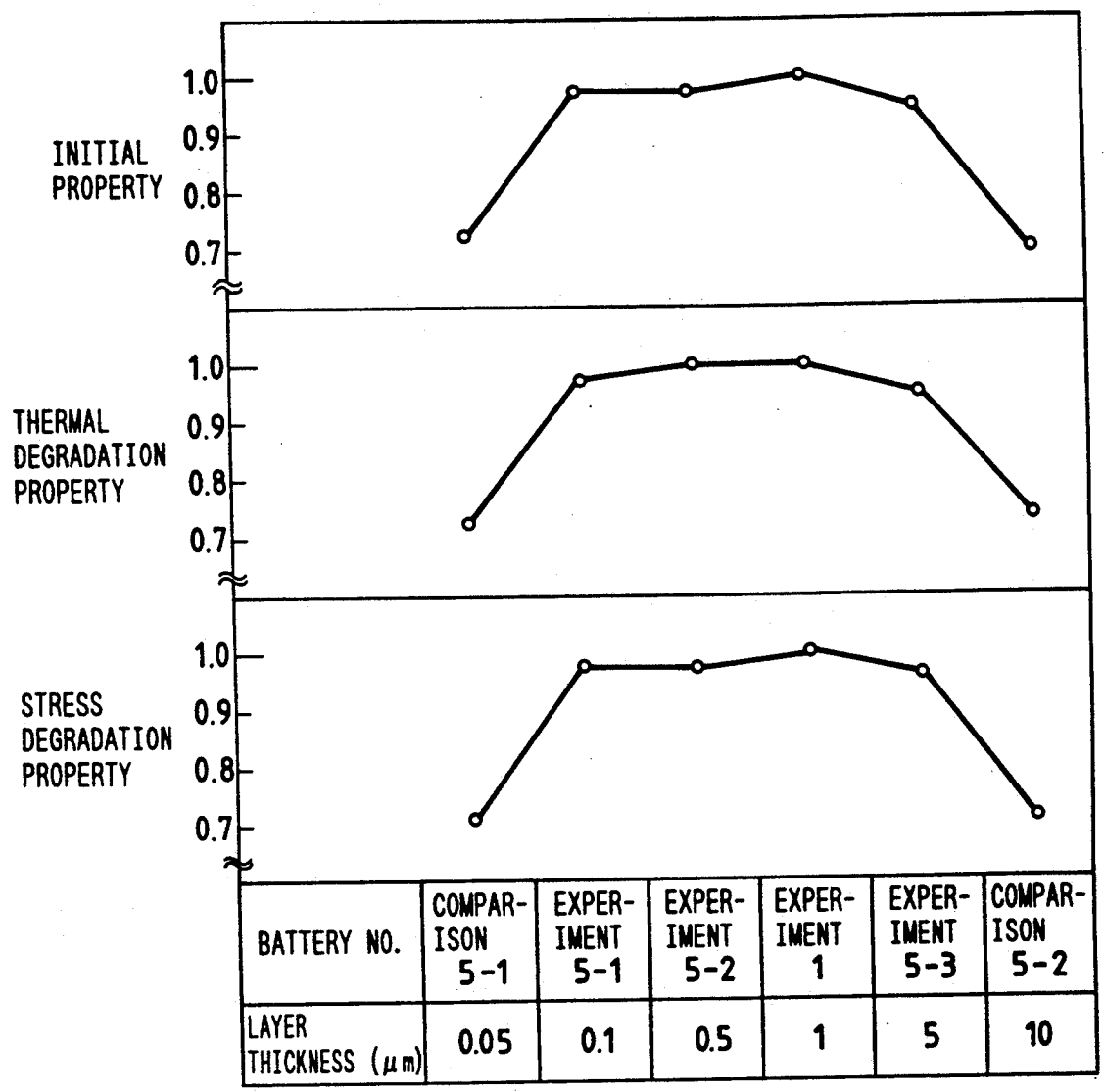
FIG. 24 shows the relation between thickness of the diamond layer, and the initial property, and the thermal and stress degenerations of the diamond layer of the present invention.

The initial characteristics, the thermal deterioration characteristics, the stress deterioration characteristics of the solar cells and the dark conductance of the diamond layer are shown in FIG. 24. As can be understood from FIG. 24, the solar cells according to the present invention (solar cell Example 1 and Examples 5-1 to 3) displayed characteristics superior to those of the solar cells according to the comparison examples (solar cell Comparison Examples 5-1 to 2). As a result, a beneficial effect of the present invention was confirmed.

EXAMPLE 5-1

A pair of solar cell panels were produced under the same conditions as Example 1, and a solar battery module was fabricating using these solar cell panels. A charging device having a circuit arrangement as shown in the FIG. 19 was produced by using this solar cell module.

COMPARISON EXAMPLE 5-1

A pair of solar cell panels were produced under the same conditions as Comparison Example 1 and a changing device similar to that of Example 1 was fabricated by using these solar cell panels.

The charging devices of Example 5-1 and Comparison Example 5-1 were placed outdoors in mid-day sunshine. A secondary batter 804 was charged with electric power generated by each solar cell module. Each of the secondary batteries charged by the charging devices of Example 5-1 and Comparison Example 5-1 were mounted in a flash lamp (K-67, produced by Toshiba) to power the lamp until the secondary battery was exhausted. The secondary batteries 804 were then charged up by the charging devices of Example 5-1 and Comparison Example 5-1, respectively. This operation was repeated to examine the performance of these charging devices. It was confirmed that the secondary batter, when charged by the charging device of Example 1, can serve about 1.3 times longer than when charged by the charging device of Comparison Example 1. The superiority of the solar cell of the present invention was thus demonstrated.

EXAMPLE 5-2

A pair of solar cell panels were fabricated under the same conditions as Example 1 except that the diamond layer, n-type layer, i-type layer, and the p-type layer were formed under conditions specified in Tables 28 and 15. A charging device was fabricated by using these solar cell panels under the same conditions as Example 1 was tested in the same way as Example 1. The secondary battery charged by this charging device could operate the flash lamp for almost the same length of time as that in Example 1, thus proving the superiority of the solar cell of the present invention.

At the same time, a diamond layer of 1 $\mu$m thickness and an n-type layer of 0.01 $\mu$m thickness on the diamond layer were successively formed on a stainless steel substrate under the conditions shown in Tables 28 and 15, thus preparing a crystallinity analysis sample. The crystallinity of the n-type layer was evaluated by the same method as Test Example 1. As a result, it was confirmed that the n-type layer had a ring-like amorphous structure including micro-crystals.

An i-type layer of 0.1 $\mu$m thickness and a p-type layer of 0.005 $\mu$m thickness were successively formed on a stainless steel substrate under the conditions shown in FIGS. 29 and 23, thus preparing a crystallinity analysis sample. The crystallinity of the p-type layer was evaluated by the same method as Example 1. As a result, it was confirmed that the p-type layer had a ring-like amorphous structure including micro-crystals.

EXAMPLE 5-3

A pair of solar cell panels were fabricated under the same conditions as Example 1 except that the diamond layer, n-type layer, i-type layer, and the p-type layer were formed under the conditions specified in Tables 29 and 23. A charging device was fabricated by using these solar cell panels under the same conditions as Example 1 and was tested in the same way as Example 1. The secondary battery charged by this charging device could operate the flash lamp for almost the same length of time as that in Example 1, thus proving the superiority of the solar cell of the present invention.

At the same time, an i-type layer of 0.1 $\mu$m thickness and an n-type layer of 0.005 $\mu$m thickness were successively formed on a stainless steel substrate under the conditions shown in Table 6, thus preparing crystallinity analysis sample. The crystallinity of the n-type layer was evaluated by the same method as Example 1. As a result, it was confirmed that the n-type layer had a ring-like amorphous structure including microcrystals.

EXAMPLE 6-1

FIG. 3 shows an embodiment of a solar cell production apparatus which relies upon the $\mu$W glow discharge method employing a material gas supplying device 1020 and a deposition device 1000.

Referring to this figure, cylinders 1071 to 1076 are charged with material gases for forming respective layers of the solar cell of the invention. More specifically, these cylinders are: cylinder 1071 containing SiH$_4$ gas (purity: 99.99%), cylinder 1072 containing H$_2$ gas (purity: 99.9999%), cylinder 1073 containing CH$_4$ gas (purity: 99.999%), cylinder 1074 containing B$_2$H$_6$/H$_2$ gas diluted to 10% concentration by H$_2$ gas (referred to as B$_2$H$_6$/H$_2$, hereinafter), cylinder 1075 containing PH$_3$ gas diluted to 10% concentration by H$_2$ gas (referred to as PH$_3$H$_2$ hereinafter), and cylinder 1076 containing Ge$_4$ gas (purity: 99.999%). Gas pipes of inlet valves 1031 to 1036 are filled with the respective gases through valves 1051 to 1056 when the gas cylinders 1071 to 1076 are connected.

Numeral 1004 denotes a substrate made of stainless steel (SUS430B) and 100 mm in length, 100 mm in width (square), and 0.25 mm in thickness. The substrate is mirror-finished.

Valves 1051 to 1056 were opened so that SiH$_4$ gas, H$_2$ gas, CH$_4$ gas, B$_2$H$_6$/H$_2$ gas, and GeH$_4$ gas were introduced simultaneously from the gas cylinders 1071, 1072, 1073, 1074, 1075, and 1076, respectively. The pressures of the respective gases were regulated to 2 kg/cm$^2$ by means of pressure regulators 1061 to 1066.

Subsequently, after confirming that the inlet valves 1031 to 1036 and the leak valve 1009 of the deposition chamber 1001 were in closed positions and that outlet valves 1041 to 1046 and the auxiliary valve 1008 were in the open position, a conductance valve (butterfly type valve) was fully opened and the deposition chamber 1001 and the gas pipes were evacuated by means of a vacuum pump (not shown). The auxiliary valve 1008 and the outlet valves 1041 to 1046 were closed when the pressure, as read on a vacuum gauge, was reduced to $1 \times 10^{-4}$ Torr.

Subsequently the inlet valves 1031 to 1036 were progressively opened to introduce the respective gases into the mass flow controllers 1021 to 1026.

The system thus were prepared for forming layers. A diamond layer, n-type layer, i-type layer, and a p-type layer were formed on the substrate 1004 by this system.

For the purpose of forming the diamond layer, the substrate 1004 was heated up to 400° C. by means of the heater 1005. Then, the outlet valves 1042, 1043, and 1045, as well as the auxiliary valve 1008, were progressively opened to allow H$_2$ gas, CH$_4$ gas, and PH$_3$/H$_2$ gas to be introduced into the deposition chamber 1001 through the gas introduction pipe 1003. The mass flow controllers 1022, 1023, and 1025 were adjusted to maintain gas flow rates of 500 sccm, 5 sccm, and 2.5 sccm for the H$_2$ gas, CH$_4$ gas and the PH$_3$/H$_2$ gas, respectively. Meanwhile, the opening of the conductance valve 1007 was adjusted in response to a change in the indication of the vacuum gauge 1006 so as to maintain a pressure of 20 mTorr in the deposition chamber 1001. Subsequently, DC power was supplied from a DC power supply 1011 to the substrate 1004 to maintain the latter at a potential of $-100$ V relative to the deposition chamber 1001. Then, the output power of the $\mu$W power supply (not shown) was set to 0.5 W/cm$^2$ so as to introduce microwaves into the deposition chamber 1001 through a waveguide tube (not shown), a waveguide portion 1010, and a dielectric window 1002, thereby triggering a $\mu$W glow discharge in the deposition chamber 1010, whereby the diamond layer started to grow on the substrate 1004. The $\mu$W glow discharge was ceased and the DC power supply 1011 was stopped when the diamond layer grew to 1 $\mu$m thickness. At the same time, the outlet valves 1042, 1043, and 1045, as well as the auxiliary valve 1008, were closed to stop the supply of the gases into the deposition chamber 1001, thus ceasing the formation of the diamond layer.

Subsequently, in order to form an n-type layer, the substrate 1004 was heated to 280° C. by means of the heater 1005, and the outlet valves 1041, 1042, 1043, and 1045, as well as the auxiliary valve 1008, were progressively opened to allow SiH$_4$ gas, H$_2$ gas, CH$_4$ gas, and PH$_3$/H$_2$ gas to be introduced into the deposition chamber 1001 through the gas introduction pipe 1003. The mass flow controllers 1021, 1022, 1023, and 1025 were respectively adjusted to provide flow rates of 5 sccm, 5 sccm, 0.5 sccm, and 5 sccm for the SiH$_4$ gas, H$_2$ gas, CH$_4$ gas, and PH$_3$/H$_2$ gas, respectively. The opening of the conductance valve 1007 was adjusted in accordance with the indication of the vacuum gauge 1006 so as to maintain an internal pressure of 10 mTorr in the deposition chamber 1001. Subsequently, a DC bias was applied by a DC power supply 1011 to the substrate 1004 so as to set the substrate 1004 to a potential of $-60$ V relative to the deposition chamber 1001. Then, the output power of the $\mu$W power supply (not shown) was set to 0.05 W/cm$^3$ so as to introduce microwaves into the deposition chamber 1001 through a waveguide tube (not shown), a waveguide portion 1010, and the dielectric window 1002, thereby triggering a $\mu$W glow discharge in the deposition chamber 1010, whereby the n-type layer started to grow on the diamond layer. The $\mu$W glow discharge was ceased and the DC power supply 1011 was stopped when the n-type layer grew to 0.01 $\mu$m thickness. At the same time, the outlet valves 1041, 1042, 1043, 1045, as well as the auxiliary valve 1008, were closed to stop the supply of the gases into the deposition chamber 1001, thus ceasing the formation of the n-type layer.

Subsequently, for the purpose of forming an i-type layer, the substrate 1004 was heated to 280° C. by means of the heater 1005, and the outlet valves 1041, 1042, 1046, as well as the auxiliary valve 1008, were progressively opened to allow SiH$_4$ gas, H$_2$ gas, and GeH$_4$ gas to be introduced into the deposition chamber 1001 through the gas introduction pipe 1003. The mass flow controllers 1021, 1022, and 1026 were respectively adjusted to provide flow rates of 40 sccm, 100 sccm, and 1 sccm for the SiH$_4$ gas, H$_2$ gas, and GeH$_4$ gas, respectively. The opening of the conductance valve 1007 was adjusted in accordance with the indication of the vacuum gauge 1006 so as to maintain an internal pressure of 10 mTorr in the deposition chamber 1001. Subsequently, DC bias was applied by a DC power supply 1011 to the substrate 1004 so as to set the substrate 1004 to a potential of $-40$V relative to the deposition chamber 1001. Then, the output power of the $\mu$W power supply (not shown) was set to 0.15 W/cm$^3$ so as to introduce microwaves into the deposition chamber 1001 through a waveguide tube (not shown), a waveguide portion 1010, and a dielectric window 1002, thereby triggering a $\mu$W glow discharge in the deposition chamber 1010, whereby the i-type layer started to grow on the n-type layer. During the formation of the i-type layer, the mass flow controllers 1021, 1022, and 1026 were adjusted such that the flow rates of SiH$_4$ gas and H$_2$ gas are maintained constant at 40 sccm and 100 sccm, respectively, and such that the flow rate of GeH$_4$ gas increases at a constant rate from 1 sccm to 20 sccm during formation of the i-type layer up to 0.03 $\mu$m on the n-type layer and then to decrease at a constant rate from 20 sccm down to 0 sccm during subsequent 0.27 $\mu$m growth of the i-type layer. The $\mu$W glow discharge was ceased and the DC power supply 1011 was stopped when the i-type layer grew to total thickness of 0.3 $\mu$m. At the same time, the outlet valves 1041, 1042, 1046, as well as the auxiliary valve 1008, were closed to stop the supply of the gases into the deposition chamber 1001, thus ceasing the formation of the i-type layer.

Subsequently, in order to form a p-type layer, the substrate 1004 and heated to 280° C. by means of the heater 1005, and the outlet valves 1041, 1042, 1043, 1044, as well as the auxiliary valve 1008, were progressively opened to allow SiH$_4$ gas, H$_2$ gas, CH$_4$ gas, and B$_2$H$_6$/H$_2$ gas to be introduced into the deposition chamber 1001 through the gas introduction pipe 1003. The mass flow controllers 1021, 1022, 1023, and 1024 were respectively adjusted to provide flow rates of 3 sccm, 500 sccm, 0.5 sccm, and 5 sccm for the SiH$_4$ gas, H$_2$ gas, CH$_4$ gas and the B$_2$H$_6$/H$_2$ gas, respectively. The opening of the conductance valve 1007 was adjusted in accordance with the indication of the vacuum gauge 1006 so as to maintain an internal pressure of 20 mTorr in the deposition chamber 1001. Subsequently, DC bias was applied by a DC power supply 1011 to the substrate 1004 so as to set the substrate 1004 to a potential of $-100$V relative to the deposition chamber 1001. Then, the output power of the $\mu$W power supply (not shown) was set to 0.5 W/cm$^3$ so as to introduce microwaves into the deposition chamber 1001 through a waveguide tube (not shown), a waveguide portion 1010, and the dielectric window 1002, thereby triggering a $\mu$W glow discharge in the deposition chamber 1010, whereby the p-type layer started to grow on the i-type layer. The $\mu$W glow discharge was ceased and the DC power supply 1011 was stopped when the p-type layer grew to 0.005 $\mu$m thickness. At the same time, the outlet valves 1041, 1042, 1043, 1044, as well as the auxiliary valve 1008, were closed to stop the supply of gases into the deposition chamber 1001, thus ceasing the formation of the p-type layer.

The described conditions for producing the solar cell are shown in Tables 3, 13 and 30.

Needless to say, during formation of each layer, outlet valves 1041 to 1046 for the gas or gases which are not necessary for forming the layer were completely closed.

Furthermore, in order to prevent gases from remaining in the deposition chamber 1001 and in the pipes leading from the outlet valves 1041 to 1046 to the deposition chamber 1001, an operation is conducted as required in which the system is temporarily evacuated to a high degree of vacuum while closing the outlet valves 1041 to 1046 and opening the auxiliary valve 1008 and fully opening the conductance valve 1007.

An ITO (In$_2$O$_{30}$+SnO$_2$) film as a transparent electrode was vacuum deposited by a known evaporation method on the p-type layer of the thus far produced solar cell to a thickness of 0.85 $\mu$m. Then, a film of Al serving as a collector electrode was formed to a thickness of 2 $\mu$m by vacuum evaporation, whereby a finished solar cell was obtained. The same process was conducted again, whereby a pair of solar cell panels as in solar cell Example 1 were obtained.

COMPARISON EXAMPLE 1

A thin film of 0.45 m was formed by sputtering on the surface of a substrate 1004 heated to 350° C. Then, a thin film of ZnO was formed thereon by evaporation to a thickness of 2 $\mu$m, whereby a lower electrode was formed. Then, an n-type layer, i-type layer, p-type layer, transparent electrode, and collector electrode successively formed over the lower electrode under the same conditions as Example 1, except that the diamond layer was not formed. A pair of solar cell panels as Comparison Example 1 were thus formed.

A test was then conducted to evaluate the initial characteristics, thermal degradation characteristics, and stress degradation characteristics of the solar cells of Example 1 and Comparison Example 1.

The initial characteristics were evaluated by placing the pair of solar cell panels of Example 1 and the pair of solar cell panels of Comparison Example 1 under illuminating light of AM-1.5 (100 mW/cm$^2$) and measuring the levels of photoelectric conversion efficiency. It was confirmed that the solar cell of Example 1 exhibits, as an average, photoelectric conversion efficiency which is about 1.3 times as high as that of the solar cell of Comparison Example 1.

The thermal degradation characteristic was evaluated by subjecting a single solar cell panel of Example 1 and a single solar cell panel of Comparison Example 1 to 10 heating/cooling cycles each consisting in placing the solar cell panel for 1 hour in the thermostated drier (Yamato Kagaku Kabushiki Kaisha DV-41) set at 100° C. and subsequently placing the panel for 1 hour in a refrigerator (Hitachi Seisakusho Kabushiki Kaisha R-107W) set at 5° C. Then, the panels were placed under illuminating light from AM-1.5 (100 mW/cm$^2$) and the levels of the photoelectric conversion efficiency were measured. It was confirmed that the solar cell of Example 1 exhibits, as an average, photoelectric conversion efficiency which is about 1.4 times as high as that of the solar cell of Comparison Example 1.

In order to evaluate the stress degradation characteristics, the other single solar cell panel of Example 1, i.e., the panel which was not subjected to the thermal degradation test, as well as the other single cell panel of Comparison Example 1, was bent at a curvature radius of 54 mm such that the stainless steel layer is positioned on the radially inner side, followed by straightening to the original flat state. After 50 bending/straightening cycles, the solar cell panel was placed, as in the case of measurement of the initial characteristic, under illuminating light from AM-1.5 (100 mW/cm$^2$) and the levels of the photoelectric conversion efficiency were measured. It was confirmed that the solar cell of Example 1 exhibits, as an average, photoelectric conversion efficiency which is about 1.35 times as high as that of the solar cell of Comparison Example 1.

A diamond layer of 1 $\mu$m thick was formed on a stainless steel substrate under the same conditions as Example 1, thus obtaining a sample for crystalline analysis, and crystallinity of the thus obtained diamond layer was measured and evaluated by means of an X-ray diffraction device (Rigaku Denki Kabushiki Kaisha RAD-3b). Sharp diffraction lines were observed at 43.9° and 75.4°, which correspond to the diffraction lines of the (111), (220) planes of cubic diamond, thus proving formation of diamond crystals. The state of the surface of the crystalline analysis sample was measured by means of a surface roughness meter (Kosaka Kenkyusho Kabushiki Kaisha SE-30D). The surface showed a roughness Rz of 0.2 $\mu$m as the mean of measurements over 10 points.

A crystalline analysis sample also was prepared by successively forming, on a stainless steel substrate, an i-type layer of 0.1 $\mu$m thickness and a p-type layer of 0.005 $\mu$m thickness under the same conditions as Example 1. The crystallinity of the p-type layer was evaluated by means of a RHEED device (Nippon Denshi Kabushiki Kaisha JEM-100SX). It was confirmed that the p-type layer has a ring-like amorphous structure including micro-crystals.

EXAMPLE 2 AND COMPARISON EXAMPLE 2

A pair of solar cell panels as Example 2 (Cell Examples Nos. 2-1 to 2-3) and a pair of solar cell panels as Comparison Example 2 (Cell Comparison Example Nos. 2-1 and 2-2) were prepared under the same conditions as Example 1 except that the flow rates of the CH$_4$ gas were varied as shown in Table 4. Then, as in the case of Example 1, a diamond layer of 1 $\mu$m thickness was formed on the stainless steel substrate under the conditions shown in Table 7, thus obtaining a crystalline analysis sample.

The solar cells of Example 2 (Cell Example Nos. 2-1 to 2-3) and the solar cells of Comparison Example 2 (Cell Comparison Example Nos. 2-1 and 2-2), as well as the crystallinity analysis samples, were subjected to a test for evaluation of characteristics conducted in the same manner as Example 1.

Figure 25:
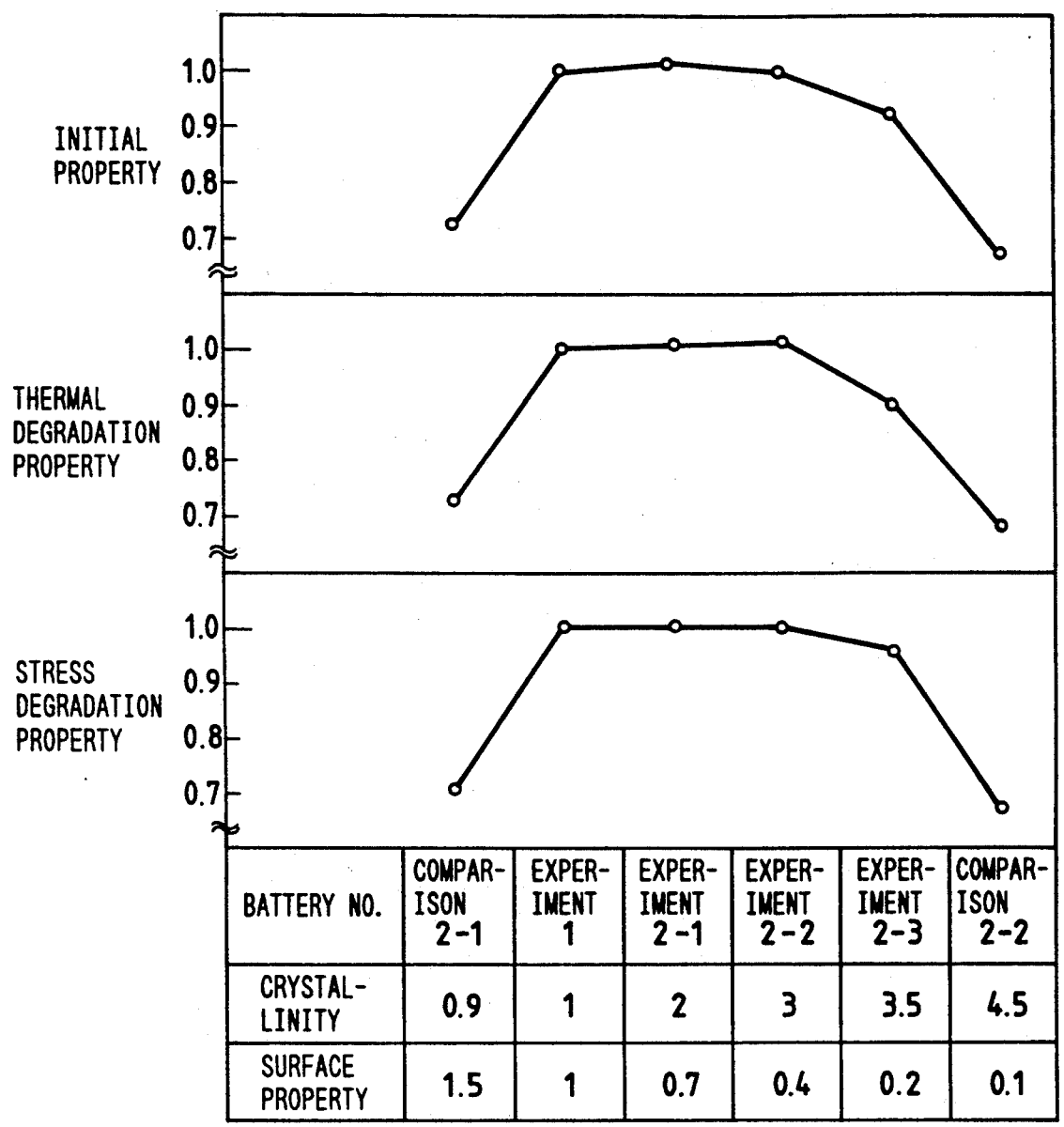
FIG. 25 shows the relation between crystallinity and surface property, and an initial property, thermal, and stress degenerations of a diamond layer according to embodiment VI of the present invention.

FIG. 25 shows the initial characteristics, thermal degradation characteristics, and stress degradation characteristics of the solar cells. The crystallinity was determined from the half value width of the diffraction line at 43.9° corresponding to the (111) plane of cubic diamond. As will be seen from FIG. 25, the solar cells of the invention, i.e., Cell Example Nos. 2-1 to 2-3, exhibit excellent characteristics as compared with solar cells of Comparison Examples, i.e., Cell Comparison Example Nos. 2-1 and 2-2, thus demonstrating superiority of the present invention.

EXAMPLE 3 AND COMPARISON EXAMPLE 3

A pair of solar cell panels as Example 3 (Cell Example Nos. 3-1 to 3-3) and a pair of solar cell panels as Comparison Example 3 (Cell Comparison Example Nos. 3-1 and 3-2) were prepared under the same conditions as Example 1 except that the flow rate of the PH$_3$/H$_2$ gas were varied as shown in Table 5. Then, as in the case of Example 1, a diamond layer of 1 $\mu$m thickness was formed on the stainless steel substrate under the conditions shown in Table 7, thus obtaining samples of measurement of conductivity.

The solar cells of Example 3 (Cell Example Nos. 3-1 to 3-3) and the solar cells of Comparison Example 3 (Cell Comparison Example Nos. 3-1 and 3-2), as well as the conductivity measurement samples, were subjected to a test for evaluation of characteristics conducted in the same manner as Example 1.

The samples for measurement of conductivity, obtained with Example 3 (Cell Example Nos. 3-1 to 3-3) and those with Comparison Example 3 (Cell Comparison Example Nos. 3-1 and 3-2) were subjected to the following treatment. A chromium electrode of 2 mm diameter and 0.1 $\mu$m thickness was formed by evaporation on the surface of the diamond layer of each sample. Then, a voltage V was applied between the chromium electrode and the stainless steel substrate by means of a pA meter (Yokokawa Hewlett Packard Kabushiki Kaisha 4140B), while the sample was placed in darkness, and the current I flowing between these electrodes was measured. Then, the dark conductivity $\delta d$ was determined in accordance with the following formula, using the thickness of the diamond layer.

$$\delta d(S/cm) = \{I(A) \times D(cm)\} / \{0.0314 \times V(V)\}$$

Dark conductivity $\delta d$ was determined by the same method also for the crystalline analysis samples obtained in Example 1 (Cell Example No. 1).

Figure 26:
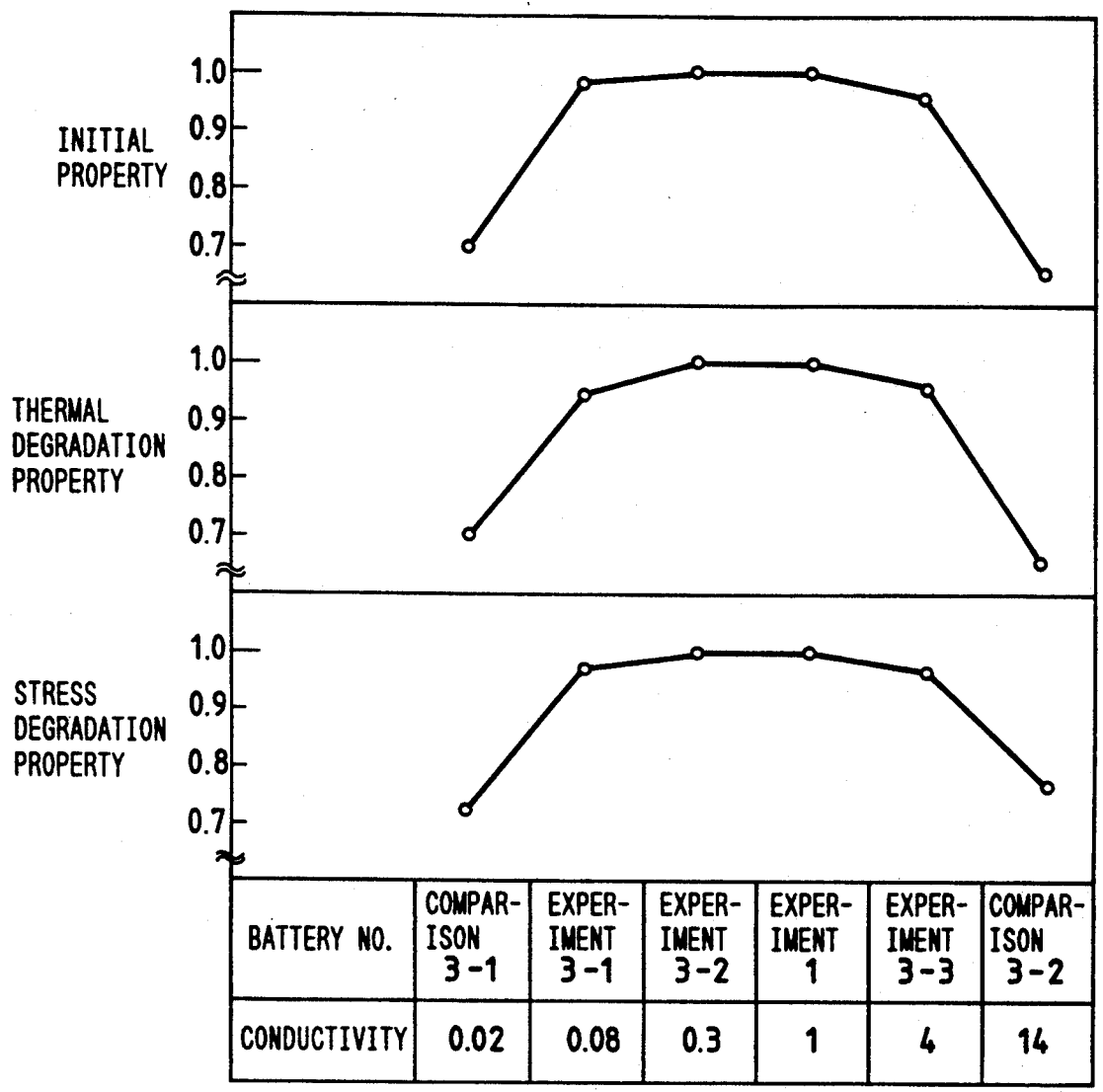
FIG. 26 shows the relation between dark conductivity, and the initial property, and the thermal and stress degenerations of the diamond layer of the present invention.

FIG. 26 shows the initial characteristics, thermal degradation characteristics, and stress degradation characteristics of the solar cells. As will be seen from FIG. 26, the solar cells of the invention i.e., Cell Example Nos. 3-1 to 3-3, exhibit excellent characteristics as compared with solar cells of the Comparison Examples i.e., Cell Comparison Example Nos. 3-1 and 3-2, thus demonstrating superiority of the present invention.

EXAMPLE 4 AND COMPARISON EXAMPLE 4

A pair of solar cell panels as Example 4 (Cell Example Nos. 4-1 to 4-3) and a pair of solar cell panels as Comparison Example 4 (Cell Comparison Example Nos. 4-1 and 4-2) were prepared under the same conditions as Example 1 except that $B_2H_6/H_2$ gas was used in place of $PH_3/H_2$ gas and that the flow rates of the $B_2H_6/H_2$ gas were varied as shown in Table 6. Then, as in the case of Example 3, a diamond layer of 1 $\mu m$ thickness was formed on the stainless steel substrate under the conditions shown in Table 6, thus obtaining samples for measurement of conductivity.

The solar cells of Example 3 (Cell Example Nos. 3-1 to 3-3) and the solar cells of Comparison Example 3 (Cell Comparison Example Nos. 3-1 and 3-2), as well as the conductivity measurement samples, were subjected to a test for evaluation of characteristics conducted in the same manner as Example 1.

The samples for measurement of conductivity, obtained with Example 3 (Cell Example Nos. 3-1 to 3-3) and those with Comparison Example 3 (Cell Comparison Example Nos. 3-1 and 3-2) were subjected to evaluation of characteristics conducted under the same conditions as Example 1. At the same time, the conductivity measurement samples obtained with Example 4 (Cell Example Nos. 4-1 to 4-3) and Comparison Example 4 (Cell Comparison Example Nos. 4-1 and 4-2) were subjected to measurement of dark conductivity $\delta d$ carries out in the same manner as Example 1.

Figure 27:
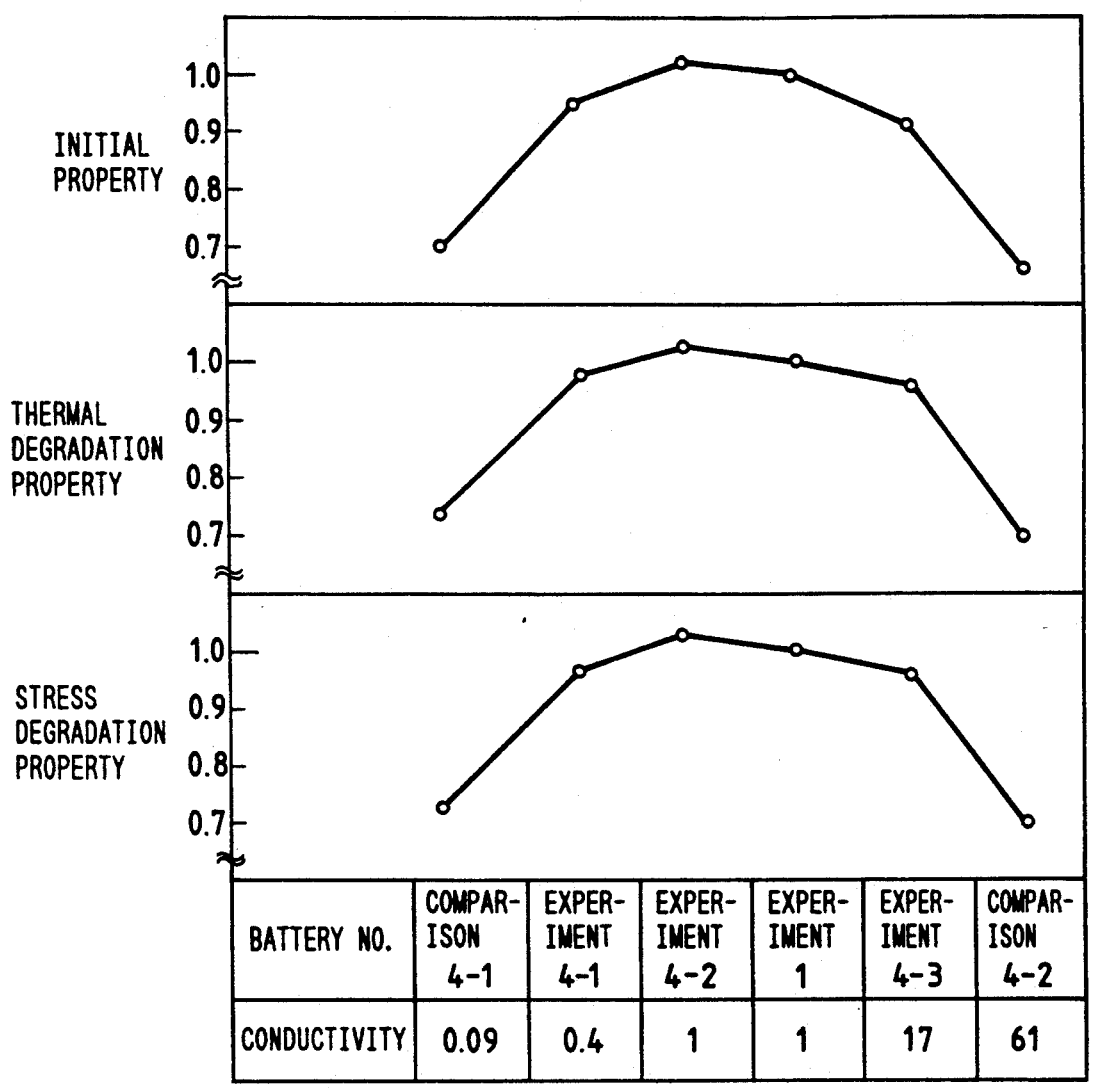
FIG. 27 shows the relation between dark conductivity, and the initial property, and the thermal and stress degenerations of the diamond layer of the present invention.

FIG. 27 shows the initial characteristics, thermal degradation characteristics, stress degradation characteristics of the solar cells, as well as the dark conductivity levels $\delta d$ of the diamond layers. As will be seen from FIG. 27, the solar cells of the invention i.e., Cell Example Nos. 4-1 to 4-3, exhibit excellent characteristics as compared with solar cells of the Comparison Examples, i.e., Cell Comparison Example Nos. 4-1 and 4-2, thus demonstrating superiority of the present invention.

EXAMPLE 5 AND COMPARISON EXAMPLE 5

A pair of solar cell panels as Example 5 (Cell Example Nos. 5-1 to 5-3) and a pair of solar cell panels as Comparison Example 5 (Cell Comparison Example Nos. 5-1 and 5-2) were prepared under the same conditions as Example 1, except that the thickness of the diamond layer was varied as shown in Table 7, and characteristics of these solar cell panels which evaluated by the same method of Example 1.

Figure 28:
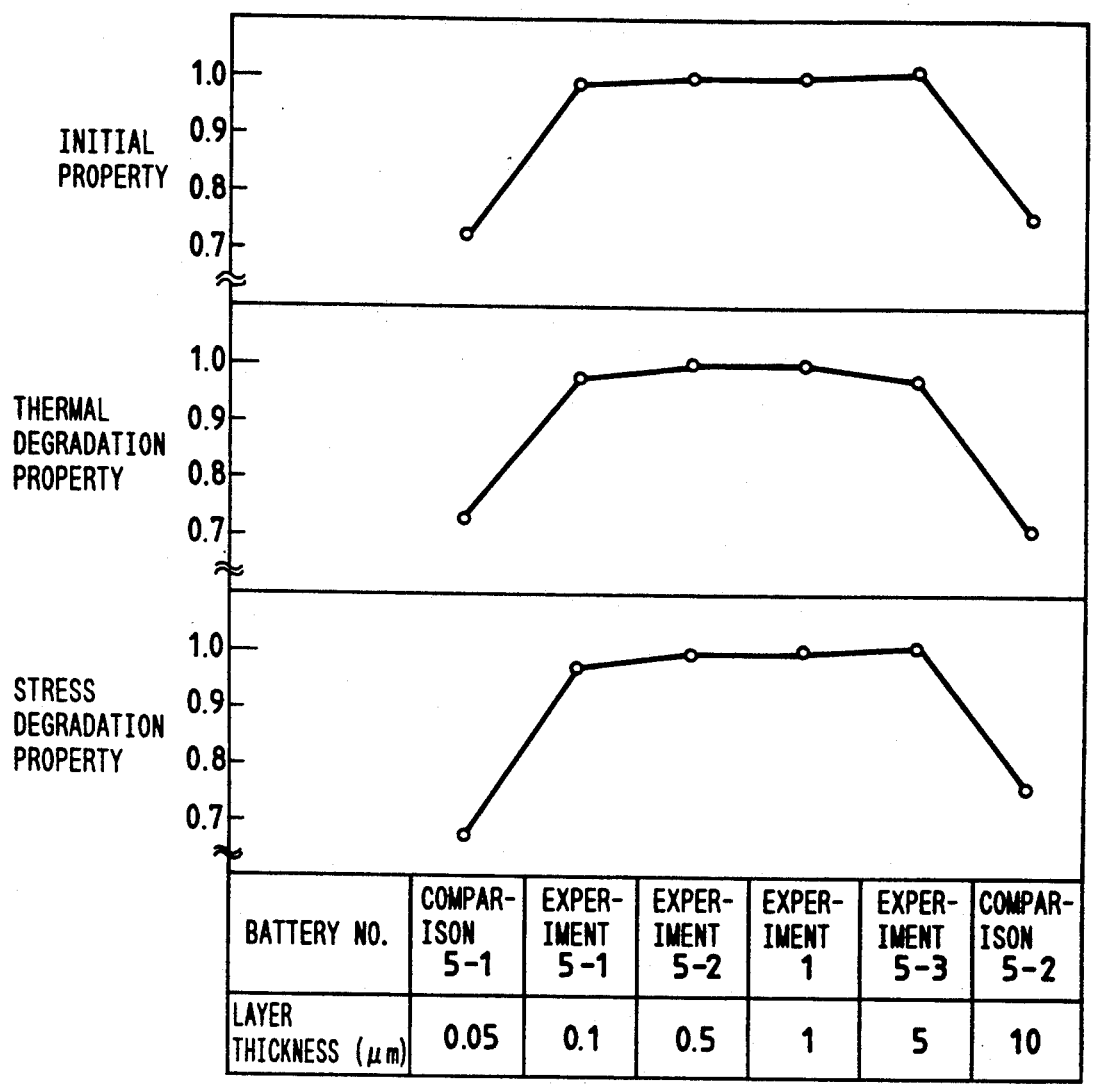
FIG. 28 shows the relation between thickness of the diamond layer, and the initial property, and the thermal and stress degenerations of the diamond layer of the present invention.

FIG. 28 shows the initial characteristics, thermal degradation characteristics, stress degradation characteristics of the solar cells, as well as the dark conductivity levels $\delta d$ of the diamond layers. As will be seen from FIG. 28, the solar cells of the invention, i.e., Cell Example Nos. 5-1 to 5-3, exhibit excellent characteristics as compared with solar cells of the Comparison Examples, i.e., Cell Comparison Example Nos. 5-1 and 5-2, thus demonstrating superiority of the present invention.

EXAMPLE 6-1

A pair of solar cell panels were produced under the same conditions as Example 1, and a solar battery module was fabricated using these solar cell panels. A charging device having a circuit arrangement as shown in FIG. 8 was produced by using this solar cell module.

COMPARISON EXAMPLE 6-1

A pair of solar cell panels were produced under the same conditions as Comparison Example 1 and a charging device similar to that of Example 1 was fabricated by using these solar cell panels.

The charging devices of Example 6-1 and Comparison Example 6-1 were placed outdoors in mid-day sunshine. A secondary battery 804 was charged with electric power generated by each solar cell module 801. Each of the secondary batteries 804 charged by the charging devices of Example 6-1 and Comparison Example 5-1 were mounted in a flash lamp (K-67, produced by Toshiba) to power the lamp on until the secondary battery was exhausted. The secondary batteries 804 were then charged up by the charging devices of Example 6-1 and Comparison Example 6-1, respectively. This operation was repeated to examine the performance of these charging devices. It was confirmed that the secondary battery, when charged by the charging device of Example 6-1, can serve about 1.35 times longer than when charged by the charging device of Comparison Example 6-1. The superiority of the solar cell of the present invention was thus demonstrated.

EXAMPLE 6-2

A pair of solar cell panels were fabricated under the same conditions as Example 1 except that the diamond layer, n-type layer, i-type layer, and the p-type layer were formed under conditions specified in Tables 31 and 15. A charging device was fabricated by using these solar cell panels under the same conditions as in Example 1 and was tested in the same way as in Example 1. The secondary battery charged by this charging device could operate the torch lamp for almost the same length of time as that in Example 1, thus proving the superiority of the solar cell of the present invention.

At the same time, a diamond layer of 1 $\mu m$ thickness and an n-type layer of 0.001 $\mu m$ thickness were successively formed on a stainless steel substrate under the conditions shown in Tables 31 and 15, thus preparing a crystallinity analysis sample. The crystallinity of the n-type layer was evaluated by the same method as Test Example 1. As a result, it was confirmed that the n-type layer had a ring-like amorphous structure including micro-crystals.

An i-type layer of 0.1 $\mu m$ thickness and a p-type layer of 0.005 $\mu m$ thickness were successively formed on a stainless steel substrate under the conditions shown in Tables 8 and 9, thus preparing a crystallinity analysis sample. The crystallinity of the p-type layer was evaluated by the same method as in Example 1. As a result, it was confirmed that the p-type layer had a ring-like amorphous structure including micro-crystals.

EXAMPLE 6-3

A pair of solar cell panels were fabricated under the same conditions as Example 1 except that the diamond layer, n-type layer, i-type layer, and the p-type layer were formed under the conditions specified in Tables 32 and 17. A charging device was fabricated by using these solar cell panels under the same conditions as Example 1 and was tested in the same way as in Example 1. The secondary battery charged by this charging device could operate the flash lamp for almost the same length of time as that in Example 1, thus proving the superiority of the solar cell of the present invention.

At the same time, an i-type layer of 0.1 μ thickness and an n-type layer of 0.005 μm thickness were successively formed on a stainless steel substrate under the conditions shown in Tables 32 and 17, thus preparing a crystallinity analysis sample. The crystallinity of the n-type layer was evaluated by the same method as in Example 1. As a result, it was confirmed that the n-type layer had a ring-like amorphous structure including micro-crystals.

TABLE 1

| LAYER | LAYER PRODUCING CONDITION | | |
|---|---|---|---|
| | GAS USED AND FLOWING QUANTITY (sccm) | μW POWER (W/cm³) | INNER PRESSURE (mTorr) |
| DIAMOND LAYER | $H_2$ 500<br>$CH_4$ 5<br>$PH_3$ 2.5<br>(10% DILUTION) | 0.5 | 20 |
| n-TYPE LAYER | $SiH_4$ 5<br>$H_2$ 5<br>$PH_3/H_2$ 5<br>(10% DILUTION) | 0.02 | 10 |
| i-TYPE LAYER | $SiH_4$ 50<br>$H_2$ 100 | 0.15 | 10 |
| p-TYPE LAYER | $SiH_4$ 5<br>$H_2$ 500<br>$B_2H_6/H_2$ 5<br>(10% DILUTION) | 0.5 | 20 |

TABLE 2

| LAYER | LAYER PRODUCING CONDITION | | |
|---|---|---|---|
| | SUBSTRATE TEMPERATURE (°C.) | D.C. BIAS (V) | LAYER THICKNESS (μm) |
| DIAMOND LAYER | 400 | −100 | 1 |
| n-TYPE LAYER | 280 | −50 | 0.01 |
| i-TYPE LAYER | 280 | −50 | 0.4 |
| p-TYPE LAYER | 280 | −70 | 0.005 |

TABLE 3

| SUBSTRATE | SUS430BA 100 mm SQUARE SURFACE MIRROR FINISHED | THICKNESS 0.25 mm |
|---|---|---|
| TRANSPARENT ELECTRODE | ITO ($In_2O_3$ + $SnO_2$) 0.085 μm | |
| COLLECTOR ELECTRODE | Al 2 μm | |

TABLE 4

| | SOLAR CELL NO. | | | | |
|---|---|---|---|---|---|
| | COMPARISON 2-1 | EXPERIMENT 2-1 | EXPERIMENT 2-2 | EXPERIMENT 2-3 | COMPARISON 2-2 |
| $CH_4$ GAS FLOWING QUANTITY (sccm) | 2 | 15 | 25 | 50 | 75 |

TABLE 5

| | SOLAR CELL NO. | | | | |
|---|---|---|---|---|---|
| | EXPERIMENT 3-1 | EXPERIMENT 3-2 | EXPERIMENT 3-3 | COMPARISON 3-1 | COMPARISON 3-2 |
| $PH_3/H_2$ GAS FLOWING QUANTITY (sccm) | 0.5 | 1 | 5 | 0.25 | 10 |

TABLE 6

| | SOLAR CELL NO. | | | | |
|---|---|---|---|---|---|
| | EXPERIMENT 4-1 | EXPERIMENT 4-2 | EXPERIMENT 4-3 | COMPARISON 4-1 | COMPARISON 4-2 |
| $B_2H_6/H_2$ GAS FLOWING QUANTITY (sccm) | 0.5 | 1 | 5 | 0.25 | 10 |

TABLE 7

| | SOLAR CELL NO. | | | | |
|---|---|---|---|---|---|
| | COMPARISON 5-1 | EXPERIMENT 5-1 | EXPERIMENT 5-2 | EXPERIMENT 5-3 | COMPARISON 5-2 |
| DIAMOND LAYER THICKNESS (μm) | 0.05 | 0.1 | 0.5 | 5 | 10 |

TABLE 8

| LAYER | LAYER PRODUCING CONDITION | | |
|---|---|---|---|
| | GAS USED AND FLOWING QUANTITY (sccm) | μW POWER (W/cm³) | INNER PRESSURE (mTorr) |
| DIAMOND LAYER | $H_2$ 500<br>$CH_4$ 5<br>$PH_3/H_2$ 2.5<br>(10% DILUTION) | 0.5 | 20 |
| n-TYPE LAYER | $SiH_4$ 5<br>$H_2$ 500<br>$PH_3/H_2$ 5<br>(10% DILUTION) | 0.5 | 20 |
| i-TYPE LAYER | $SiH_4$ 50<br>$H_2$ 100 | 0.15 | 10 |
| p-TYPE LAYER | $SiH_4$ 5<br>$H_2$ 500<br>$BF_3H_2$ 7<br>(10% DILUTION) | 0.5 | 20 |

TABLE 9

| LAYER | LAYER PRODUCING CONDITION | | |
|---|---|---|---|
| | SUBSTRATE TEMPERATURE (°C.) | D.C. BIAS (V) | LAYER THICKNESS ($\mu$m) |
| DIAMOND LAYER | 400 | −100 | 1 |
| n-TYPE LAYER | 300 | −70 | 0.01 |
| i-TYPE LAYER | 280 | −50 | 0.4 |
| p-TYPE LAYER | 250 | −50 | 0.005 |

TABLE 10

| LAYER | LAYER PRODUCING CONDITION | | | |
|---|---|---|---|---|
| | GAS USED AND FLOWING QUANTITY (sccm) | | $\mu$W POWER (W/cm$^3$) | INNER PRESSURE (mTorr) |
| DIAMOND LAYER | H$_2$<br>CH$_4$<br>BF$_3$/H$_2$<br>(10% DILUTION) | 500<br>5<br>4 | 0.5 | 20 |
| p-TYPE LAYER | SiH$_4$<br>H$_2$<br>B$_2$H$_6$/H$_2$<br>(10% DILUTION) | 5<br>5<br>5 | 0.02 | 10 |
| i-TYPE LAYER | SiH$_4$<br>H$_2$ | 50<br>100 | 0.15 | 10 |
| n-TYPE LAYER | SiH$_4$<br>H$_2$<br>PH$_3$/H$_2$<br>(10% DILUTION) | 5<br>500<br>8 | 0.5 | 20 |

TABLE 11

| LAYER | LAYER PRODUCING CONDITION | | |
|---|---|---|---|
| | SUBSTRATE TEMPERATURE (°C.) | D.C. BIAS (V) | LAYER THICKNESS ($\mu$m) |
| DIAMOND LAYER | 400 | −100 | 1 |
| p-TYPE LAYER | 250 | −50 | 0.01 |
| i-TYPE LAYER | 250 | −50 | 0.4 |
| n-TYPE LAYER | 250 | −50 | 0.005 |

TABLE 12

| LAYER | LAYER PRODUCING CONDITION | | | |
|---|---|---|---|---|
| | GAS USED AND FLOWING QUANTITY (sccm) | | $\mu$W POWER (W/cm$^3$) | INNER PRESSURE (mTorr) |
| DIAMOND LAYER | H$_2$<br>CH$_4$<br>PH$_3$/H$_2$<br>(10% DILUTION) | 500<br>5<br>2.5 | 0.5 | 20 |
| n-TYPE LAYER | SiH$_4$<br>H$_2$<br>CH$_4$<br>PH$_3$/H$_2$<br>(10% DILUTION) | 5<br>5<br>0.5<br>5 | 0.05 | 10 |
| i-TYPE LAYER | SiH$_4$<br>H$_2$ | 50<br>100 | 0.15 | 10 |
| p-TYPE LAYER | SiH$_4$<br>H$_2$<br>CH$_4$<br>B$_2$H$_6$/H$_2$<br>(10% DILUTION) | 3<br>500<br>0.5<br>5 | 0.5 | 20 |

TABLE 13

| LAYER | LAYER PRODUCING CONDITION | | |
|---|---|---|---|
| | SUBSTRATE TEMPERATURE (°C.) | D.C. BIAS (V) | LAYER THICKNESS ($\mu$m) |
| DIAMOND LAYER | 400 | −100 | 1 |
| n-TYPE LAYER | 280 | −60 | 0.01 |
| i-TYPE LAYER | 280 | −50 | 0.4 |
| p-TYPE LAYER | 280 | −100 | 0.005 |

TABLE 14

| LAYER | LAYER PRODUCING CONDITION | | | |
|---|---|---|---|---|
| | GAS USED AND FLOWING QUANTITY (sccm) | | $\mu$W POWER (W/cm$^3$) | INNER PRESSURE (mTorr) |
| DIAMOND LAYER | H$_2$<br>CH$_4$<br>BF$_3$/H$_2$<br>(10% DILUTION) | 500<br>5<br>2.5 | 0.5 | 20 |
| n-TYPE LAYER | SiH$_4$<br>H$_2$<br>CH$_4$<br>PH$_3$/H$_2$<br>(10% DILUTION) | 5<br>500<br>0.5<br>5 | 0.5 | 20 |
| i-TYPE LAYER | SiH$_4$<br>H$_2$ | 50<br>100 | 0.15 | 10 |
| p-TYPE LAYER | SiH$_4$<br>H$_2$<br>CH$_4$<br>BF$_3$/H$_2$<br>(10% DILUTION) | 5<br>500<br>0.5<br>7 | 0.5 | 20 |

TABLE 15

| LAYER | LAYER PRODUCING CONDITION | | |
|---|---|---|---|
| | SUBSTRATE TEMPERATURE (°C.) | D.C. BIAS (V) | LAYER THICKNESS ($\mu$m) |
| DIAMOND LAYER | 400 | −100 | 1 |
| n-TYPE LAYER | 280 | −100 | 0.01 |
| i-TYPE LAYER | 280 | −50 | 0.4 |
| p-TYPE LAYER | 280 | −100 | 0.005 |

TABLE 16

| LAYER | LAYER PRODUCING CONDITION | | | |
|---|---|---|---|---|
| | GAS USED AND FLOWING QUANTITY (sccm) | | $\mu$W POWER (W/cm$^3$) | INNER PRESSURE (mTorr) |
| DIAMOND LAYER | H$_2$<br>CH$_4$<br>PH$_3$/H$_2$<br>(10% DILUTION) | 500<br>5<br>2.5 | 0.5 | 20 |
| p-TYPE LAYER | SiH$_4$<br>H$_2$<br>CH$_4$<br>B$_2$H$_6$/H$_2$<br>(10% DILUTION) | 5<br>50<br>0.5<br>5 | 0.05 | 10 |
| i-TYPE LAYER | SiH$_4$<br>H$_2$ | 50<br>100 | 0.15 | 10 |
| n-TYPE LAYER | SiH$_4$<br>H$_2$<br>CH$_4$<br>PH$_3$/H$_2$<br>(10% DILUTION) | 5<br>500<br>0.5<br>8 | 0.5 | 20 |

TABLE 17

| LAYER | LAYER PRODUCING CONDITION | | |
|---|---|---|---|
| | SUBSTRATE TEMPERATURE (°C.) | D.C. BIAS (V) | LAYER THICKNESS (μm) |
| DIAMOND LAYER | 400 | −100 | 1 |
| n-TYPE LAYER | 300 | −60 | 0.01 |
| i-TYPE LAYER | 280 | −50 | 0.4 |
| p-TYPE LAYER | 250 | −100 | 0.005 |

TABLE 18

| LAYER | GAS USED AND FLOWING QUANTITY (sccm) | | μW POWER (W/cm³) | INNER PRESSURE (mTorr) |
|---|---|---|---|---|
| DIAMOND LAYER | H₂ | 500 | 0.5 | 20 |
| | CH₄ | 5 | | |
| | PH₃/H₂ (10% DILUTION) | 2.5 | | |
| n-TYPE LAYER | SiH₄ | 5 | 0.02 | 10 |
| | H₂ | 5 | | |
| | PH₃/H₂ (10% DILUTION) | 5 | | |
| i-TYPE LAYER | SiH₄ | 35 | 0.15 | 10 |
| | H₂ | 100 | | |
| | GeH₄ | 15 | | |
| p-TYPE LAYER | SiH₄ | 5 | 0.5 | 20 |
| | H₂ | 500 | | |
| | B₂H₅/H₂ (10% DILUTION) | 5 | | |

TABLE 19

| LAYER | LAYER PRODUCING CONDITION | | |
|---|---|---|---|
| | SUBSTRATE TEMPERATURE (°C.) | D.C. BIAS (V) | LAYER THICKNESS (μm) |
| DIAMOND LAYER | 400 | −100 | 1 |
| n-TYPE LAYER | 280 | −50 | 0.01 |
| i-TYPE LAYER | 280 | −40 | 0.4 |
| p-TYPE LAYER | 280 | −70 | 0.005 |

TABLE 20

| LAYER | GAS USED AND FLOWING QUANTITY (sccm) | | μW POWER (W/cm³) | INNER PRESSURE (mTorr) |
|---|---|---|---|---|
| DIAMOND LAYER | H₂ | 500 | 0.5 | 20 |
| | CH₄ | 5 | | |
| | BF₃/H₂ (10% DILUTION) | 4 | | |
| n-TYPE LAYER | SiH₄ | 5 | 0.5 | 20 |
| | H₂ | 500 | | |
| | PH₃/H₂ (10% DILUTION) | 5 | | |
| i-TYPE LAYER | SiH₄ | 50 | 0.15 | 10 |
| | H₂ | 100 | | |
| | GeH₄ | 15 | | |
| p-TYPE LAYER | SiH₄ | 5 | 0.5 | 20 |
| | H₂ | 500 | | |
| | BF₃/H₂ (10% DILUTION) | 7 | | |

TABLE 17

| LAYER | LAYER PRODUCING CONDITION | | |
|---|---|---|---|
| | SUBSTRATE TEMPERATURE (°C.) | D.C. BIAS (V) | LAYER THICKNESS (μm) |
| DIAMOND LAYER | 400 | −100 | 1 |
| n-TYPE LAYER | 300 | −70 | 0.01 |
| i-TYPE LAYER | 280 | −40 | 0.3 |
| p-TYPE LAYER | 250 | −50 | 0.005 |

TABLE 22

| LAYER | GAS USED AND FLOWING QUANTITY (sccm) | | μW POWER (W/cm³) | INNER PRESSURE (mTorr) |
|---|---|---|---|---|
| DIAMOND LAYER | H₂ | 500 | 0.5 | 20 |
| | CH₄ | 5 | | |
| | PH₃/H₂ (10% DILUTION) | 2.5 | | |
| p-TYPE LAYER | SiH₄ | 5 | 0.02 | 10 |
| | H₂ | 5 | | |
| | B₂H₆/H₂ (10% DILUTION) | 5 | | |
| i-TYPE LAYER | SiH₄ | 50 | 0.15 | 10 |
| | H₂ | 100 | | |
| | GeH₄ | 15 | | |
| n-TYPE LAYER | SiH₄ | 5 | 2 | 20 |
| | H₂ | 500 | 0.5 | |
| | PH₃/H₂ (10% DILUTION) | 8 | | |

TABLE 23

| LAYER | LAYER PRODUCING CONDITION | | |
|---|---|---|---|
| | SUBSTRATE TEMPERATURE (°C.) | D.C. BIAS (V) | LAYER THICKNESS (μm) |
| DIAMOND LAYER | 400 | −100 | 1 |
| n-TYPE LAYER | 250 | −50 | 0.01 |
| i-TYPE LAYER | 280 | −40 | 0.3 |
| p-TYPE LAYER | 250 | −50 | 0.005 |

TABLE 24

| LAYER | GAS USED AND FLOWING QUANTITY (sccm) | | μW POWER (W/cm³) | INNER PRESSURE (mTorr) |
|---|---|---|---|---|
| DIAMOND LAYER | H₂ | 500 | 0.5 | 20 |
| | CH₄ | 5 | | |
| | PH₃/H₂ (10% DILUTION) | 2.5 | | |
| p-TYPE LAYER | SiH₄ | 5 | 0.02 | 10 |
| | H₂ | 5 | | |
| | PH₃/H₂ (10% DILUTION) | 5 | | |
| i-TYPE LAYER | SiH₄ | 35 | 0.15 | 10 |
| | H₂ | 100 | | |
| | GeH₄ 0.03 μm AT n-TYPE LAYER SIDE 1→20 0.27 μm AT p-TYPE LAYER SIDE 20→0 (CHANGING AT A CONSTANT RATIO) | | | |

TABLE 24-continued

| LAYER | GAS USED AND FLOWING QUANTITY (sccm) | μW POWER (W/cm³) | INNER PRESSURE (mTorr) |
|---|---|---|---|
| p-TYPE LAYER | SiH₄ 5<br>H₂ 500<br>B₂H₆/H₂ 5<br>(10% DILUTION) | 0.5 | 20 |

TABLE 25

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>BF₃/H₂ 4<br>(10% DILUTION) | 0.5 | 20 |
| n-TYPE LAYER | SiH₄ 5<br>H₂ 500<br>PH₃/H₂ 5<br>(10% DILUTION) | 0.5 | 20 |
| i-TYPE LAYER | SiH₄ 35<br>H₂ 100<br>GeH₄<br>0.03 μm AT n-TYPE LAYER SIDE 1→20<br>0.27 μm AT p-TYPE LAYER SIDE 20→0<br>(CHANGING AT A CONSTANT RATIO) | 0.15 | 10 |
| p-TYPE LAYER | SiH₄ 5<br>H₂ 500<br>BF₃/H₂ 7<br>(10% DILUTION) | 0.5 | 20 |

TABLE 26

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>PH₃/H₂ 2.5<br>(10% DILUTION) | 0.5 | 20 |
| p-TYPE LAYER | SiH₄ 5<br>H₂ 5<br>B₂H₆/H₂ 5<br>(10% DILUTION) | 0.02 | 10 |
| i-TYPE LAYER | SiH₄ 35<br>H₂ 100<br>GeH₄<br>0.03 μm AT n-TYPE LAYER SIDE 1→20<br>0.27 μm AT p-TYPE LAYER SIDE 20→0<br>(CHANGING AT A CONSTANT RATIO) | 0.15 | 10 |
| n-TYPE LAYER | SiH₄ 5<br>H₂ 500<br>PH₃/H₂ 5<br>(10% DILUTION) | 0.5 | 20 |

TABLE 27

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>PH₃/H₂ 2.5<br>(10% DILUTION) | 0.5 | 20 |
| n-TYPE LAYER | SiH₄ 5<br>H₂ 5<br>CH₄ 0.5<br>PH₃/H₂ 10<br>(10% DILUTION) | 0.05 | 10 |
| i-TYPE LAYER | SiH₄ 35<br>H₂ 100<br>GeH₄ 15 | 0.15 | 10 |
| p-TYPE LAYER | SiH₄ 5<br>H₂ 500<br>CH₄ 0.5<br>B₂H₆/H₂ 5<br>(10% DILUTION) | 0.5 | 20 |

TABLE 28

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>PH₃/H₂ 2.5<br>(10% DILUTION) | 0.5 | 20 |
| n-TYPE LAYER | SiH₄ 5<br>H₂ 500<br>CH₄ 0.5<br>PH₃/H₂ 10<br>(10% DILUTION) | 0.5 | 20 |
| i-TYPE LAYER | SiH₄ 35<br>H₂ 100<br>GeH₄ 15 | 0.15 | 10 |
| p-TYPE LAYER | SiH₄ 3<br>H₂ 500<br>CH₄ 0.5<br>BF₃/H₂ 7<br>(10% DILUTION) | 0.5 | 20 |

TABLE 29

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>BF₃/H₂ 4<br>(10% DILUTION) | 0.5 | 20 |
| p-TYPE LAYER | SiH₄ 5<br>H₂ 50<br>CH₄ 0.5<br>PH₃/H₂ 5<br>(10% DILUTION) | 0.05 | 10 |
| i-TYPE LAYER | SiH₄ 35<br>H₂ 100<br>GeH₄ 15 | 0.15 | 10 |
| n-TYPE LAYER | SiH₄ 3<br>H₂ 500<br>CH₄ 0.5<br>B₂H₆/H₂ 8<br>(10% DILUTION) | 0.5 | 20 |

TABLE 30

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>PH₃/H₂ 2.5<br>(10% DILUTION) | 0.5 | 20 |
| n-TYPE LAYER | SiH₄ 5<br>H₂ 500<br>CH₄ 0.5<br>PH₃/H₂ 10<br>(10% DILUTION) | 0.05 | 10 |
| i-TYPE LAYER | SiH₄ 35<br>H₂ 100<br>GeH₄<br>0.03 μm AT n-TYPE LAYER SIDE 1→20<br>0.27 μm AT p-TYPE LAYER SIDE 20→0<br>(CHANGING AT A CONSTANT RATIO) | 0.15 | 10 |
| p-TYPE LAYER | SiH₄ 3<br>H₂ 500<br>CH₄ 0.5<br>B₂H₆/H₂ 5<br>(10% DILUTION) | 0.5 | 20 |

TABLE 31

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>BF₃/H₂ 4<br>(10% DILUTION) | 0.5 | 20 |
| n-TYPE LAYER | SiH₄ 5<br>H₂ 500<br>CH₄ 0.5<br>PH₃/H₂ 10<br>(10% DILUTION) | 0.05 | 10 |
| i-TYPE LAYER | SiH₄ 35<br>H₂ 100<br>GeH₄<br>0.03 μm AT n-TYPE LAYER SIDE 1→20<br>0.27 μm AT p-TYPE LAYER SIDE 20→0<br>(CHANGING AT A CONSTANT RATIO) | 0.15 | 10 |
| p-TYPE LAYER | SiH₄ 3<br>H₂ 500<br>CH₄ 0.5<br>BF₃/H₂ 7<br>(10% DILUTION) | 0.5 | 20 |

TABLE 32

| LAYER | GAS USED AND FLOWING QUANTITY (sccm) | μW POWER (W/cm³) | INNER PRESSURE (mTorr) |
|---|---|---|---|
| DIAMOND LAYER | H₂ 500<br>CH₄ 5<br>PH₃/H₂ 2.5<br>(10% DILUTION) | 0.5 | 20 |
| n-TYPE LAYER | SiH₄ 5<br>H₂ 50<br>CH₄ 0.5<br>B₂H₆/H₂ 5<br>(10% DILUTION) | | |
| i-TYPE LAYER | SiH₄ 35<br>H₂ 100<br>GeH₄<br>0.03 μm AT n-TYPE LAYER SIDE 1→20<br>0.27 μm AT p-TYPE LAYER SIDE 20→0<br>(CHANGING AT A CONSTANT RATIO) | 0.15 | 10 |
| p-TYPE LAYER | SiH₄ 3<br>H₂ 500<br>CH₄ 0.5<br>PH₃/H₂ 8<br>(10% DILUTION) | 0.5 | 20 |

What is claimed is:

1. A solar cell comprising a conductive substrate and a semiconductor laminate on said conductive substrate, said semiconductor laminate comprising a p-type layer composed of a non-single crystal Si material, an wherein a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 μm, a thickness in the range of 0.1 to 5 μm, surface unevenness of 0.05 to 1S, 1-5 atomic % hydrogen content and a dark conductivity of 0.15/cm or more.

2. A solar cell comprising a conductive substrate and a semiconductor laminate on said conductive substrate, said semiconductor laminate comprising a p-type layer composed of a Si-containing non-single crystal material, an i-type layer composed of a Si, Ge-containing non-single crystal material and serving as an active layer, and an n-type layer composed of a Si-containing non-single crystal material, wherein a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 μm, a thickness in the range of 0.1 to 5 μm, surface unevenness of 0.05 to 1S, 1-5 atomic % hydrogen content and a dark conductivity of 0.15/cm or more.

3. A solar cell comprising a conductive substrate and a semiconductor laminate on said conductive substrate, said semiconductor laminate comprising a p-type layer composed of a non-single crystal Si material, an i-type layer serving as an active layer, and an n-type layer, wherein at least one of said p-type layer and said n-type layer contains carbon atoms, and a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 μm, a thickness in the range of 0.1 to 5 μm, surface unevenness of 0.05 to 1S, 1-5 atomic % hydrogen content and a dark conductivity of 0.15/cm or more.

4. A solar cell comprising a conductive substrate and a semiconductor laminate on said conductive substrate, said semiconductor laminate comprising a p-type layer composed of a non-single crystal Si material, an i-type layer serving as an active layer, and an n-type layer, wherein at least one of said p-type layer and said n-type layer contains carbon atoms, said i-type layer contains germanium atoms, and a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 $\mu$m, a thickness in the range of 0.1 to 5 $\mu$m, surface unevenness of 0.05 to 1S, 1-5 atomic % hydrogen content and a dark conductivity of 0.15/cm or more.

5. A solar cell comprising a conductive substrate and a semiconductor laminate on said conductive substrate, said semiconductor laminate comprising a p-type layer composed of a Si-containing non-single crystal material, an i-type layer composed of a Si-containing non-crystal single crystal material and serving as an active layer, and an n-type layer composed of a Si-containing non-single crystal material, wherein at least one of said p-type layer and said n-type layer contains carbon atoms, said i-type layer contains germanium atoms with a concentration variation in the direction of the thickness thereof, and a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 $\mu$m, a thickness in the range of 0.1 to 5 $\mu$m, surface unevenness of 0.05 to 1S, 1-5 atomic % hydrogen content and a dark conductivity of 0.15/cm or more.

6. A solar cell comprising a conductive substrate and a semiconductor laminate on said conductive substrate, said semiconductor laminate comprising a p-type layer composed of a Si-containing non-single crystal material, an i-type layer composed of a Si, Ge-containing non-single crystal material and serving as an active layer, and an n-type layer composed of a Si-containing non-single crystal material, wherein the Ge content in said i-type layer varies in the direction of the thickness thereof, and a diamond layer having an uneven surface and containing a valence electron controlling agent is interposed between said conductive substrate and said semiconductor laminate, said diamond layer having polycrystallinity with a smooth polyhedral surface having an average radius of 0.05 to 5 $\mu$m, a thickness in the range of 0.1 to 5 $\mu$m, surface unevenness of 0.05 to 1S, 1-5 atomic % hydrogen content and a dark conductivity of 0.15/cm or more.

* * * * *

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

Page 1 of 6

It is certified that error appears in the above-identified patent and that said Letters Patent is hereby corrected as shown below:

COLUMN 2

Line 21, "above-problems." should read --above problems.--.
Line 44, "comprises" should read --comprise--.

COLUMN 5

Line 25, "layer 013," should read --layer 103,--.

COLUMN 6

Line 42, "5 at %." should read --5 atomic %.--.
Line 49, "10 at %." should read --10 atomic %.--.
Line 50, "at %," should read --atomic %,--.

COLUMN 7

Line 52, "to" should be deleted.
Line 53, "for" should read --from--.
Line 54, "is" should read --are--.

COLUMN 8

Line 24, "10 at %," should read --10 atomic %,-- and "7 at %." should read --7 atomic %.--.
Line 27, "40 at T," should read --40 atomic %,-- and "20 at %." should read --20 atomic %.--.
Line 34, "20 at %," should read --20 atomic %,--.
Line 35, "10 at %." should read --10 atomic %.--.
Line 39, "10 Ωm" should read --10 Ω·cm--.
Line 67, "60 at %," should read --60 atomic %,--.
Line 68, "40 at %." should read --40 atomic %.--.

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

It is certified that error appears in the above-identified patent and that said Letters Patent is hereby corrected as shown below:

COLUMN 9

Line 55, "at %" should read --atomic %--.
Line 56, "50 at %" should read --50 atomic %--.
Line 57, "20 at %" should read --20 atomic %--.

COLUMN 10

Line 10, "10 at %" should read --10 atomic %--.
Line 11, "7 at %" should read --7 atomic %--.
Line 13, "40 at %" should read --40 atomic %--.
Line 14, "20 at %" should read --20 atomic %--.
Line 19, "50 at %" should read --50 atomic %-- and "30 at %" should read --30 atomic %--.
Line 25, "20 at %" should read --20 atomic %--.
Line 26, "10 at %" should read --10 atomic %--.
Line 45, "Al Cu," should read --Al, Cu,--.

COLUMN 11

Line 8, "$ClF_3$, (second occurrence) should be deleted; "$BeF_5$," should be deleted; and "$IF_3$, should read --$IF_3$, $IF_7$,--.
Line 44, "$C_6H_{10}$)," should read --$C_4H_{10}$),--.
Line 46, "butene-1 $C_4H_8$), butene-2 ($C_4H_8$)," should read --butene-1 $C_4H_6$), butene-2 ($C_4H_6$),--.

COLUMN 12

Line 48, "$B_2H_6$" should read --$B_2H_6$ gas--.

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

It is certified that error appears in the above-identified patent and that said Letters Patent is hereby corrected as shown below:

COLUMN 13

Line 46, "stope" should read --stop--.

COLUMN 15

Line 1, "045," should read --1045,--.

COLUMN 17

Line 50, "were" should read --was--.

COLUMN 20

Line 20, "trough" should read --through--.
Line 22, "represent" should read --represents--.

COLUMN 21

Line 45, "be" should read --by--.
Line 47, "were" should read --was--.

COLUMN 22

Line 27, "discharged" should read --discharge--.

COLUMN 23

Line 13, "as" should read --was--.
Line 37, "were" should read --was--.

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

It is certified that error appears in the above-identified patent and that said Letters Patent is hereby corrected as shown below:

COLUMN 26

Line 31, "daytime the" should read --daytime when the--.

COLUMN 27

Line 14, "sown" should read --shown--.

COLUMN 30

Line 47, "direr" should read --drier--.

COLUMN 48

Line 61, "batter 804" should read --battery 804--.

COLUMN 50

Line 37, "were" should read --was--.

COLUMN 52

Line 8, "and" should read --was--.

COLUMN 55

Line 41, "carries" should read --carried--.
Line 60, "which evalu-" should read --which was evalu- --.

COLUMN 56

Line 49, "0.001 µm" should read --0.01 µm--.

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

It is certified that error appears in the above-identified patent and that said Letters Patent is hereby corrected as shown below:

COLUMN 62

TABLE 24, "p-TYPE LAYER" should read --n-TYPE LAYER--.

COLUMN 64

TABLE 27, "$H_2$ 5" should read --$H_2$ 50--.

COLUMN 66

Line 27, "an" should read --an i-type layer serving as an active layer, and an n-type layer,--.
Line 34, "uneveness" should read --unevenness--.
Line 52, "uneveness" should read --unevenness--.
Line 67, "uneveness" should read --unevenness--.

COLUMN 67

Line 14, "uneveness" should read --unevenness--.
Line 22, "and" should be deleted.

UNITED STATES PATENT AND TRADEMARK OFFICE
CERTIFICATE OF CORRECTION

PATENT NO. : 5,284,525
DATED : February 8, 1994
INVENTOR(S) : KEISHI SAITO, ET AL.

It is certified that error appears in the above-identified patent and that said Letters Patent is hereby corrected as shown below:

COLUMN 68

Line 6, "uneveness" should read --unevenness--.
Line 25, "uneveness" should read --unevenness--.

Signed and Sealed this

Tenth Day of January, 1995

Attest:

Attesting Officer

BRUCE LEHMAN
Commissioner of Patents and Trademarks